(12) United States Patent
Jeng et al.

(10) Patent No.: US 12,170,274 B2
(45) Date of Patent: Dec. 17, 2024

(54) SEMICONDUCTOR PACKAGES AND METHODS OF FORMING SAME

(71) Applicant: Taiwan Semiconductor Manufacturing Co., Ltd., Hsinchu (TW)

(72) Inventors: Shin-Puu Jeng, Hsinchu (TW); Techi Wong, Zhubei (TW); Po-Yao Chuang, Hsinchu (TW); Shuo-Mao Chen, New Taipei (TW); Meng-Wei Chou, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 331 days.

(21) Appl. No.: 17/701,083

(22) Filed: Mar. 22, 2022

(65) Prior Publication Data
US 2022/0216192 A1    Jul. 7, 2022

Related U.S. Application Data

(63) Continuation of application No. 16/901,682, filed on Jun. 15, 2020, now Pat. No. 11,296,065.

(51) Int. Cl.
*H01L 25/18*      (2023.01)
*H01L 21/48*      (2006.01)
(Continued)

(52) U.S. Cl.
CPC .......... *H01L 25/18* (2013.01); *H01L 21/4853* (2013.01); *H01L 21/4857* (2013.01);
(Continued)

(58) Field of Classification Search
CPC . H01L 25/18; H01L 21/4853; H01L 21/4857; H01L 21/561; H01L 21/563;
(Continued)

(56) References Cited

U.S. PATENT DOCUMENTS 6,781,241 B2 * 8/2004 Nishimura .......... H01L 25/0657
257/723
8,148,806 B2    4/2012 Lin et al.
(Continued)

*Primary Examiner* — Jonathan Han
(74) *Attorney, Agent, or Firm* — Slater Matsil, LLP

(57) ABSTRACT

An embodiment a structure including a first semiconductor device bonded to a first side of a first redistribution structure by first conductive connectors, the first semiconductor device comprising a first plurality of passive elements formed on a first substrate, the first redistribution structure comprising a plurality of dielectric layers with metallization patterns therein, the metallization patterns of the first redistribution structure being electrically coupled to the first plurality of passive elements, a second semiconductor device bonded to a second side of the first redistribution structure by second conductive connectors, the second side of the first redistribution structure being opposite the first side of the first redistribution structure, the second semiconductor device comprising a second plurality of passive elements formed on a second substrate, the metallization patterns of the first redistribution structure being electrically coupled to the second plurality of passive elements.

20 Claims, 51 Drawing Sheets

(51) Int. Cl.
  *H01L 21/56* (2006.01)
  *H01L 21/683* (2006.01)
  *H01L 23/00* (2006.01)
  *H01L 23/31* (2006.01)
  *H01L 23/498* (2006.01)
  *H01L 23/538* (2006.01)
  *H01L 25/065* (2023.01)
  *H01L 27/01* (2006.01)
  *H01L 49/02* (2006.01)

(52) U.S. Cl.
  CPC ......... *H01L 21/561* (2013.01); *H01L 21/563* (2013.01); *H01L 21/565* (2013.01); *H01L 21/6835* (2013.01); *H01L 23/3128* (2013.01); *H01L 23/3142* (2013.01); *H01L 23/49816* (2013.01); *H01L 23/5383* (2013.01); *H01L 23/5386* (2013.01); *H01L 24/16* (2013.01); *H01L 24/32* (2013.01); *H01L 24/73* (2013.01); *H01L 24/81* (2013.01); *H01L 25/0657* (2013.01); *H01L 27/01* (2013.01); *H01L 28/90* (2013.01); *H01L 2221/68345* (2013.01); *H01L 2221/68359* (2013.01); *H01L 2224/16227* (2013.01); *H01L 2224/32225* (2013.01); *H01L 2224/73204* (2013.01); *H01L 2225/06517* (2013.01); *H01L 2225/06572* (2013.01); *H01L 2924/19011* (2013.01); *H01L 2924/19041* (2013.01)

(58) Field of Classification Search
  CPC ............. H01L 21/565; H01L 21/6835; H01L 23/3128; H01L 23/3142; H01L 23/49816; H01L 23/5383; H01L 23/5386; H01L 24/16; H01L 24/32; H01L 24/73; H01L 24/81; H01L 25/0657; H01L 27/01; H01L 28/90; H01L 2221/68345; H01L 2221/68359; H01L 2224/16227; H01L 2224/32225; H01L 2224/73204; H01L 2225/06517; H01L 2225/06572; H01L 2924/19011; H01L 2924/19041; H01L 24/19; H01L 24/20; H01L 2224/19; H01L 25/16; H01L 25/50; H01L 29/945; H01L 23/5385; H01L 25/105; H01L 2224/20; H01L 2224/2919; H01L 2224/32057; H01L 2224/32137; H01L 2224/81011; H01L 2224/81191; H01L 2224/81815; H01L 2224/83102; H01L 2224/95; H01L 2224/96; H01L 2924/15321; H01L 25/071; H01L 23/49838; H01L 2224/81; H01G 4/33
  USPC ............................... 257/668, 686; 438/109
  See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2018/0286824 A1 | 10/2018 | Jeng et al. |
| 2019/0027468 A1 | 1/2019 | Giuliano |
| 2019/0131273 A1 | 5/2019 | Chen et al. |

\* cited by examiner

SEMICONDUCTOR PACKAGES AND METHODS OF FORMING SAME

PRIORITY CLAIM AND CROSS-REFERENCE

This application is a continuation of U.S. patent application Ser. No. 16/901,682, entitled "Semiconductor Packages and Methods of Forming Same," filed on Jun. 15, 2020, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
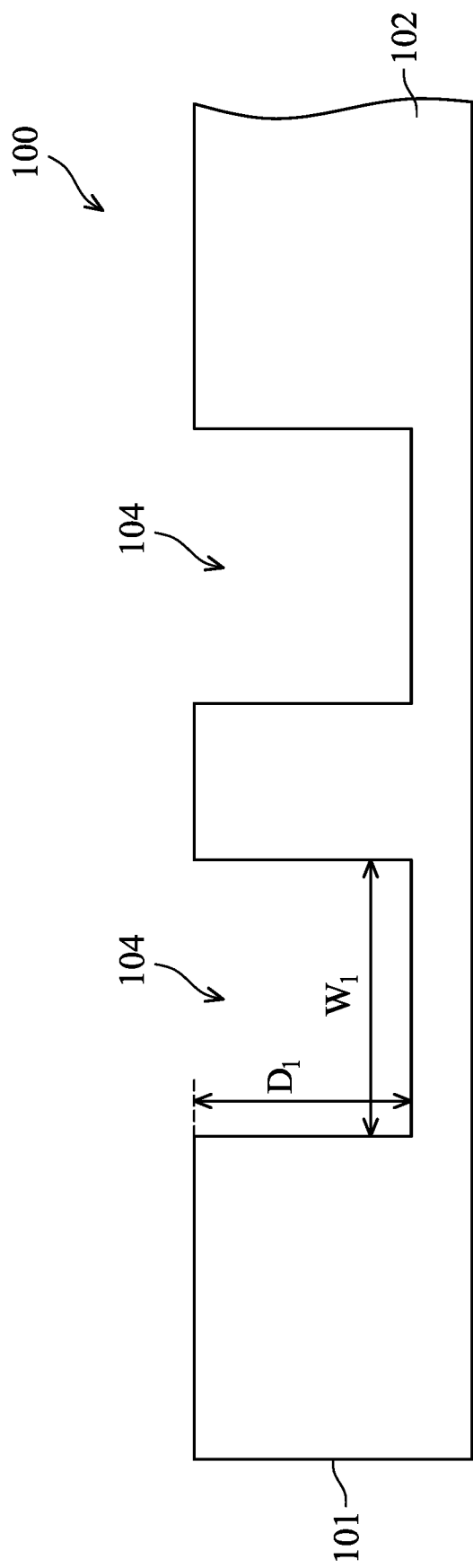
FIGS. 1-6 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., an integrated fan-out (InFO) package structure or a chip-on-wafer-on-substrate (CoWoS) package structure) having one or more semiconductor devices vertically stacked and connected to effectively form a larger semiconductor device. In some embodiments, the semiconductor device may be an integrated passive devices (IPD) comprising capacitors, such as deep trench capacitors (DTCs), metal-oxide-metal (MOM) capacitors, metal-insulator-metal (MIM) capacitors, the like, or a combination thereof. The vertically stacked semiconductor devices may be electrically coupled together by solder connections and/or through via connections. By having vertically stacked IPDs, a high-efficiency capacitor—that may be used as a decoupling capacitor—can be formed. Also, the package structure including the one or more capacitors that are vertically stacked and coupled can provide a lower equivalent series resistance (ESR) of the capacitors.

Further, the teachings of this disclosure are applicable to any IPD package structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 5 illustrate cross-sectional views of various intermediate stages of fabrication of a semiconductor device 100 in accordance with some embodiments. FIG. 1 illustrates a cross-sectional view of an edge portion of the semiconductor device 100, with a sidewall 101 being the edge of the semiconductor device 100. In some embodiments, the semiconductor device 100 comprises a substrate 102. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more recesses 104 (illustrated by two recesses 104 in FIG. 1) are formed in the substrate 102. In some embodiments, the substrate 102 may be patterned using suitable photolithography and etching methods to form the recesses 104. For example, a photoresist (not shown) may be formed and patterned over the substrate 102, and one or more etching processes (e.g., a dry etch process) may be utilized to remove those portions of the substrate 102 where the recesses 104 are desired. In some embodiments, the recesses 104 may have a width $W_1$ between about 20 nm and about 2000 nm. In some embodiments, the recesses 104 may have a depth Di between about 500 nm and about 10000 nm. In some embodiments, a ratio $W_1/D_1$ is between about 0.002 and about 4. As described below in greater detail deep trench capacitors (DTCs) are formed in the recesses 104.

Figure 2:
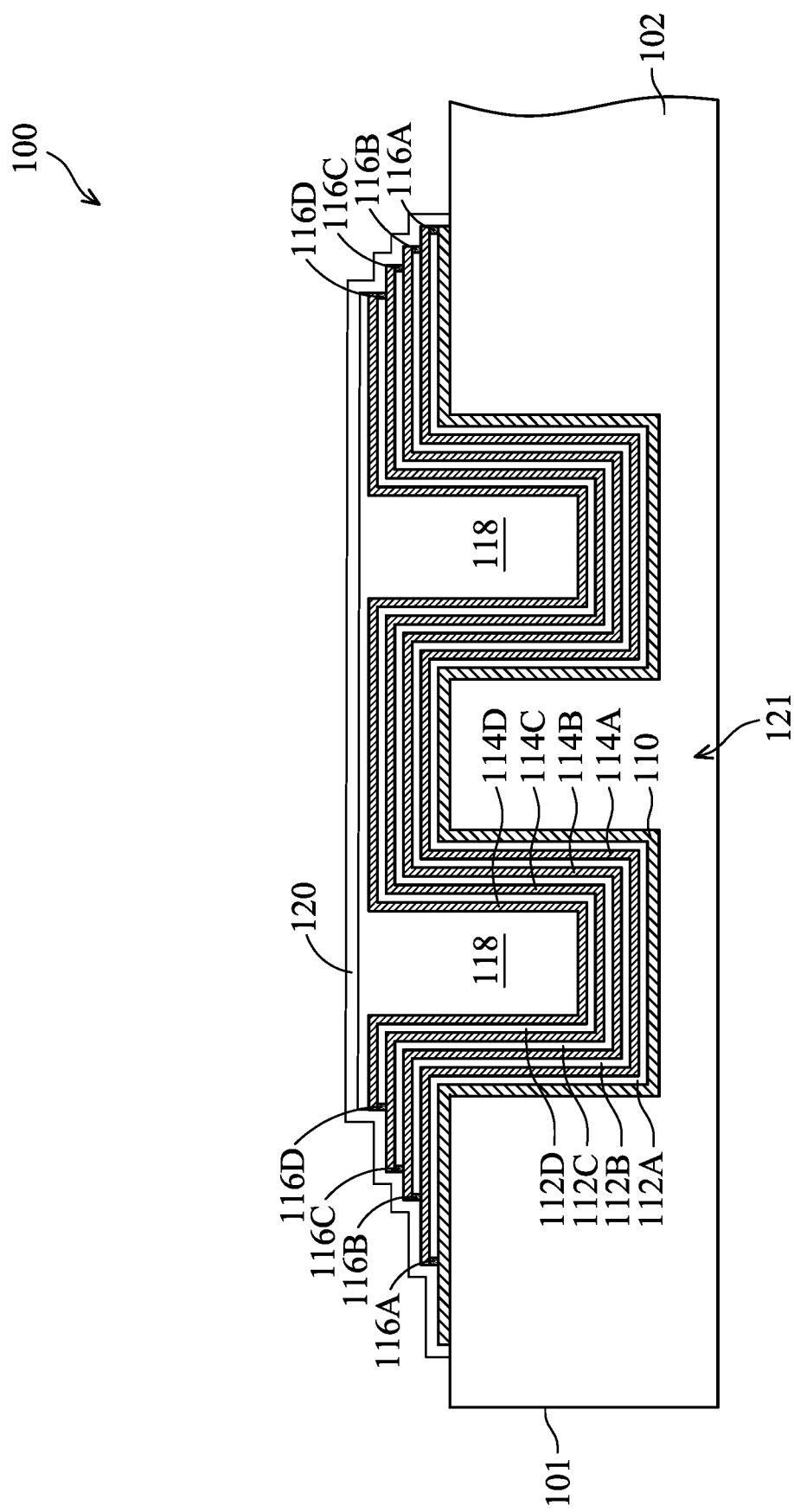

Referring to FIG. 2, deep trench capacitors (DTCs) are formed in the recesses 104 (see FIG. 1). In some embodiments, a liner layer 110 is formed over the substrate 102 and along sidewalls and bottoms of the recesses 104. In some embodiments, the liner layer 110 may comprise a dielectric material, such as silicon oxide, silicon oxynitride (SiON), silicon carboxynitride (SiCON), a combination thereof, or the like, and may be formed using atomic layer deposition (ALD), chemical vapor deposition (CVD), a combination thereof, or the like. In some embodiments, the liner layer 110 has a thickness between about 5 nm and about 100 nm. In some embodiments, the liner layer 110 is patterned to expose a top surface of the substrate 102. In some embodiments, the patterning processes may comprise suitable photolithography and etching methods.

In some embodiments, after forming the liner layer 110, conductive layers 112A-112D and dielectric layer 114A-114D are formed in the recesses 104 (see FIG. 1) in an alternating manner. The conductive layers 112A-112D may be also referred to as capacitor electrodes 112A-112D. In some embodiments, each of the conductive layers 112A through 112D may comprise a conductive material such as doped silicon, polysilicon, copper, tungsten, an aluminum or copper alloy, titanium, titanium nitride, tantalum, tantalum nitride, a combination thereof, or the like, and may be formed using plating, physical vapor deposition (PVD), ALD, CVD, a combination thereof, or the like. In some embodiments, each of the conductive layers 112A through 112D has a thickness between about 10 nm and about 100 nm. In some embodiments, each of the dielectric layer 114A through 114D may comprise a high-K dielectric material such as aluminum oxide, zirconium oxide, a combination thereof, a multilayer thereof, or the like. In an embodiment, each of the dielectric layers 114A through 114D comprises a multilayer including two layers of zirconium oxide and a layer of aluminum oxide interposed between the layers of zirconium oxide. In some embodiments, each of the dielectric layers 114A through 114D has a thickness between about 0.3 nm and about 50 nm.

In some embodiments, after forming the conductive layer 112A over the liner layer 110, the conductive layer 112A is patterned to expose portions of a top surface of the liner layer 110. In some embodiments, the patterning processes may comprise suitable photolithography and etching methods. Subsequently, spacers 116A are formed along opposite sidewalls of the conductive layer 112A. Each of the spacers 116A may comprise a dielectric material such as silicon oxide, silicon nitride, silicon oxynitride, a combination thereof, a multilayer thereof, or the like. In some embodiments, the spacers 116A are formed by blanket depositing a dielectric material using ALD, CVD, a combination thereof, or the like, and anisotropically etching the dielectric material to remove horizontal portions of the dielectric material. Remaining vertical portions of the dielectric material form the spacers 116A. In some embodiments, each of the spacers 116A has a width between about 5 nm and about 50 nm. Subsequently, the dielectric layer 114A is former over the conductive layer 112A and the spacers 116A. In some embodiments, the dielectric layer 114A is patterned to remove portions of the dielectric layer 114 extending beyond the spacers 116A. In some embodiments, the patterning processes may comprise suitable photolithography and etching methods.

Next, the conductive layer 112B is blanket formed over the dielectric layer 114A and the substrate 102. The conductive layer 112B is then patterned to expose portions of a top surface of dielectric layer 114A. In some embodiments, the patterning processes may comprise suitable photolithography and etching methods. Subsequently, spacers 116B are formed along opposite sidewalls of the conductive layer 112B. In some embodiments, the spacers 116B may be formed using similar materials and methods as the spacers 116A and the description is not repeated herein. In some embodiments, each of the spacers 116B has a width between about 5 nm and about 50 nm. Subsequently, the dielectric layer 114B is former over the conductive layer 112B and the spacers 116B. In some embodiments, the dielectric layer 114B is patterned to remove portions of the dielectric layer 114B extending beyond the spacers 116B. In some embodiments, the patterning processes may comprise suitable photolithography and etching methods.

Next, the process steps described above with reference to forming the conductive layer 112B, the spacers 116B and the dielectric layer 114B are repeated to form the conductive layer 112C, the spacers 116C and the dielectric layer 114C over the dielectric layer 114B and to form the conductive layer 112D, the spacers 116D and the dielectric layer 114C. In some embodiments, the spacers 116C and 116D may be formed using similar materials and methods as the spacers 116A and the description is not repeated herein. In some embodiments, each of the spacers 116C has a width between about 5 nm and about 50 nm. In some embodiments, each of the spacers 116D has a width between about 5 nm and about 50 nm. In the embodiment illustrated in FIG. 2, the DTC 121 has four capacitor electrodes. Further, in the embodiment illustrated in FIG. 2, the DTC 121 is formed in two separate recesses 104 in the substrate 102. In other embodiments, the DTC 121 may have more or less than four capacitor electrodes based on design requirements for the DTC 121 and/or may only be formed in a single recess 104. As one of ordinary skill in the art will recognize, the above described process for forming DTCs is merely one method of forming the DTCs, and other methods are also fully intended to be included within the scope of the embodiments.

Referring further to FIG. 2, after forming the DTC 121 in the substrate 102, remaining portions of the recesses 104 (see FIG. 1) are filled with a dielectric material 118. In some embodiments, the dielectric material 118 may comprise an oxide such as silicon oxide, a nitride such as a silicon nitride, a combination thereof, a multilayer thereof, or the like. In some embodiments, the dielectric material 118 is patterned to remove portions of the dielectric material 118 extending beyond the spacers 116D. In some embodiments, the patterning processes may comprise suitable photolithography and etching methods.

In some embodiments, after forming and patterning the dielectric material 118, an etch stop layer 120 is formed over the DTC 121. In some embodiments, the etch stop layer 120 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like. In some embodiments, the etch stop layer 120 has a thickness between about 3 nm and about 30 nm. In some embodiments, the etch stop layer 120 is used to aid in forming conductive vias that provide electrical connection to the conductive layers 112A through 112D of the DTC 121. The etch stop layer 120 may be also referred to as a contact etch stop layer (CESL).

Figure 3:
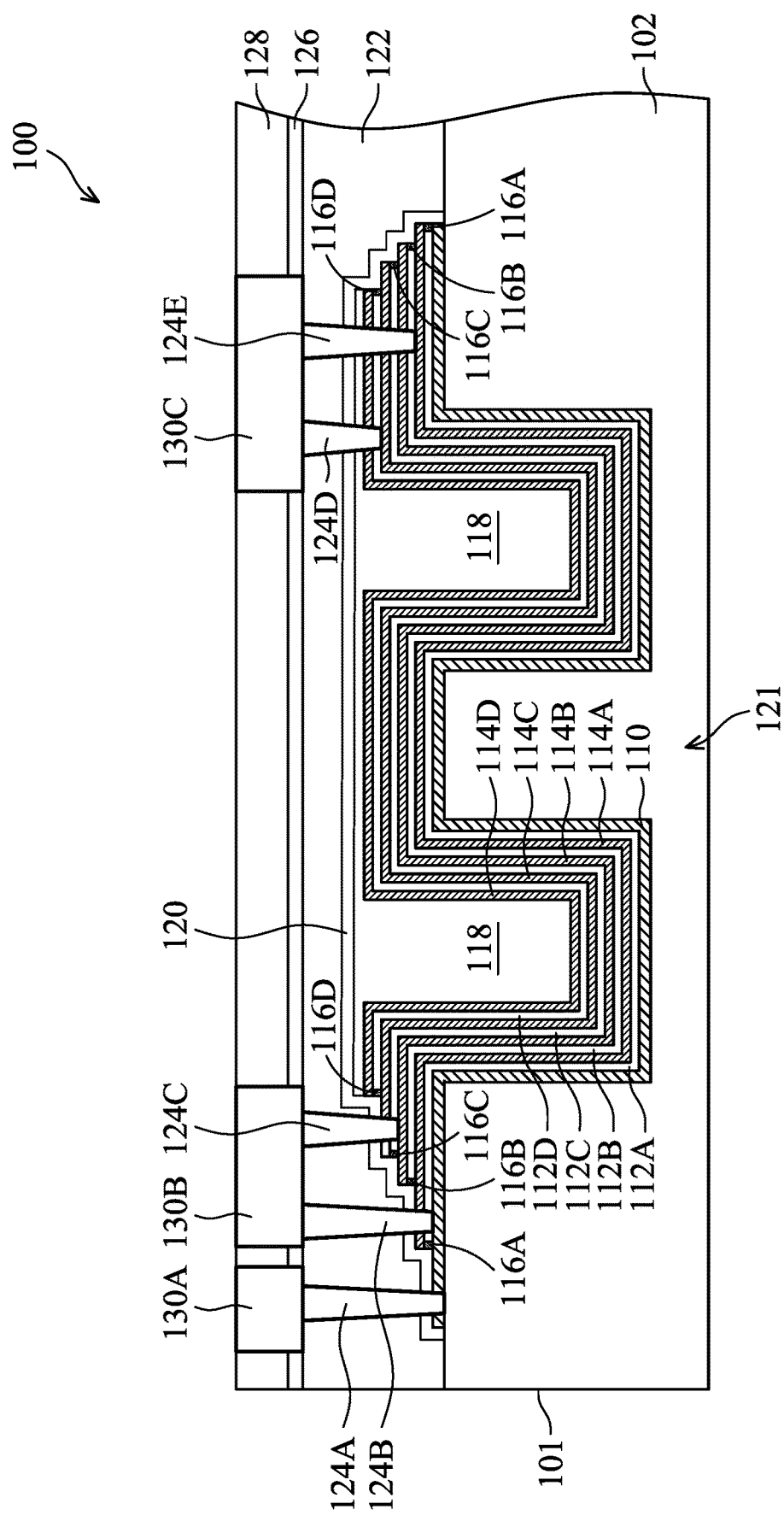
Figure 4:
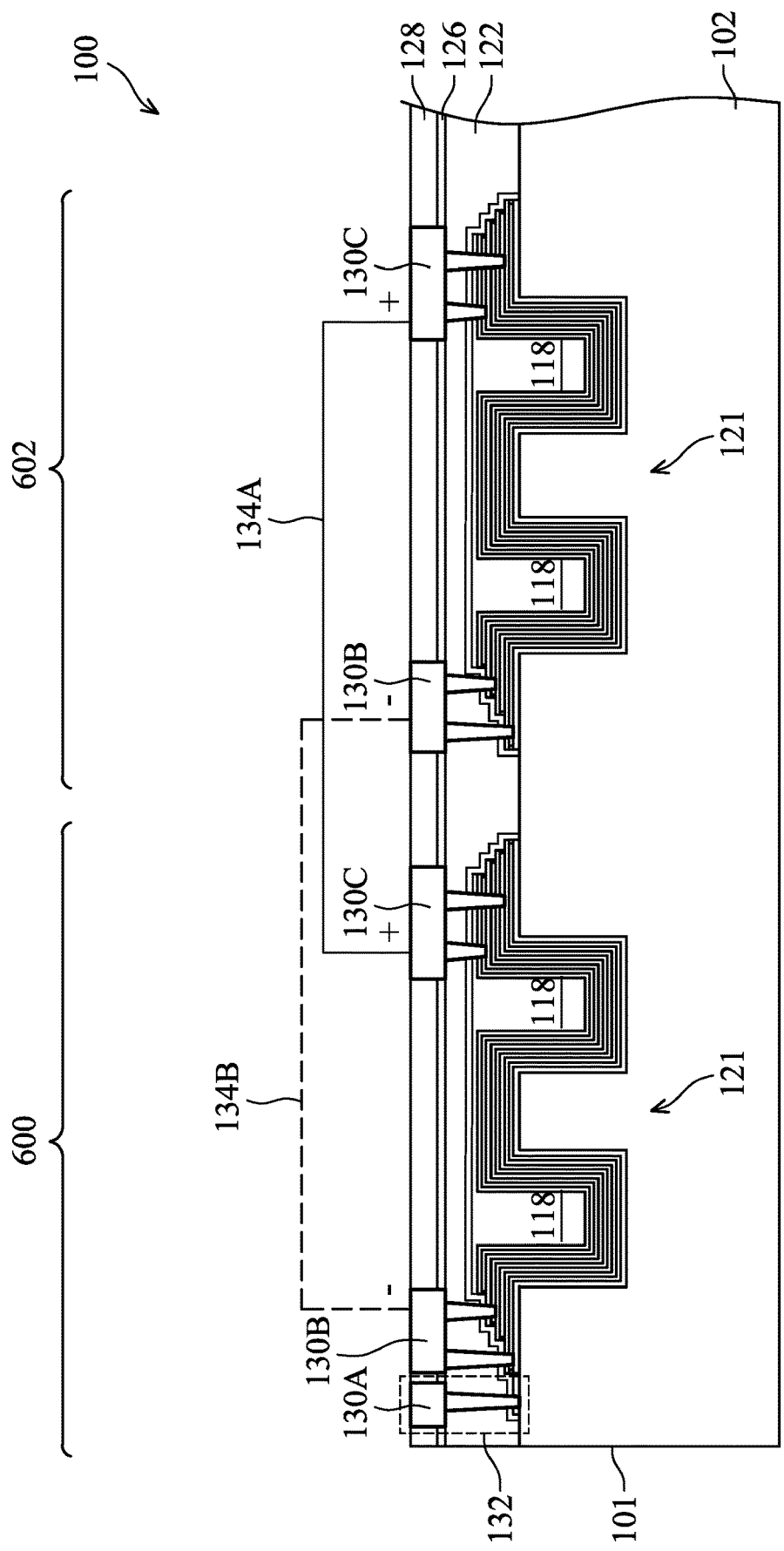
Figure 5:
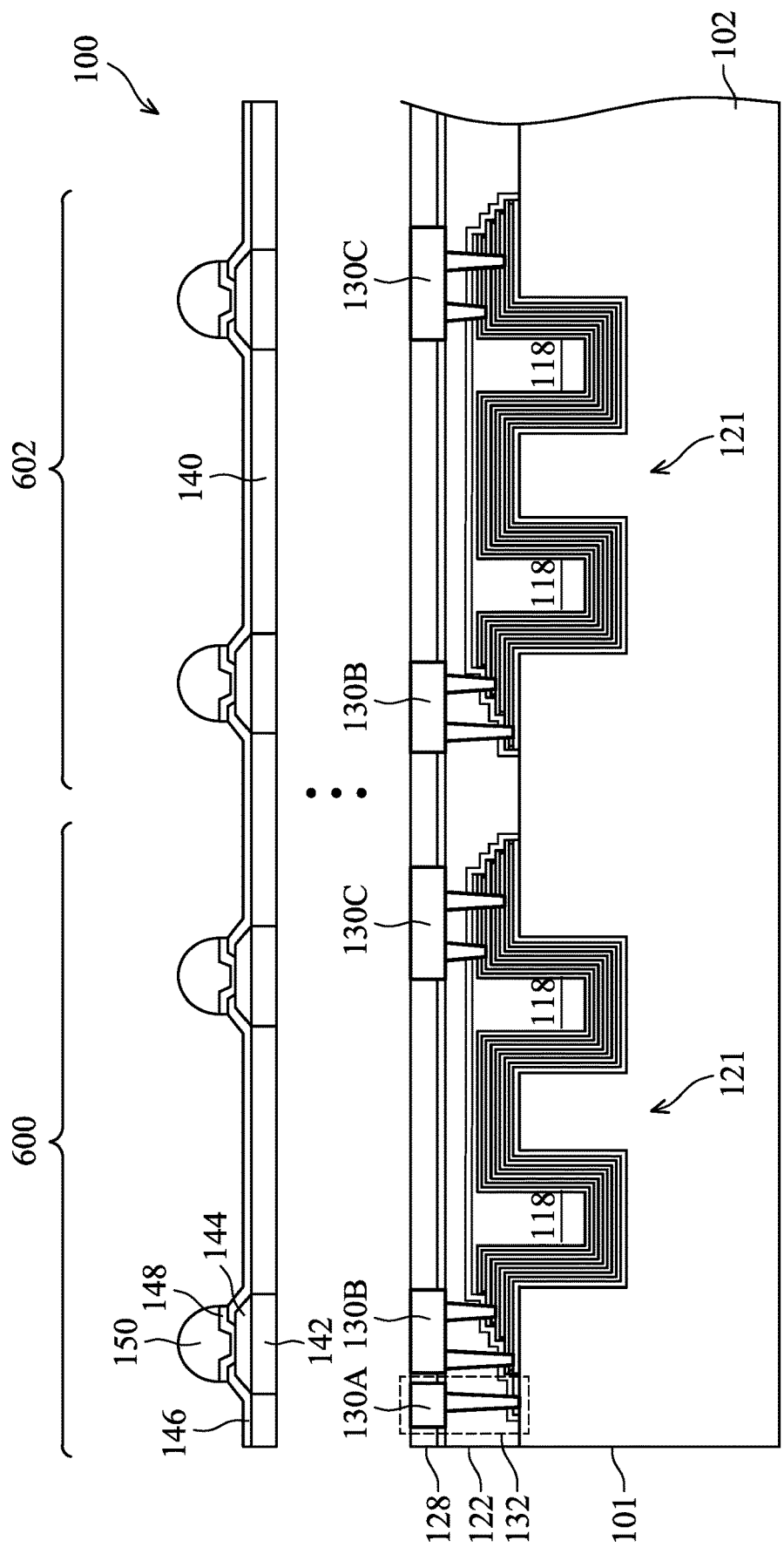

Referring to FIGS. 3 through 5, after forming the DTC 121, an interconnect structure 152 is formed over the substrate 102 and the DTC 121. In some embodiments, the interconnect structure 152 comprises a plurality of dielectric layers with conductive features embedded in the plurality of dielectric layers. In the embodiment illustrated in FIG. 3, the interconnect structure 152 comprises a dielectric layer 122 with conductive vias 124A through 124E embedded within the dielectric layer 122 and a dielectric layer 128 with conductive lines 130A through 130C embedded within the dielectric layer 128.

In some embodiments, the dielectric layers 122 and 128 may include a low-k dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like. The conductive features (such as conductive vias 124A through 124E and conductive lines 130A through 130C may be formed using any suitable method, such as a damascene method, or the like. In some embodiments, the steps for forming the conductive features include forming openings in the respective dielectric layers, depositing one or more barrier/adhesion layers (not shown) in the openings, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings.

In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof, or the like. The conductive material may comprise copper, aluminum, tungsten, combinations thereof, alloys thereof, or the like, and may be formed using, for example, by plating, or other suitable methods.

In some embodiments, the interconnect structure 152 further comprises etch stop layer 126 formed between the dielectric layers 122 and 128. A material for the etch stop layer 126 is chosen such that etch rates of the etch stop layer 126 are less then etch rates of corresponding ones of the dielectric layers 122 and 128. In some embodiments, an etch rate of the etch stop layer 126 is less than an etch rate of the dielectric layer 128. In some embodiments, an etch rate of the etch stop layer 126 is less than an etch rate of the dielectric layer 122. In some embodiments, the etch stop layer 126 may comprise similar material as the etch stop layer 120 described above with reference to FIG. 2 and the description is not repeated herein.

In some embodiments, the conductive via 124A extends through the dielectric layer 122, the etch stop layer 120, and the liner layer 110 and physically contacts the substrate 102. The conductive via 124A electrically couples the substrate 102 to the conductive line 130A. The conductive via 124B extends through the dielectric layer 122, the etch stop layer 120, and the dielectric layer 114A and physically contacts the conductive layer 112A. The conductive via 124B electrically couples the conductive layer 112A to the conductive line 130B. The conductive via 124C extends through the dielectric layer 122, the etch stop layer 120, and the dielectric layer 114C and physically contacts the conductive layer 112C. The conductive via 124C electrically couples the conductive layer 112C to the conductive line 130B. The conductive via 124D extends through the dielectric layer 122, the etch stop layer 120, the dielectric material 118, and the dielectric layer 114D and physically contacts the conductive layer 112D. The conductive via 124D electrically couples the conductive layer 112D to the conductive line 130C. The conductive via 124E extends through the dielectric layer 122, the etch stop layer 120, the dielectric material 118, the dielectric layers 114B through 114D, the conductive layers 112C and 112D and physically contacts the conductive layer 112B. The conductive via 124E electrically couples the conductive layer 112B to the conductive line 130C. In the embodiment illustrated in FIG. 3, the conductive vias 124A through 124E partially extend into respective ones of the conductive layers 112A through 112D. In other embodiments, one or more of the conductive vias 124A through 124E may fully extend though respective ones of conductive layers 112A through 112D.

In some embodiments, the conductive line 130B can represent the bottom electrode (e.g., capacitor electrode at a lower potential) of the DTC 121 and the conductive line 130C can represent the top electrode (e.g., capacitor electrode at a higher potential) of the DTC 121. Although, in some embodiments, these orientations can be reversed.

Referring further to FIG. 3, in some embodiments some of the conductive features of the interconnect structure 152 near the edge 101 of the semiconductor device 100 form a seal ring structure 132. In the embodiment illustrated in FIG. 3, the seal ring structure 132 comprises the conductive vias 124A and the conductive line 130A. In some embodiments, the seal ring structure 132 extends along the edge 101 of the semiconductor device 100 and encircles an interior portion of the semiconductor device 100 in a plan view.

FIG. 4 illustrates an embodiment with multiple DTCs 121 in the substrate 102 and illustrates an exemplary electrical connection between the DTCs 121. In FIG. 4, there is a DTC 121 in first region 600 and another DTC 121 in a second region 602. Each of the DTCs 121 are formed as described above and may be formed simultaneously.

In some embodiments, the two adjacent DTCs 121 are electrically coupled such that the conductive lines 130B (e.g., bottom electrodes) of the DTCs 121 are coupled together by line 134B and the conductive lines 130C (e.g., top electrodes) of the DTCs 121 are coupled together by line 134A. Thus, in this configuration, the DTCs 121 are coupled in parallel and can provide a larger effective capacitance as needed for design requirements. In some embodiments, the lines 134A and 134B can be implemented by forming more dielectric layers with more embedded conductive features in the interconnect structure 152 illustrated in FIGS. 3 and 4.

FIG. 5 illustrates further processing on the structure of FIGS. 3 and 4 to complete the interconnect structure 152. In FIG. 5, one or more dielectric layers with more embedded conductive features is formed over the dielectric layer 128 and conductive lines 130A through 130C to connect the conductive lines 130A through 130C to the desired configuration. In FIG. 5, a dielectric layer 440 is formed over these one or more dielectric layers and has conductive lines 142 embedded therein. The conductive lines 142 may be electrically coupled to the underlying conductive features to achieve the desired electrical configuration. These overlying dielectric layers and conductive features may be similar to the dielectric layers 122, 126, and 128 and conductive lines 130A through 130C described above and the description is not repeated herein.

Further in FIG. 5, contact pads 144 are formed over the interconnect structure 152. The contact pads 144 are in electrical contact with one or more respective conductive lines 142. In some embodiments, the contact pads 144 may comprise a conductive material such as aluminum, copper, tungsten, silver, gold, a combination thereof, or the like. In some embodiments, a conductive material may be formed over the interconnect structure 152 using, for example, PVD, ALD, electro-chemical plating, electroless plating, a combination thereof, or the like. Subsequently, the conductive material is patterned to form the contact pads 144. In some embodiments, the conductive material may be patterned using suitable photolithography and etching methods.

Further in FIG. 5, a passivation layer 146 is formed over the interconnect structure 152 and the contact pads 144. In some embodiments, the passivation layer 146 may comprise one or more layers of non-photo-patternable insulating materials, one or more layers of photo-patternable insulating materials, a combination thereof, or the like. The non-photo-patternable insulating materials may comprise silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The photo-patternable insulating materials may comprise polybenzoxazole (PBO), polyimide (PI), benzocyclobutene (BCB), a combination thereof, or the like, and may be formed using a spin-on coating process, or the like. In some embodiments, the passivation layer 146 has a thickness between about 5 nm and about 50 nm.

In some embodiments, openings are formed in the passivation layer 146 to expose portions of the contact pads 144, respectively. In some embodiments, the passivation layer 146 may be patterned using suitable photolithography and etching method. In some embodiments, the openings have a width between about 500 nm and about 5000 nm.

FIG. 5 also illustrates the formation of underbump metallizations (UBMs) 148 over the contact pads 144 is illustrated. In some embodiments, each of the UBMs 148 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 148. Any suitable materials or layers of material that may be used for the UBMs 148 are fully intended to be included within the scope of the current application.

The formation of the UBMs 148 may include a mask layer (not shown) formed over the passivation layer 146. In some embodiments, the mask layer comprises a photoresist, or the like and is patterned to form openings in the mask layer. In some embodiments where the mask layer comprises a photoresist, the patterning process may include suitable photolithography methods. The openings expose the openings in the passivation layer 146.

After forming the openings in mask layer, a conductive layer is formed over the mask layer and sidewalls and bottoms of combined openings in the mask layer and the passivation layer 146. In some embodiments, the conductive layer comprises titanium, copper, nickel, chrome, gold, tungsten, allows thereof, multilayers thereof, or the like, and may be formed using PVD, ALD, CVD, electro-chemical plating, electroless plating, a combination thereof, or the like. In some embodiments, the conductive layer has a thickness between about 5 nm and about 100 nm.

After forming the conductive layer, the mask layer and portions of the conductive layer formed thereon are removed. The remaining portions of the conductive layer form the UBMs 148 over the contact pads 144. In some embodiments where the mask layer comprises a photoresist, the removal process may include an ashing process followed by a wet clean process.

In FIG. 5, conductive connectors 150 are formed over and electrically coupled to the UBMs 148. In some embodiments, each of the connectors 150 may be a solder ball, a controlled collapse chip connection (C4) bump, a ball grid array (BGA) ball, a micro bump, an electroless nickel-electroless palladium-immersion gold technique (ENEPIG) formed bump, a copper pillar, a combination thereof, or the like. In some embodiments where the connectors 150 are formed of solder materials, a reflow process may be performed in order to shape the solder material into the desired bump shapes. In some embodiments, after forming the connectors 150, the semiconductor device 100 is diced to form individual semiconductor devices. The dicing process may include sawing, a laser ablation method, an etching process, a combination thereof, or the like. Subsequently, each of the individual semiconductor devices may be tested to identify known good dies (KGDs) for further processing.

Figure 6:
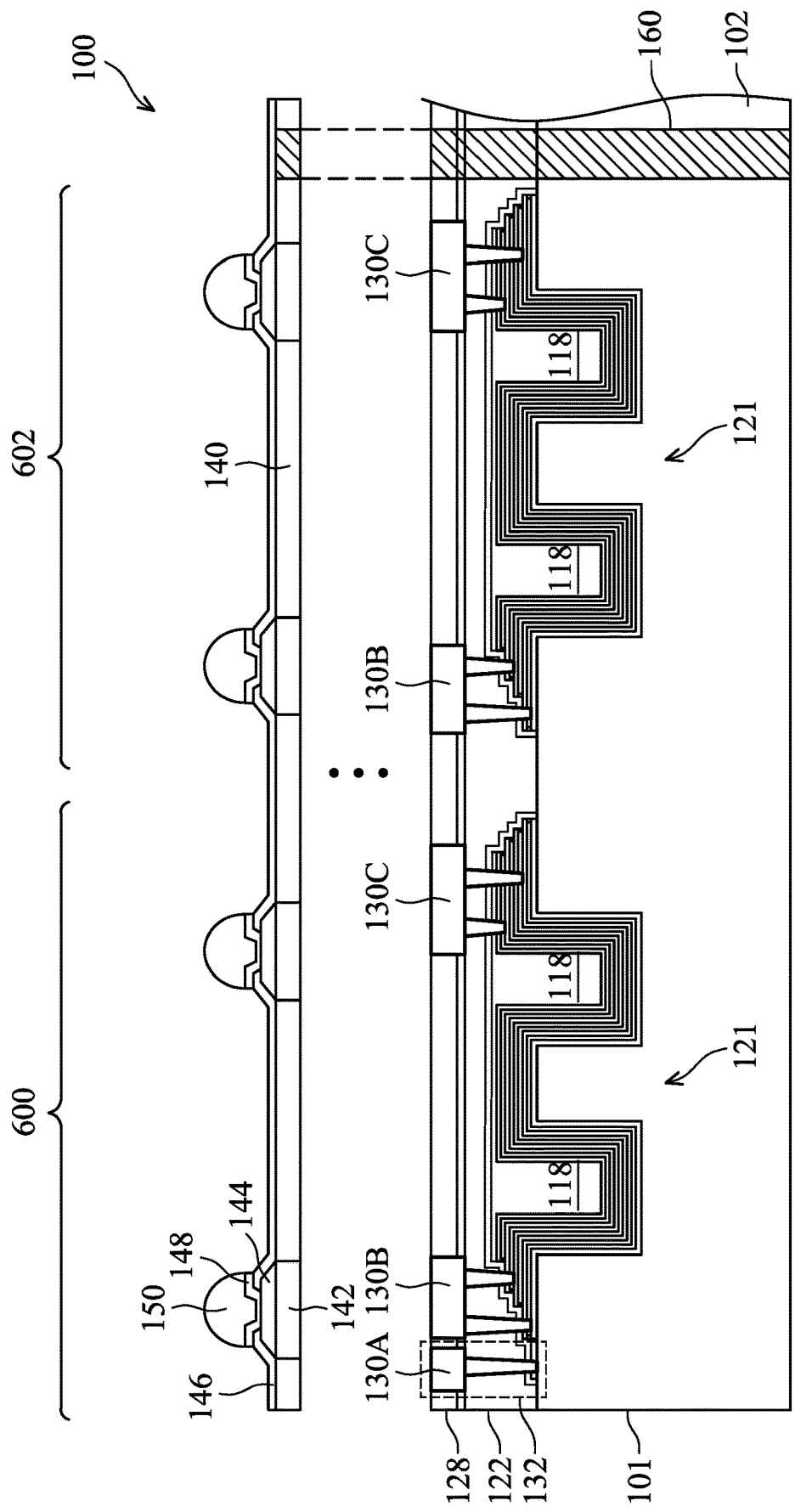

FIG. 6 illustrates a cross-sectional view of a semiconductor device 100 accordance with some embodiments. This embodiment is similar to the embodiment illustrated in FIG. 1 through 5 except that this embodiment includes a through via 160. Details regarding this embodiment that are similar to those for the previously described embodiment will not be repeated herein.

In this embodiment, the through via 160 is formed through the substrate 102 and/or the interconnect structure 152 to provide the ability to electrically couple this semiconductor device 100 to adjacent devices (e.g., devices above and below this semiconductor device 100). In some embodiments, the through via 160 is only formed through the substrate 102 and is coupled to the interconnect structure 152 and can utilize the conductive features of the interconnect structure and the connectors 150 to be coupled to other devices. In some embodiments, the through via 160 is formed through the substrate 102 and the interconnect structure 152 and can utilize the connectors 150 to be coupled to other devices. The through via 160 can be formed by patterning a hole in the substrate 102 and/or the interconnect structure and forming a conductive material in the hole. The conductive material may be formed by a similar process as described above for conductive features in the interconnect structure 152 and the description is not repeated herein.

FIGS. 7 through 23 illustrate cross-sectional views of various intermediate stages of fabrication of a semiconductor package 250 in accordance with some embodiments. The semiconductor package 250 will incorporate one or more of the semiconductor devices 100. The semiconductor devices 100 include the DTCs 121 in each of the semiconductor devices 100. The conductive connectors 190 and the redistribution structures 180 of the semiconductor package 250 (see, e.g., FIG. 23) are used to couple the DTCs 121 of the different semiconductor devices 100 in parallel and provide a larger effective capacitance for the semiconductor package 250 than is possible with a single semiconductor device 100.

Figure 7:
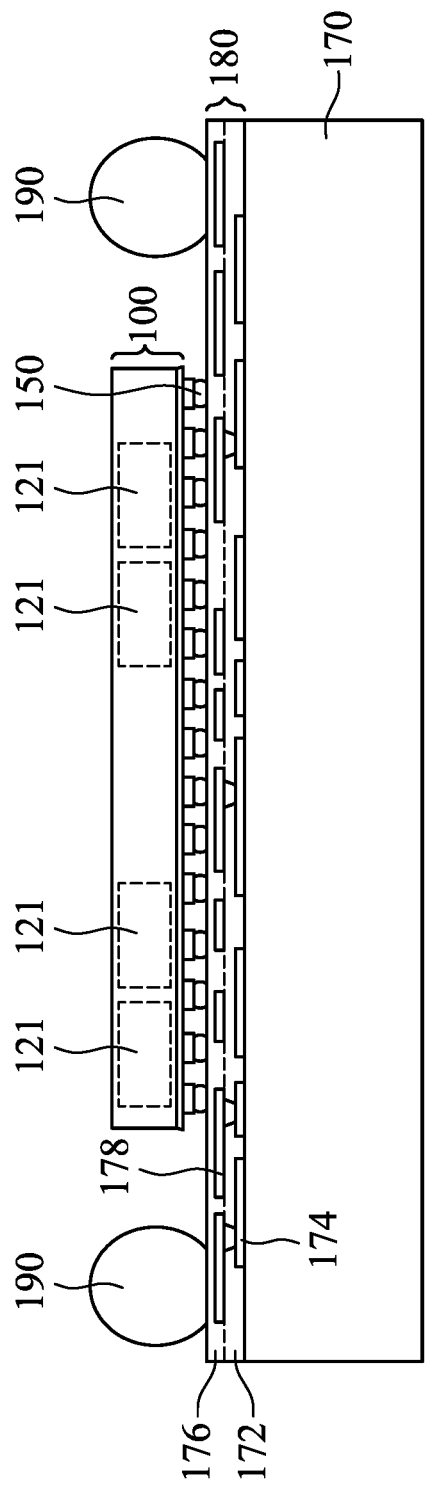
FIGS. 7-22 illustrate cross-sectional views of various intermediate stages of fabrication of a semiconductor package in accordance with some embodiments.

FIG. 7 illustrates a carrier substrate 170, a redistribution structure 180 over the carrier substrate 170, a semiconductor device 100 bonded to the redistribution structure 180, and conductive connectors 190 over the redistribution structure 180. The carrier substrate 170 may be a glass carrier substrate, a ceramic carrier substrate, or the like. The carrier substrate 170 may be a wafer, such that multiple semiconductor devices 100 can be bonded to different regions of the carrier substrate 170 simultaneously. In some embodiments, an adhesive layer (not shown), such as a release layer is formed on the surface of the carrier substrate 170 and the redistribution structure 180 is formed on the release layer. The release layer may be formed of a polymer-based material, which may be removed along with the carrier substrate 170 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 170, or may be the like. The top surface of the release layer may be leveled and may have a high degree of coplanarity.

The redistribution structure 180 is formed over the carrier 170 (and the release layer if present). The redistribution structure 180 includes dielectric 172 and 176 and metallization patterns 174 and 178. The metallization patterns may also be referred to as redistribution layers or redistribution lines. The redistribution structure 180 is shown as an example having two layers of metallization patterns and two dielectric layers. More or fewer dielectric layers and metallization patterns may be formed in the redistribution structure 180. If fewer dielectric layers and metallization patterns are to be formed, steps and process discussed below may be omitted. If more dielectric layers and metallization patterns are to be formed, steps and processes discussed below may be repeated.

As an example to form the redistribution structure 180, the metallization pattern 174 are formed over the carrier 170 (and release layer or other dielectric layer if present). The metallization pattern 174 includes line portions (also referred to as conductive lines) on and extending along the major surface of the carrier 170 (and release layer or other dielectric layer if present). In some embodiments, a dielectric layer (not shown) is formed below the metallization pattern 174 and the metallization pattern 174 further includes via portions (also referred to as conductive vias) extending through the dielectric layer. As an example to form the metallization pattern 174, a seed layer is formed over the carrier 170 (and release layer or other dielectric layer if present). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 174. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 174. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 172 is then formed. The dielectric layer 172 can be deposited on the metallization pattern 174 and the carrier 170 (and release layer or other dielectric layer if present). In some embodiments, the dielectric layer 172 is formed of a photo-sensitive material such as PBO, polyimide, BCB, or the like, which may be patterned using a lithography mask. The dielectric layer 172 may be formed by spin coating, lamination, CVD, the like, or a combination thereof. The dielectric layer 172 is then patterned. The patterning forms openings exposing portions of the metallization pattern 174. The patterning may be by an acceptable process, such as by exposing the dielectric layer 172 to light when the dielectric layer 172 is a photo-sensitive material or by etching using, for example, an anisotropic etch. If the dielectric layer 172 is a photo-sensitive material, the dielectric layer 172 can be developed after the exposure.

The metallization pattern 178 is then formed. The metallization pattern 178 incudes line portions (also referred to as conductive lines) on and extending along the major surface of the dielectric layer 172. The metallization pattern 178 further includes via portions (also referred to as conductive vias) extending through the dielectric layer 172 to be connected to the metallization pattern 174. As an example to form the metallization pattern 178, a seed layer is formed over the dielectric layer 172 and in the openings extending through the dielectric layer 172. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 322. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 178. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, the metallization pattern 178 has a different size than the metallization pattern 174. For example, the conductive lines and/or vias of the metallization pattern 178 may be wider or thicker than the conductive lines and/or vias of the metallization pattern 174. Further, the metallization pattern 178 may be formed to a greater pitch than the metallization pattern 174.

The dielectric layer 176 is then deposited on the metallization pattern 178 and dielectric layer 172. The dielectric layer 176 can be formed in a similar manner and of similar materials as the dielectric layer 172.

Further in FIG. 7, the conductive connectors 190 are formed over and electrically coupled to the redistribution structure 180. The conductive connectors 190 allow for the redistribution structure 180 to be mechanically and electrically coupled to another package structure (e.g., other redistribution structure in FIG. 10). UBMs (not shown) may also be formed before the conductive connectors 190 to electrically couple the conductive connectors 190 to the metallization patterns of the redistribution structure 180. These UBMs may be similar to the UBMs 148 described above and the description is not repeated herein. The conductive connectors 190 may be similar to the conductive connectors 150 described above and the description is not repeated herein. In some embodiments, the conductive connectors 190 are larger than the conductive connectors 150.

FIG. 7 further illustrates the semiconductor device 100 bonded to the redistribution structure 180. The semiconductor device 100 may be placed over the redistribution structure 180 using, for example, a pick-and-place tool. In some embodiments, portions of the dielectric layer 176 may be patterned to expose the metallization pattern 178 and UBMs or bond pads (not shown) may also be formed on these exposed portions of the metallization pattern 178. These UBMs or bond pads are used to electrically couple the conductive connectors 150 to the metallization pattern 178 of the redistribution structure 180.

After the semiconductor device 100 is placed over the redistribution structure 180, the semiconductor device 100 is mechanically and electrically bonded to the metallization pattern 178 (and/or UBMs or bond pads if present) of the redistribution distribution structure 180 by way of conductive connectors 150. The conductive connectors 190 and the redistribution structure 180 enable the DTCs 121 of the semiconductor device 100 to be electrically coupled to other devices. For example, the redistribution structure 180 is electrically coupled to the DTCs 121 of the semiconductor device 100 and the conductive connectors 190 are electrically coupled to the redistribution structure 180. As illustrated in subsequent figures and processing, the conductive connectors 190 will act as through vias connecting the redistribution structure 180 to another redistribution structure by way of one or more conductive connectors. The conductive connectors and redistribution structures of the semiconductor package (see, e.g., FIG. 22) allow for multiple semiconductor devices 100 in the semiconductor package to be coupled together (e.g., in parallel).

In some embodiments, before bonding the conductive connectors 150, the conductive connectors 150 are coated with a flux (not shown), such as a no-clean flux. The conductive connectors 150 may be dipped in the flux or the flux may be jetted onto the conductive connectors 150. In another embodiment, the flux may be applied to the metallization pattern 178 (and/or UBMs or bond pads if present).

In some embodiments, the conductive connectors 150 may have an optional epoxy flux (not shown) formed thereon before they are reflowed with at least some of the epoxy portion of the epoxy flux remaining after the semiconductor device 100 is attached to the underlying semiconductor device 100.

The bonding between the semiconductor device 100 and the redistribution structure 180 may be a solder bonding. In an embodiment, the semiconductor device 100 is bonded to the redistribution structure 180 by a reflow process. During this reflow process, the conductive connectors 150 are in contact with the metallization pattern 178 (and/or UBMs or bond pads if present) to physically and electrically couple the semiconductor device 100 to the redistribution structure 180. After the bonding process, an intermetallic compound (IMC, not shown) may form at the interface of the metallization pattern 178 (and/or UBMs or bond pads if present) and the conductive connectors 150. In some embodiments, the conductive connectors 150 and 190 are reflowed during a same process.

Figure 8:
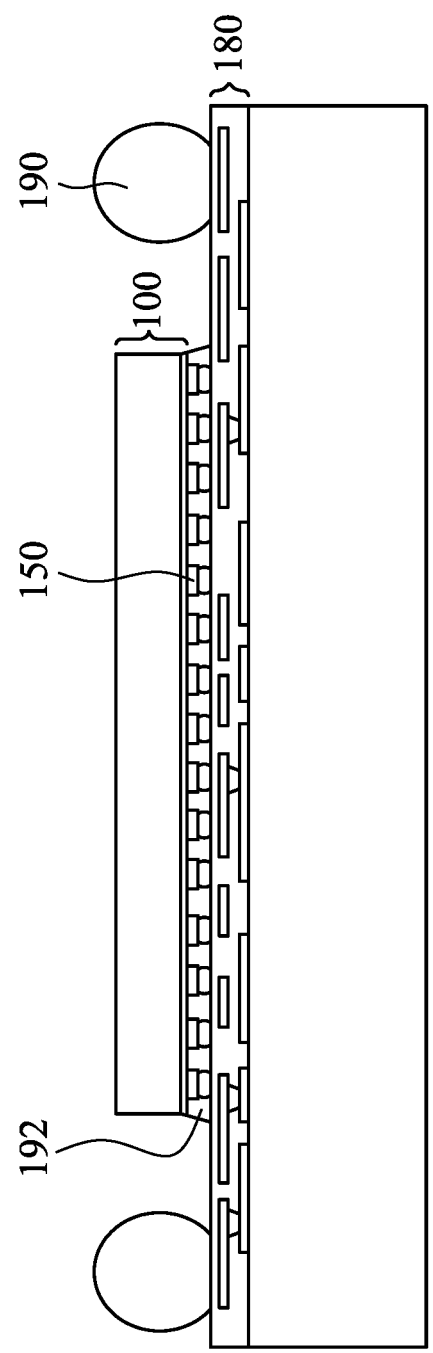

In FIG. 8, an underfill 192 is formed between redistribution structure 180 and the bonded semiconductor device 100. The underfill 192 may be formed of a liquid epoxy, a polymer, PBO, polyimide, solder resist, or a combination thereof. The underfill may reduce stress and protect the joints resulting from the reflowing of the conductive connectors 150. The underfill may be formed by a capillary flow process after the semiconductor device 100 is attached, or may be formed by a suitable deposition method before the semiconductor device 100 is attached. In embodiments where the epoxy flux is formed, it may act as the underfill.

Figure 9:
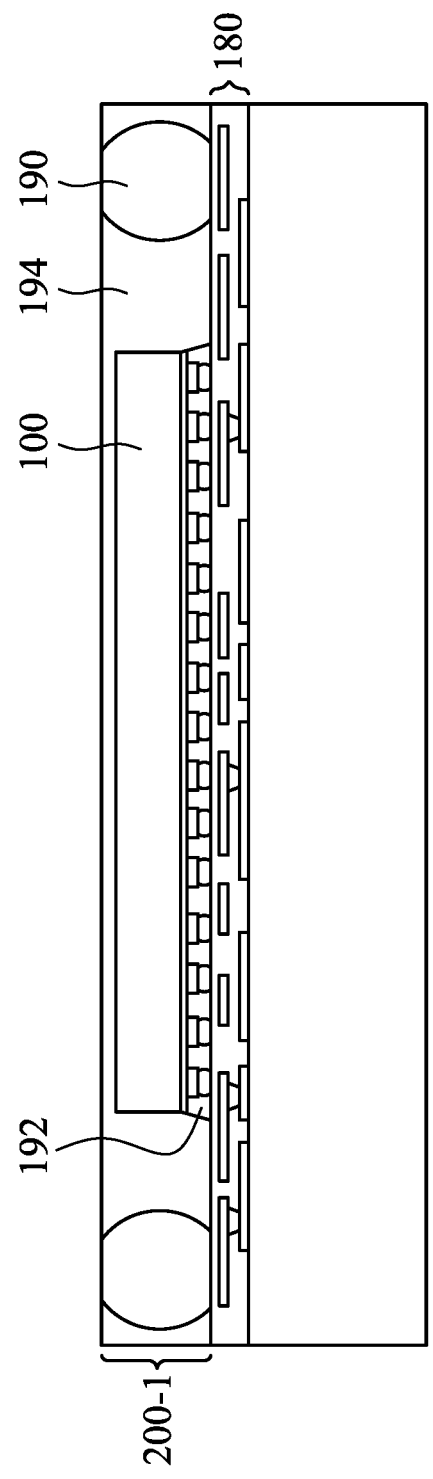

In FIG. 9, an encapsulant 194 is formed on the semiconductor device 100, the conductive connectors 190, and the redistribution structure 180. The encapsulant 194 may be a molding compound, epoxy, or the like, and may be applied by compression molding, transfer molding, or the like. The encapsulant 194 may be formed over the redistribution structure 180 such that the conductive connectors 190 and/or semiconductor device 100 are buried or covered. The encapsulant 194 is then cured.

In some embodiments, a planarization process is performed on the encapsulant 194. The planarization process may be, for example, a chemical-mechanical polish (CMP), a grinding process, or the like.

The encapsulated semiconductor device 100 and the conductive connectors 190 form a semiconductor structure 200-1 (sometimes referred to as a semiconductor layer 200-1) over a redistribution structure 180.

Figure 10:
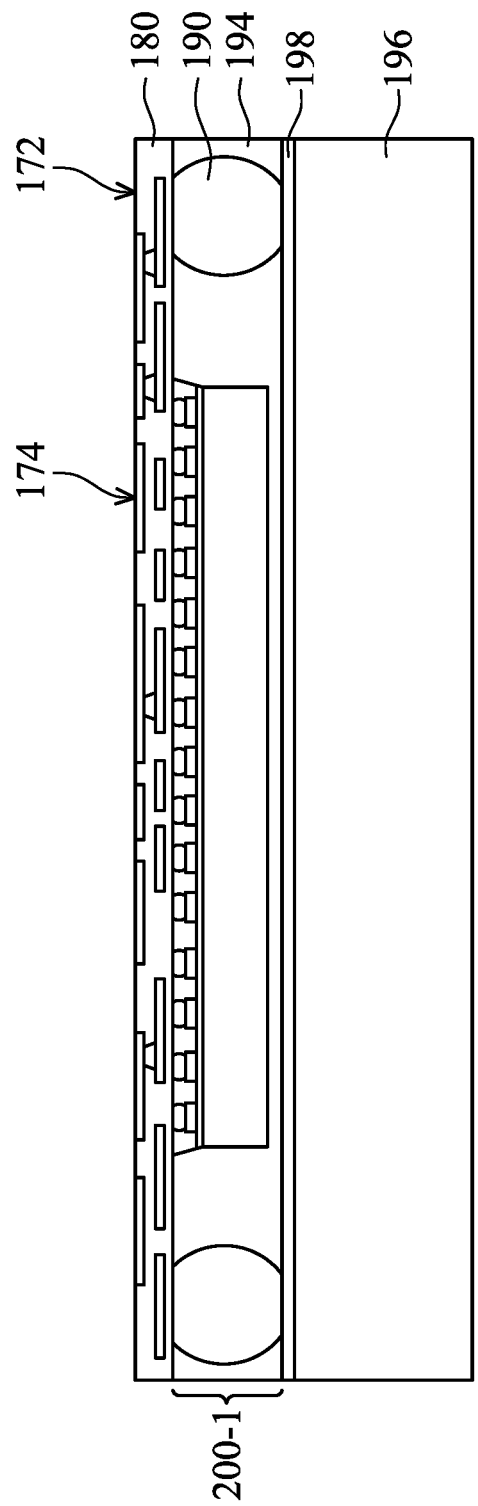

In FIG. 10, a carrier substrate de-bonding is performed to detach (de-bond) the carrier substrate 170 from the redistribution structure 180. In accordance with some embodiments, the de-bonding includes projecting a light such as a laser light or an UV light on the release layer (if present) so that the release layer decomposes under the heat of the light and the carrier substrate 170 can be removed. The detached structure is then flipped over and adhered to another carrier substrate 196. The semiconductor structure 200-1 may be adhered to the carrier substrate 196 by an adhesive 198. The adhesive 198 may be any suitable adhesive, epoxy, die attach film (DAF), or the like. The adhesive 198 may be applied to the semiconductor structure 200-1 or may be applied over the surface of the carrier substrate 196.

Further in FIG. 10, a planarization process may be performed on the flipped structure to expose the metallization pattern 174 of the redistribution structure 180. The planarization process may also grind the dielectric layer 172 of the redistribution structure. Top surfaces of the metallization pattern 174 and the dielectric layer 172 are coplanar after the planarization process. The planarization process may be, for example, a CMP, a grinding process, or the like. In some embodiments, the planarization may be omitted, for example, if the metallization pattern 174 is already exposed.

Figure 11:
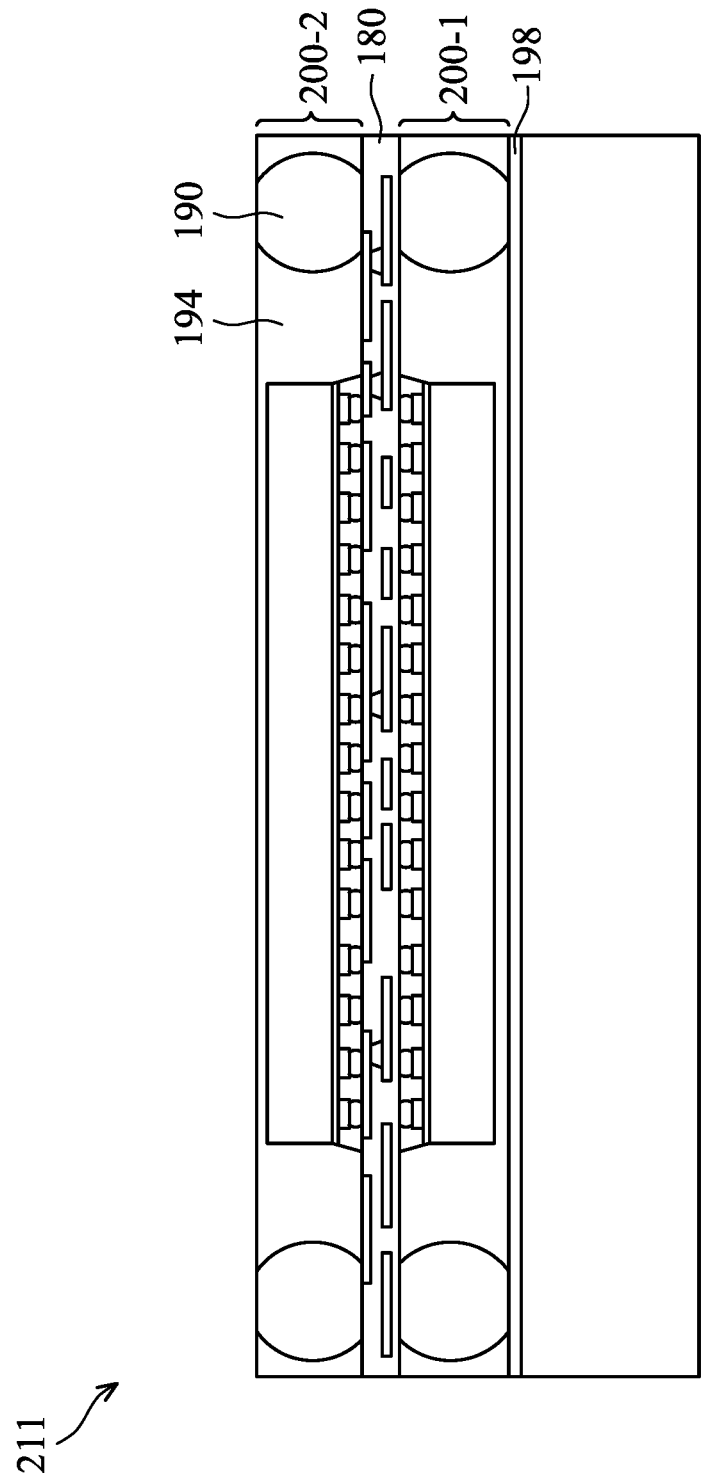

In FIG. 11, a semiconductor structure 200-2 is formed over and bonded to the redistribution structure 180 to form a semiconductor package 211. The semiconductor package 211 comprises the semiconductor structure 200-2, the redistribution structure 180, and the semiconductor structure 200-1. This semiconductor structure 200-2 is formed similar to the semiconductor structure 200-1 described above and the description is not repeated herein. As illustrated in FIG. 11, the semiconductor devices 100 are bonded to the same redistribution structure in a face-to-face (F2F) configuration.

Figure 12:
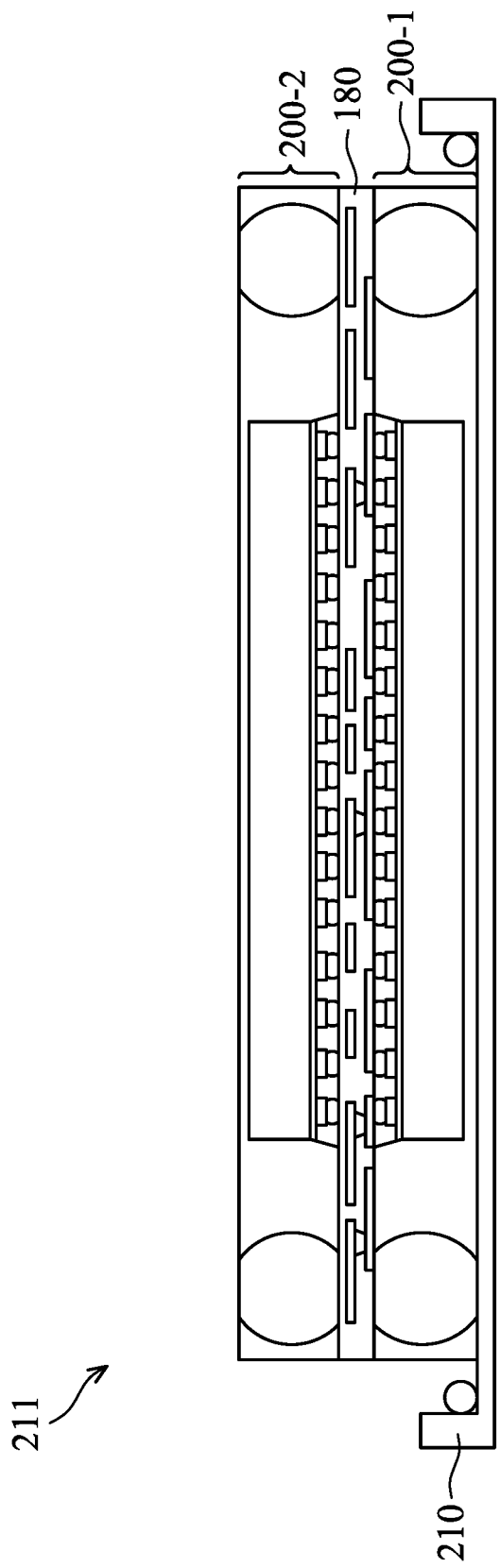

In FIG. 12, a carrier substrate de-bonding is performed to detach (de-bond) the carrier substrate 196 from the semiconductor package 211. In accordance with some embodiments, the de-bonding includes projecting a light such as a laser light or an UV light on the release layer (if present) so that the release layer decomposes under the heat of the light and the carrier substrate 196 can be removed. The adhesive layer 198 is removed and the detached structure is then placed on a tape 210.

Figure 13:
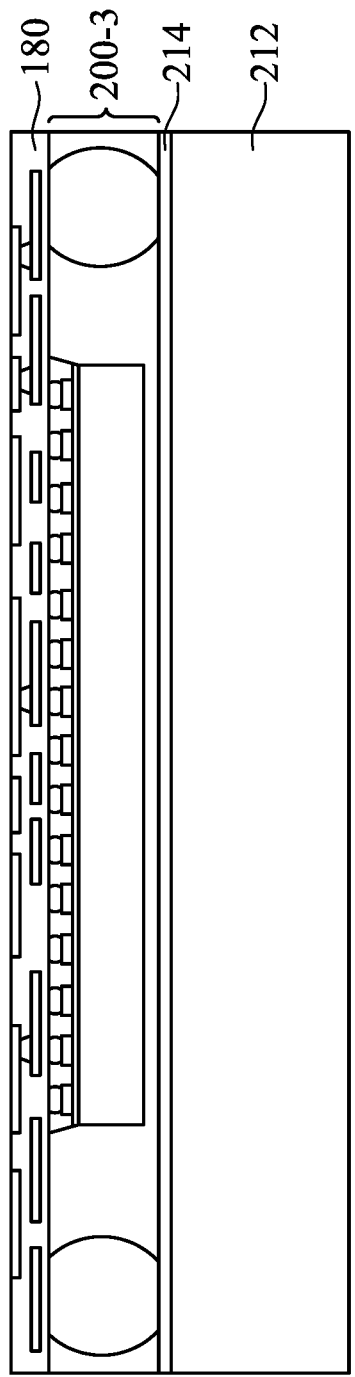

FIG. 13 illustrates another redistribution structure 180 and a semiconductor structure 200-3 over an adhesive layer 214 and a carrier substrate 212. This semiconductor structure 200-3 is formed similar to the semiconductor structure 200-1 described above and the description is not repeated herein. FIG. 13 illustrates an intermediate stage of processing similar to that described in FIG. 10 above and the description of forming this intermediate stage of processing is not repeated herein.

Figure 14:
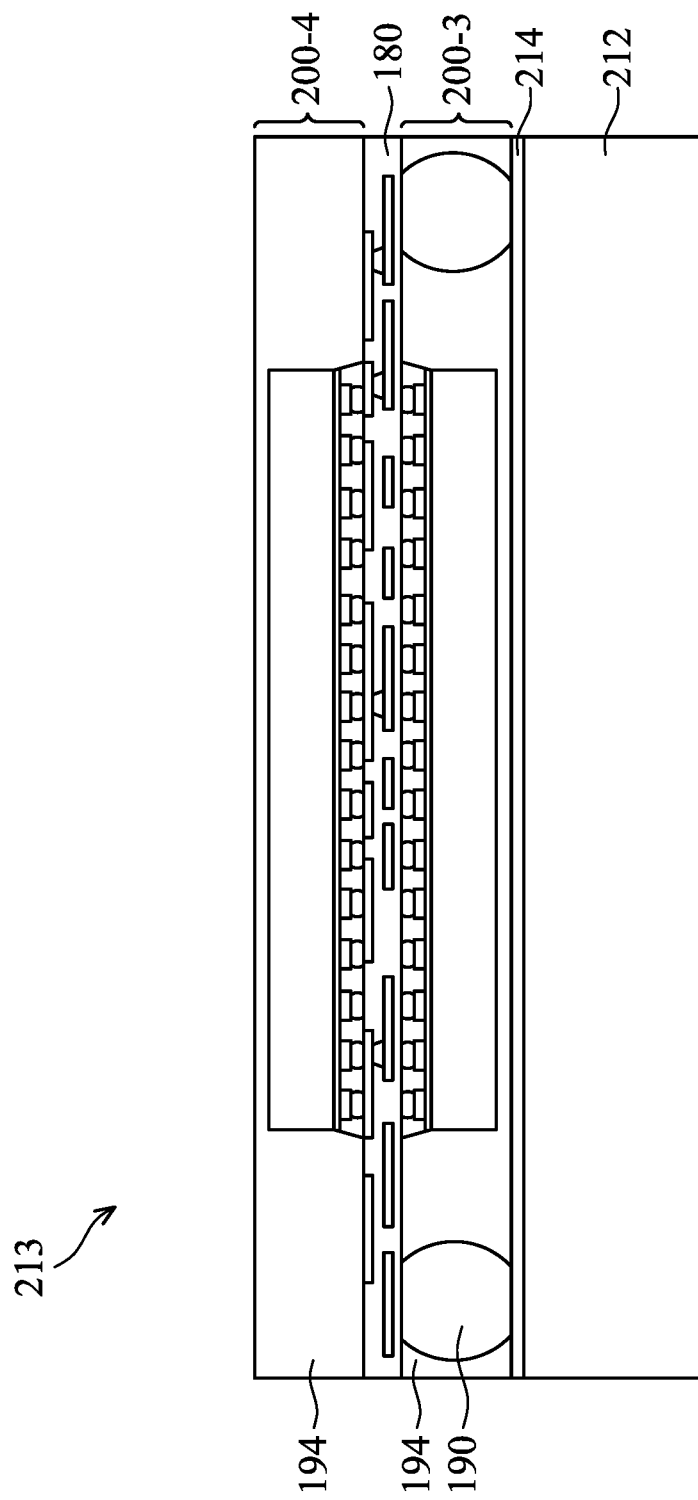

In FIG. 14, a semiconductor structure 200-4 is formed over the redistribution structure 180 and the semiconductor structure 200-3 of FIG. 13 to form a semiconductor package 213. The semiconductor package 213 comprises the semiconductor structure 200-3, the redistribution structure 180, and the semiconductor structure 200-4. This semiconductor structure 200-4 is formed similar to the semiconductor structure 200-1 described above (except that this semiconductor structure 200-4 does not include the conductive connectors 190) and the description is not repeated herein.

Figure 15:
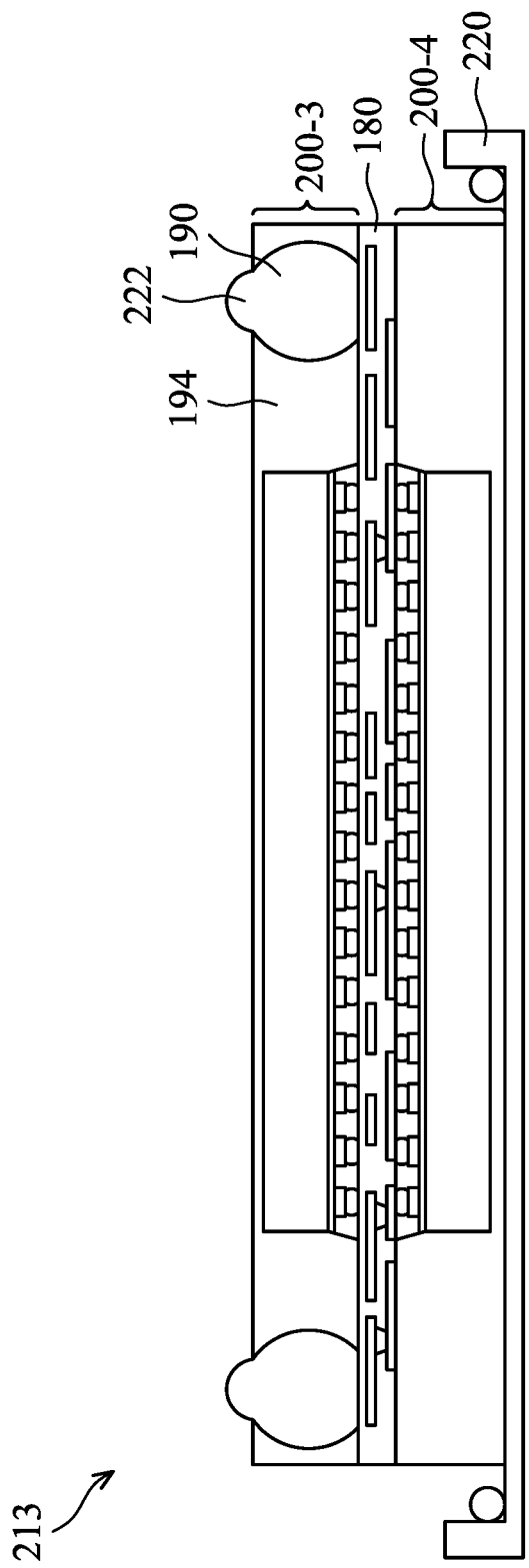

In FIG. 15, a carrier substrate de-bonding is performed to detach (de-bond) the carrier substrate 212 from the semiconductor package 213. In accordance with some embodiments, the de-bonding includes projecting a light such as a laser light or an UV light on the release layer (if present) so that the release layer decomposes under the heat of the light and the carrier substrate 212 can be removed. The adhesive layer 214 is removed and the detached structure is then flipped over and placed on a tape 220.

Also illustrated in FIG. 15, conductive connectors 222 are formed on the conductive connectors 190 of the semiconductor package 213. The conductive connectors 222 will allow the semiconductor package 213 to be electrically and mechanically coupled to another semiconductor structure. In some embodiments, the conductive connectors 222 are formed by forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 222 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
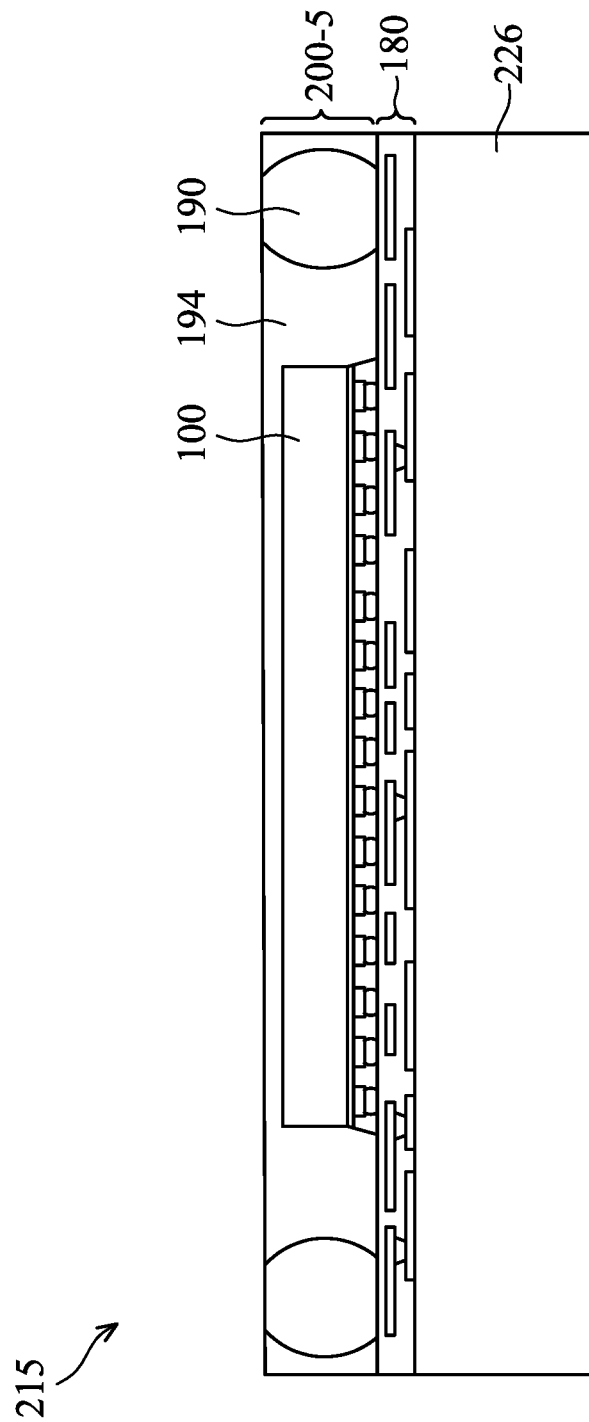

FIG. 16 illustrates another redistribution structure 180 and a semiconductor structure 200-5 over a carrier substrate 226 to form a semiconductor package 215. The semiconductor package 215 comprises the semiconductor structure 200-5 and the redistribution structure 180. This semiconductor structure 200-5 is formed similar to the semiconductor structure 200-1 described above and the description is not repeated herein. FIG. 16 illustrates an intermediate stage of processing similar to that described in FIG. 9 above and the description of forming this intermediate stage of processing is not repeated herein.

Figure 17:
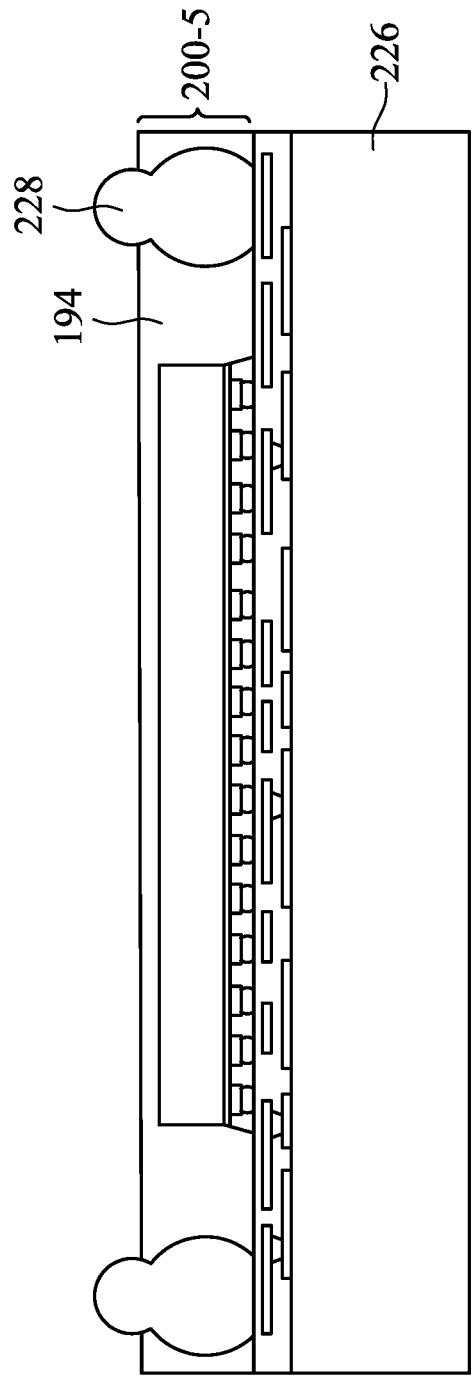

FIG. 17 illustrates the formation of conductive connectors 228 on the conductive connectors 190 of the semiconductor package 215. The conductive connectors 228 will allow the semiconductor package 215 to be electrically and mechanically coupled to another semiconductor structure. The conductive connectors 228 may be formed similar to the conductive connectors 222 described above the description is not repeated herein.

Figure 18:
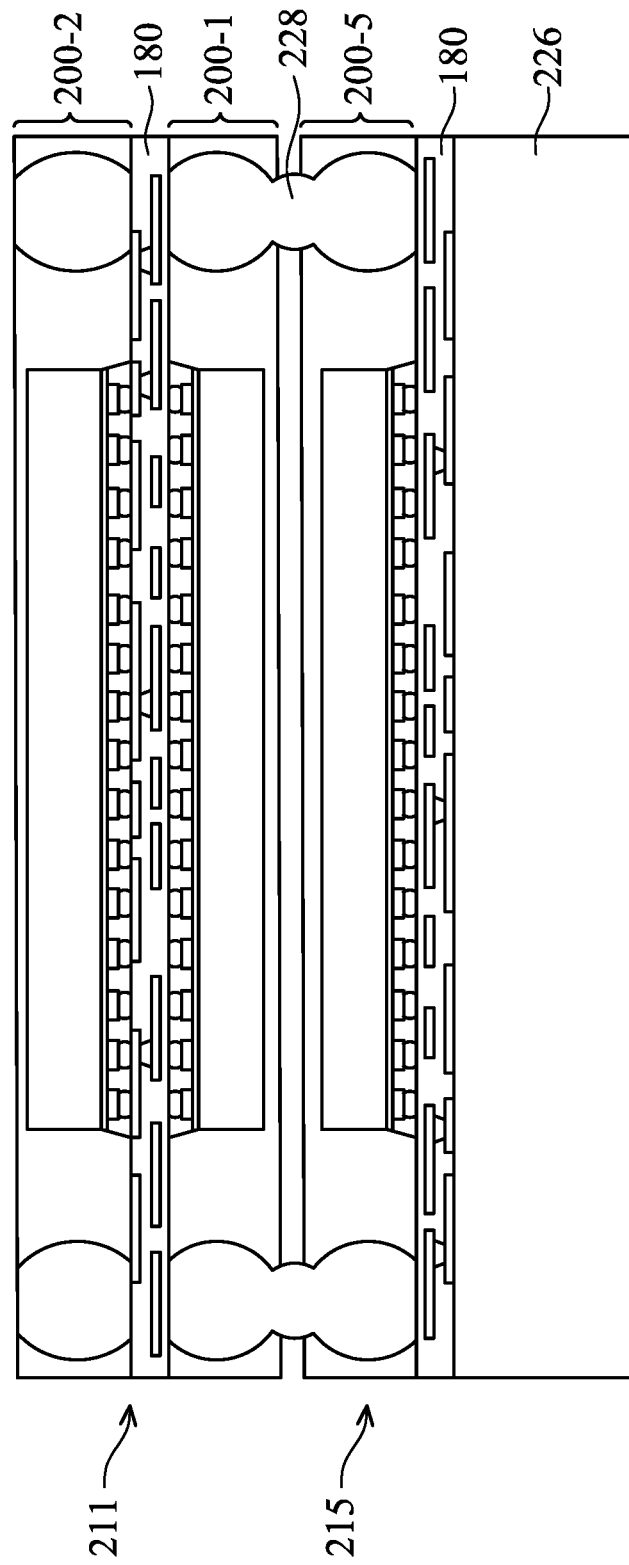

In FIG. 18, the semiconductor package 211 is placed over the semiconductor package 215 using, for example, a pick-and-place tool.

After the semiconductor package 211 is placed over the semiconductor package 215, the structures are mechanically and electrically bonded to together by way of the conductive connectors 228 and the conductive connectors 190.

In some embodiments, before bonding the conductive connectors 228 and the conductive connectors 190, the conductive connectors 228 and the conductive connectors 190 are coated with a flux (not shown), such as a no-clean flux. The conductive connectors 228 and the conductive connectors 190 may be dipped in the flux or the flux may be jetted onto the conductive connectors 228 and the conductive connectors 190.

In some embodiments, the conductive connectors 228 and the conductive connectors 190 may have an optional epoxy flux (not shown) formed thereon before they are reflowed with at least some of the epoxy portion of the epoxy flux remaining after the structures are attached together.

The bonding between the semiconductor packages 211 and 215 may be a solder bonding. In an embodiment, the conductive connectors 228 and the conductive connectors 190 are bonded to each other by a reflow process. During this reflow process, the conductive connectors 228 are in contact with the conductive connectors 190 to physically and electrically couple the semiconductor structures. After the bonding process, an intermetallic compound (IMC, not shown) may form at the interface of the conductive connectors 228 and the conductive connectors 190.

Figure 19:
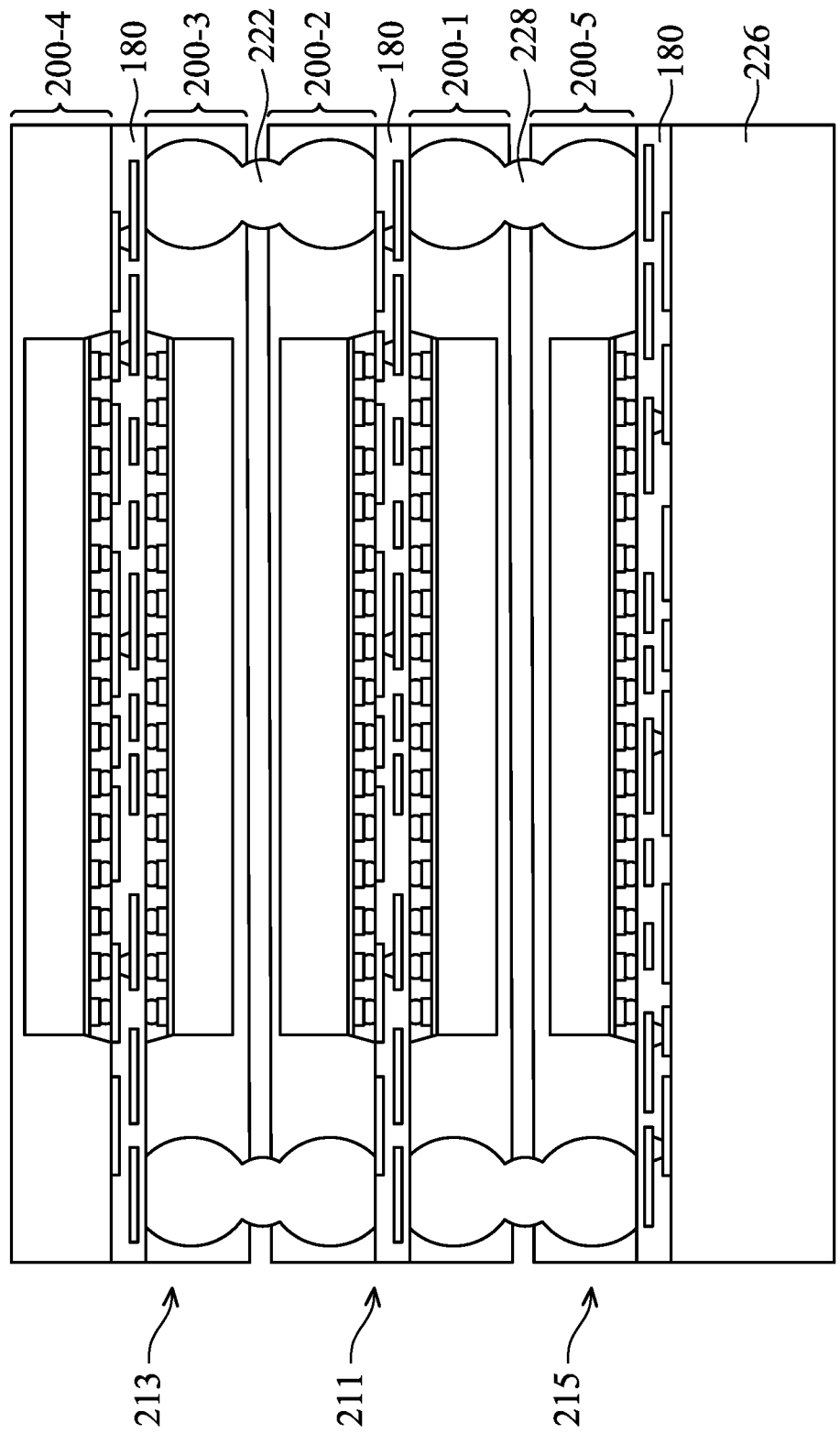

In FIG. 19, the semiconductor package 213 is placed over the structure of FIG. 18 using, for example, a pick-and-place tool.

After the semiconductor structures package 213 is placed over the semiconductor package 211, the structures are mechanically and electrically bonded to together by way of the conductive connectors 222 and the conductive connectors 190.

The bonding process of the conductive connectors 222 and 190 may be similar to the bonding process of the conductive connectors 228 and 190 described above and the description is not repeated herein.

Figure 20:
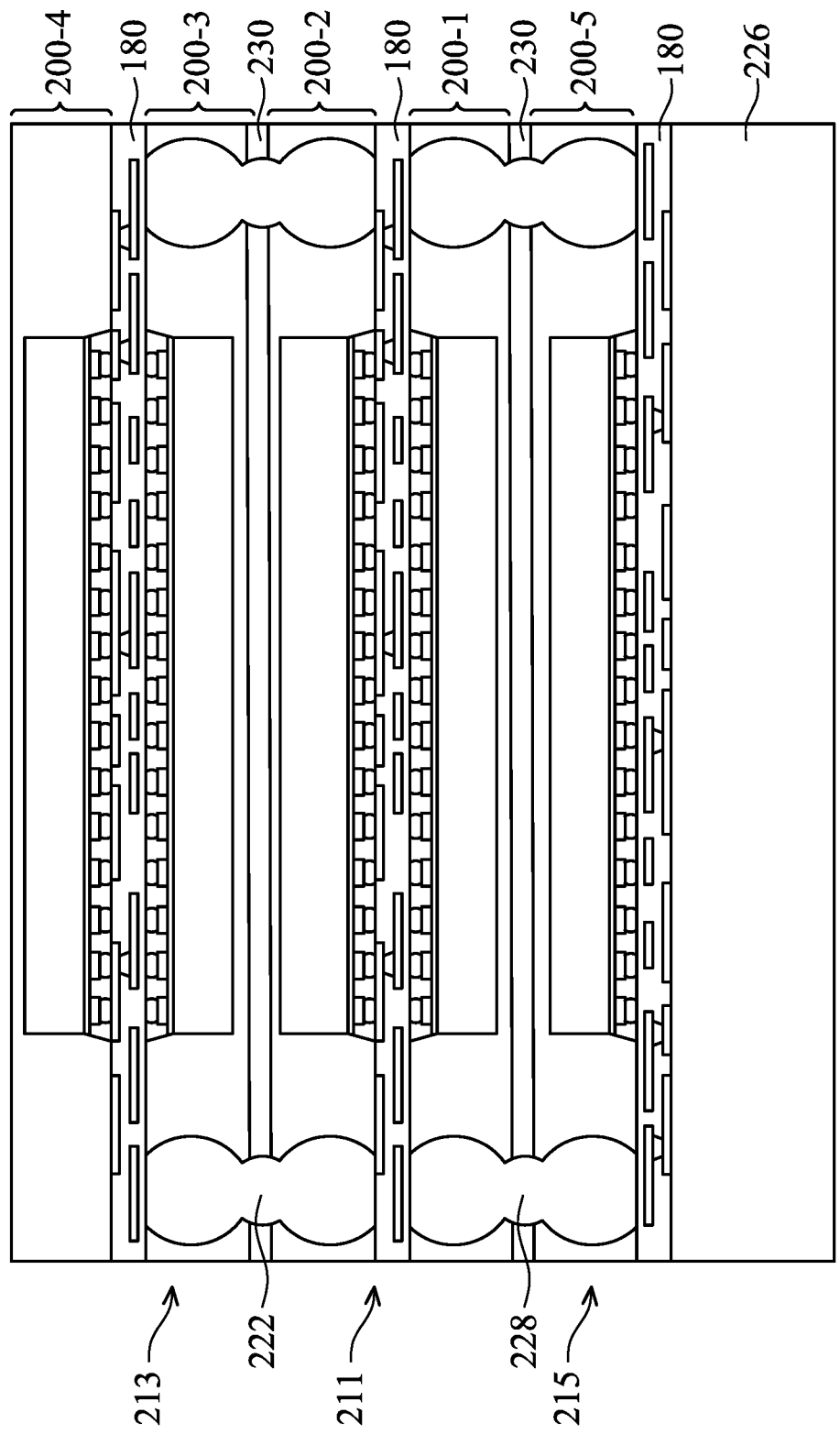

In FIG. 20, underfill 230 is formed surrounding the conductive connectors 222 and 228 and between the semiconductor packages 215, 211, and 213. The underfill 230 may reduce stress and protect the joints resulting from the reflowing of the conductive connectors 228 and 222. The underfill 230 may be similar to the underfill 192 described above the description is not repeated herein.

Figure 21:
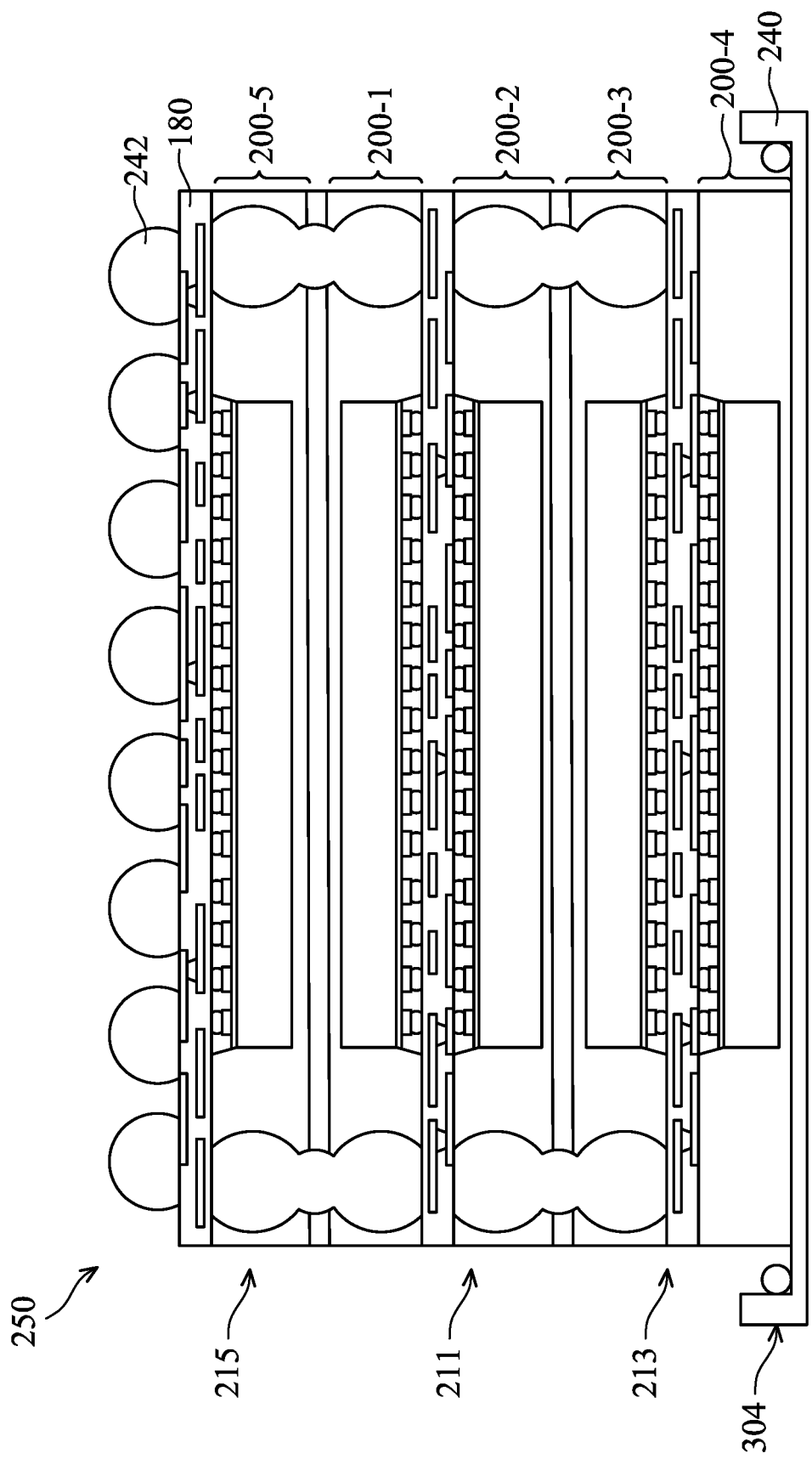

In FIG. 21, a carrier substrate de-bonding is performed to detach (de-bond) the carrier substrate 226 from the redistribution structure 180. In accordance with some embodiments, the de-bonding includes projecting a light such as a laser light or an UV light on the release layer (if present) so that the release layer decomposes under the heat of the light and the carrier substrate 196 can be removed. The detached structure is then flipped over and placed on a tape 240.

While the description above bonds the conductive connectors 222 and 228 separately, in some embodiments, the entire stack of semiconductor structures 200 may be bonded in a single bonding process.

Further in FIG. 21, conductive connectors 242 are formed over the redistribution structure 180 of semiconductor package 215 to form a semiconductor package 250. The semiconductor package 250 includes the semiconductor packages 211, 213, 215, and the conductive connectors 242. These conductive connectors 242 enable the semiconductor package 250 to be mechanically and electrically coupled to another package structure. The conducive connectors 242 may be similar to the conductive connectors 150 and 190 described above and the description is note repeated herein.

Figure 22:
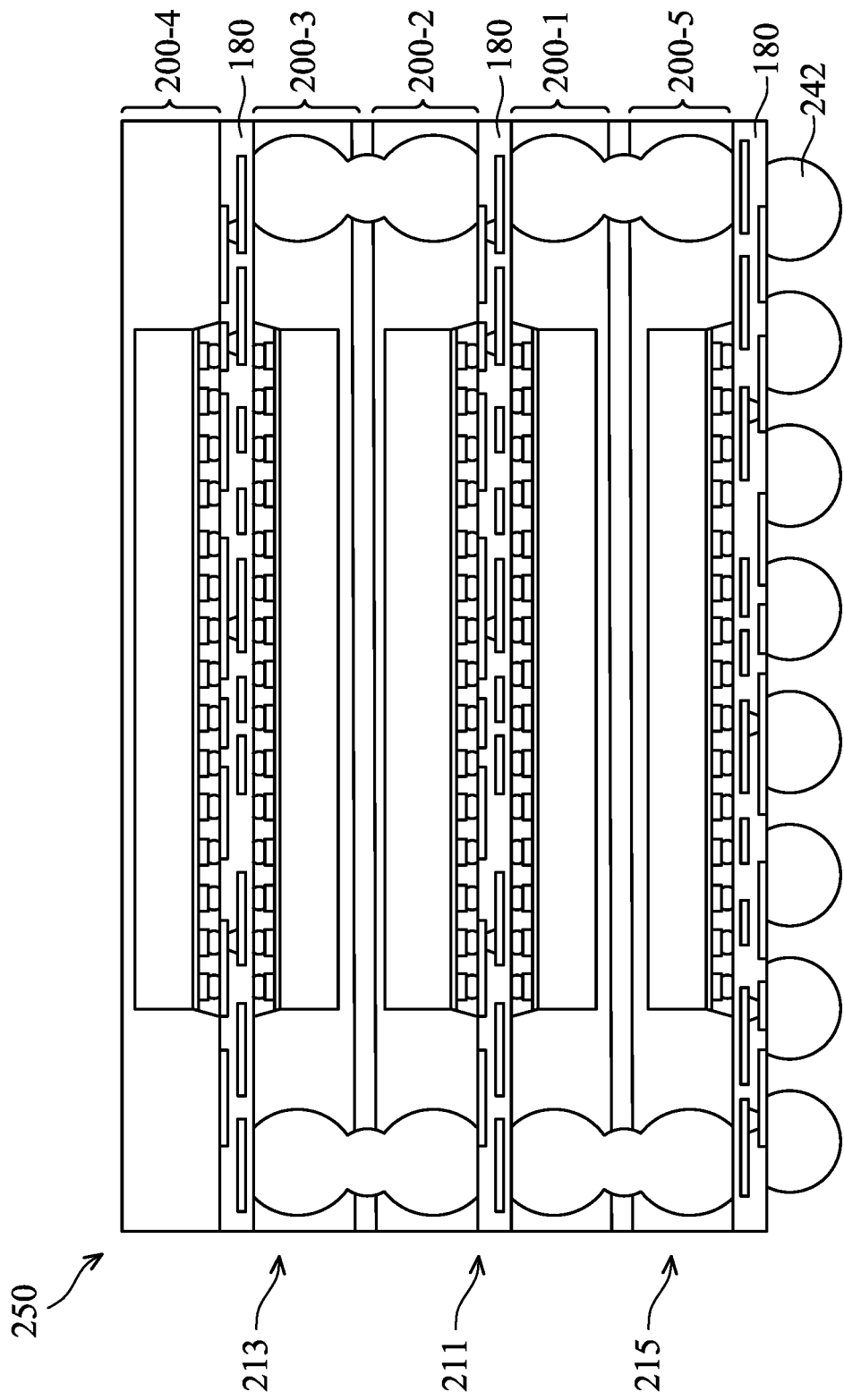

FIG. 22 illustrates the semiconductor package 250 removed from the tape 240 and flipped over. Although the semiconductor package 250 includes five stacked semiconductor structures 200 (e.g., 200-1 through 200-5), the semiconductor package 250 may have more or less than five semiconductor structures 200 based on design requirements for the semiconductor package. In a specific embodiment, each of the semiconductor devices 100 can have an effective capacitance of about 0.1 to about 100 microFarads (μF), such that the semiconductor packages 250 having seven stacked semiconductor devices 100 can have an effective capacitance of about 0.7 to about 700 μF.

Although each semiconductor structure 200 is illustrated as having a single semiconductor device 100, it should be appreciated that more devices 100 may be in each of the semiconductor structures 200. For example, each of the semiconductor structures may include two to four semiconductor devices 100.

FIGS. 23 through 35 illustrate cross-sectional views of intermediate steps during a process for a semiconductor package 350, in accordance with some embodiments. The embodiment in FIGS. 23 through 35 is similar to the embodiments illustrated in FIGS. 1 through 22 except that this embodiment the semiconductor package 350 include some through vias extending through the encapsulant. Details regarding this embodiment that are similar to those for the previously described embodiment will not be repeated herein.

Figure 23:
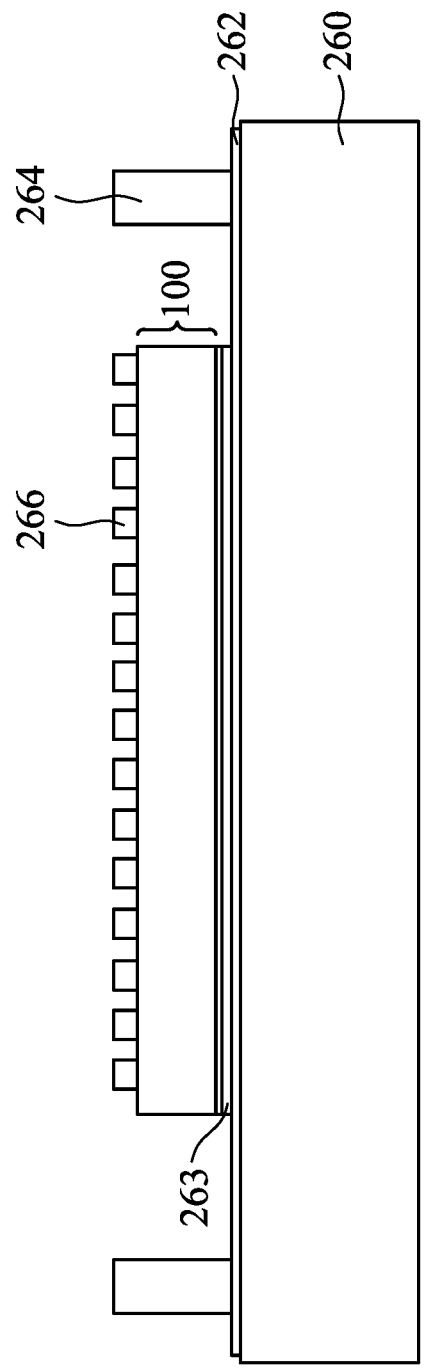
FIGS. 23-35 illustrate cross-sectional views of various intermediate stages of fabrication of a semiconductor package in accordance with some embodiments.

In FIG. 23, a carrier substrate 260 is provided, and a dielectric layer 262 is formed on the carrier substrate 260. The carrier substrate 260 may be a glass carrier substrate, a ceramic carrier substrate, or the like. The carrier substrate 260 may be a wafer, such that multiple packages can be formed on the carrier substrate 260 simultaneously.

The dielectric layer 262 may comprise one or more layers of non-photo-patternable insulating materials, one or more layers of photo-patternable insulating materials, a combination thereof, or the like. The non-photo-patternable insulating materials may comprise silicon nitride, silicon oxide, PSG, BSG, BPSG, a combination thereof, or the like, and may be formed using CVD, PVD, ALD, a spin-on coating process, a combination thereof, or the like. The photo-patternable insulating materials may comprise PBO, PI, BCB, a combination thereof, or the like, and may be formed using a spin-on coating process, or the like. The dielectric layer 262 may be formed over a release layer (not shown)

The dielectric layer 262 may be formed of a polymer-based material, which may be removed along with the carrier substrate 402 from overlying structures that will be formed in subsequent steps. In some embodiments, the dielectric layer 262 is an epoxy-based thermal-release material, which loses its adhesive property when heated, such as a light-to-heat-conversion (LTHC) release coating. In other embodiments, the release layer 404 may be an ultra-violet (UV) glue, which loses its adhesive property when exposed to UV light. The release layer 404 may be dispensed as a liquid and cured, may be a laminate film laminated onto the carrier substrate 260, or may be the like. A top surface of the release layer 404 may be leveled and may have a high degree of planarity.

Further in FIG. 23, a semiconductor device 100 is adhered to the release layer 404 by an adhesive 263 and through vias 264 are formed over the carrier substrate 260. The adhesive 263 may be any suitable adhesive, epoxy, die attach film (DAF), or the like.

In some embodiments, a back-side redistribution structure may be formed on the dielectric layer 262 before the semiconductor device 100 is are adhered such that the semiconductor device 100 is adhered to the back-side redistribution structure. In an embodiment, a back-side redistribution structure includes a one or more dielectric layers with one or more metallization patterns (sometimes referred to as redistribution layers or redistribution lines) within those dielectric layers. In some embodiments, a dielectric layer without metallization patterns is formed on the dielectric layer 262 before the semiconductor device 100 is adhered to the dielectric layer 262.

The through vias 264 (sometimes referred to as conductive pillars 264) are formed extending away from the dielectric layer 262 (or topmost dielectric layer of a back-side redistribution structure if present). As an example to form the through vias 264, a seed layer (not shown) is formed over the dielectric layer 262 (or topmost dielectric layer of a back-side redistribution structure if present). In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 264.

The semiconductor device 100 may be placed over the dielectric layer 262 (or topmost dielectric layer of a backside redistribution structure if present) using, for example, a pick-and-place tool. The semiconductor device 100 has conductive connectors 266 (sometimes referred to as die connectors 266) on an active side of the semiconductor device.

Figure 24:
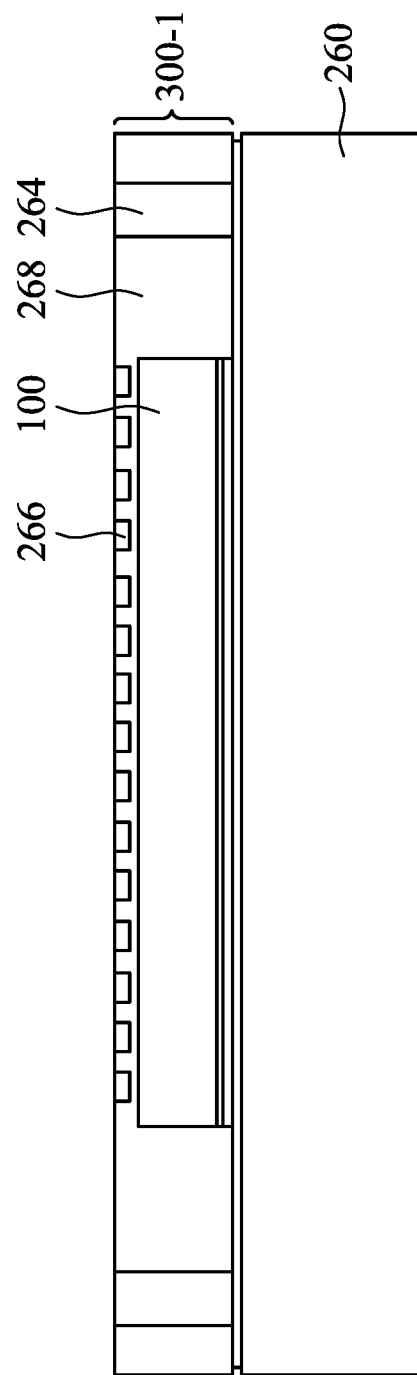

In FIG. 24, an encapsulant 268 is formed on and around the semiconductor device 100 and the through vias 264. After formation, the encapsulant 268 encapsulates the semiconductor device 100 and the through vias 264. The encapsulant 268 may be a molding compound, epoxy, or the like. The encapsulant 268 may be applied by compression molding, transfer molding, or the like, and may be formed over the carrier substrate 260 such that the semiconductor device 100 and the through vias 264 are buried or covered. The encapsulant 268 may be applied in liquid or semi-liquid form and subsequently cured.

The encapsulated semiconductor device 100 and the through vias 264 form a semiconductor structure 300-1 (sometimes referred to as a semiconductor layer 300-1).

In some embodiments, a planarization process is performed on the encapsulant 268 to expose the die connectors 266 and the through vias 264. Following the planarization process, top surfaces of the, the through vias 264 220, the die connectors 266, and the encapsulant 268 may be level with one another (e.g., coplanar). The planarization process may be, for example, a chemical-mechanical polish (CMP) process, a grinding process, an etch-back process, or the like. In some embodiments, the planarization process may be omitted, for example, if the die connectors 266 and the through vias 264 are already exposed.

The encapsulated semiconductor device 100 and the through vias 264 form a semiconductor structure 300-1 (sometimes referred to as a semiconductor layer 300-1).

Figure 25:
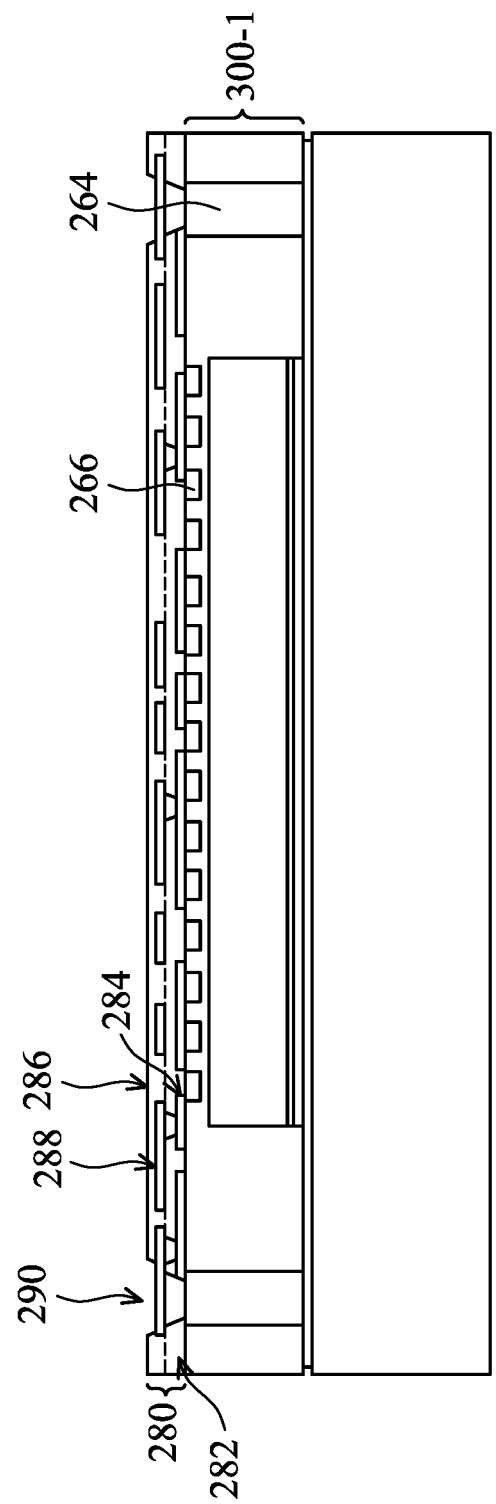

In FIG. 25, a redistribution structure 280 is formed over the semiconductor device 100, the through vias 264, and the encapsulant 268. The redistribution structure 280 includes dielectric 282 and 286 and metallization patterns 284 and 288. The metallization patterns may also be referred to as redistribution layers or redistribution lines. The metallization patterns 284 and 288 are electrically coupled to the die connectors 266 and the through vias 264 and provide for electrical connection to the die connectors 266 and the through vias 264. The redistribution structure 280 is shown as an example having two layers of metallization patterns and two dielectric layers. More or fewer dielectric layers and metallization patterns may be formed in the redistribution structure 180. If fewer dielectric layers and metallization patterns are to be formed, steps and process discussed below may be omitted. If more dielectric layers and metallization patterns are to be formed, steps and processes discussed below may be repeated. The redistribution structure 280 may be similar to the redistribution structure 180 described above and the description is not repeated herein.

Further in FIG. 25, openings 290 are formed in at least the dielectric layer 286 of the redistribution structure 280 to expose a portion of the metallization patterns 284, 288, or the through vias 264. The openings 290 may be formed, for example, using laser drilling, etching, or the like.

Figure 26:
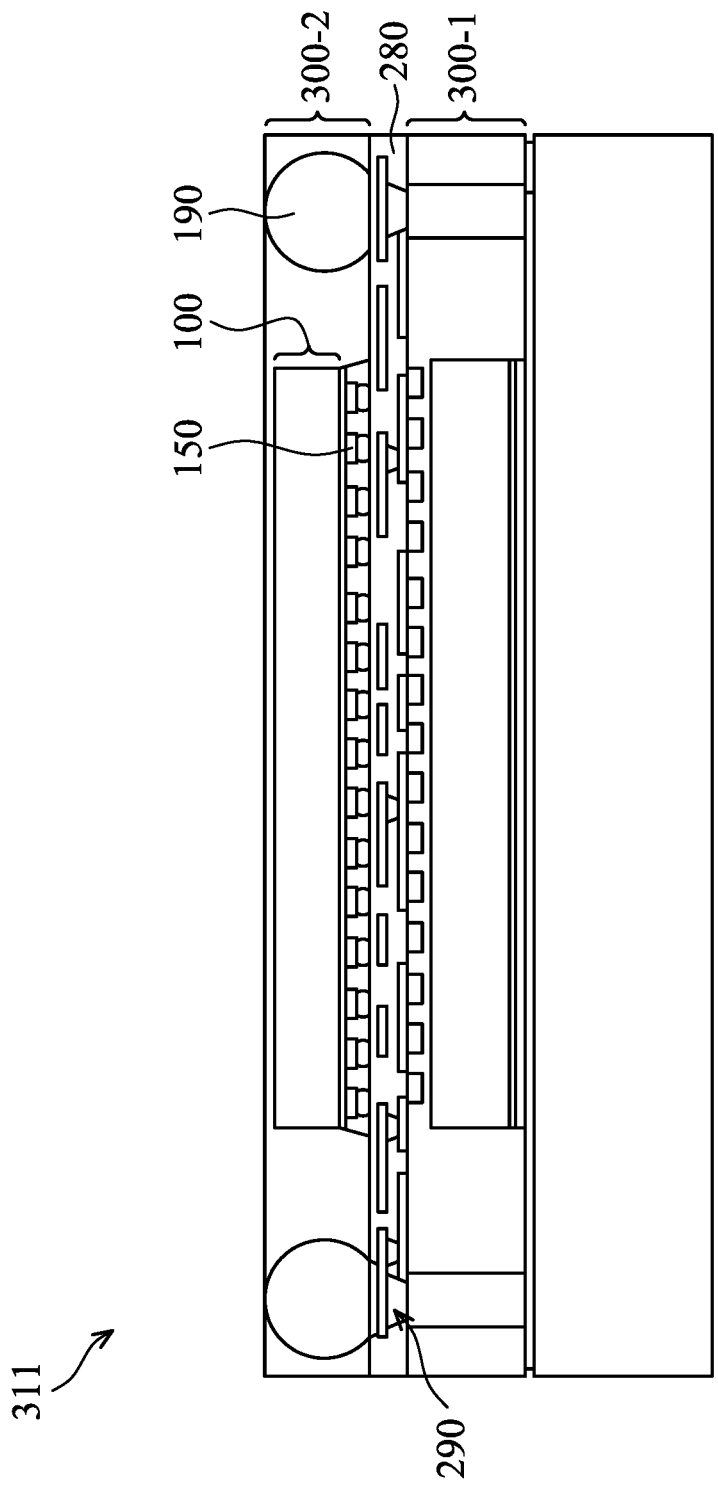

In FIG. 26, a semiconductor structure 300-2 is formed over the semiconductor structure 300-1 to form a semiconductor package 311. The semiconductor package 311 comprises the semiconductor structure 300-2, the redistribution structure 280, and the semiconductor structure 300-1. The semiconductor structure 300-2 includes encapsulated semiconductor device 100 and conductive connectors 190. The semiconductor device 100 and conductive connectors 190 of the semiconductor structure 300-2 are electrically coupled to the redistribution structure 280 and the through vias 264. The semiconductor structure 300-1 may be similar to the semiconductor structure 200-1 described above and the description is not repeated herein.

Figure 27:
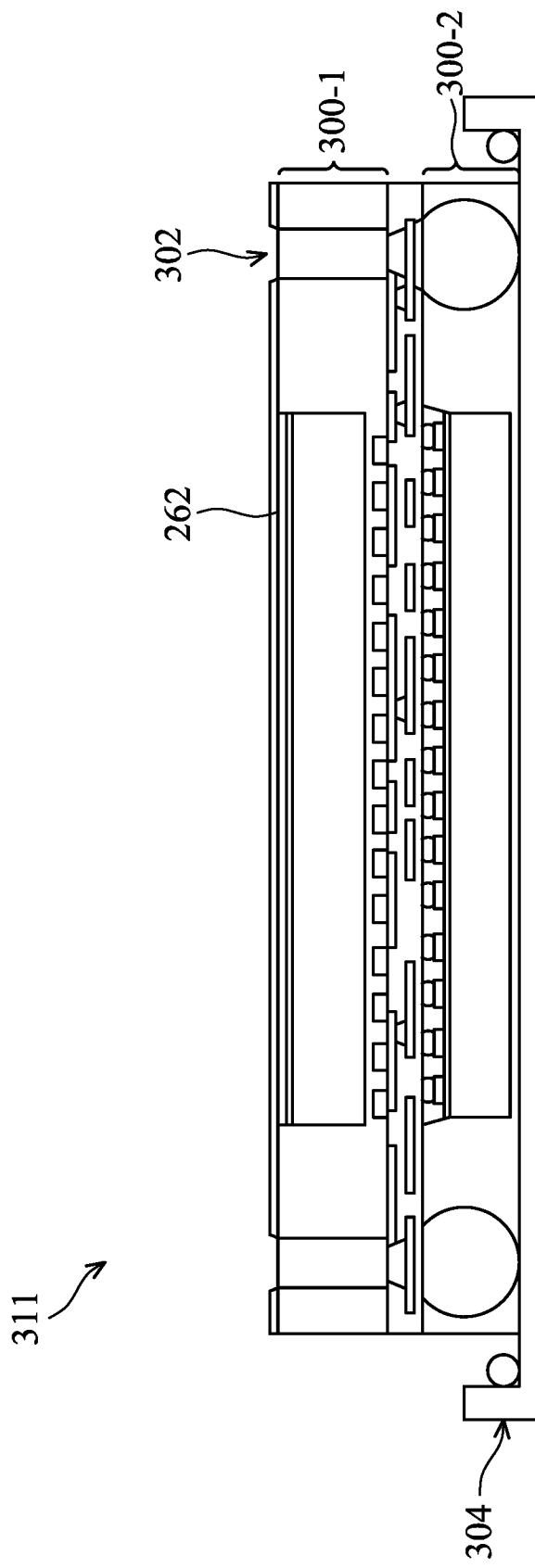

In FIG. 27, a carrier substrate de-bonding is performed to detach (de-bond) the carrier substrate 260 from semiconductor package 311. In accordance with some embodiments, the de-bonding includes projecting a light such as a laser light or an UV light on the release layer (if present) so that the release layer decomposes under the heat of the light and the carrier substrate 170 can be removed. The detached structure is then flipped over and placed on tape 304.

Further in FIG. 27, openings 302 are formed in the dielectric layer 262 to expose portions of the through vias 264. The openings 302 may be formed, for example, using laser drilling, etching, or the like.

Figure 28:
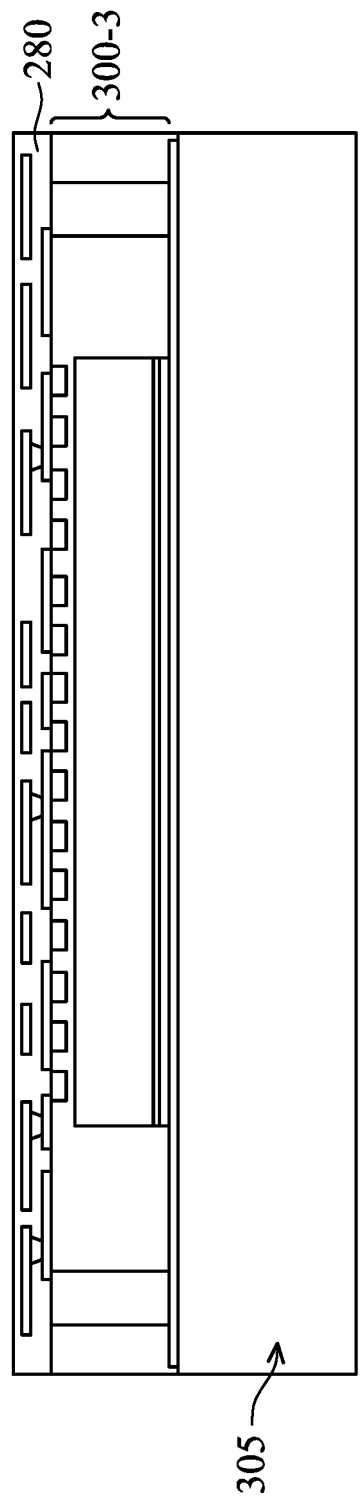

In FIG. 28, a semiconductor structure 300-3 and a redistribution structure 280 are formed over a carrier substrate 305. The semiconductor structure 300-3 and redistribution structure 280 is similar to the semiconductor structure 300-1 and redistribution structure 280 of FIG. 25 described above and the description is not repeated herein.

Figure 29:
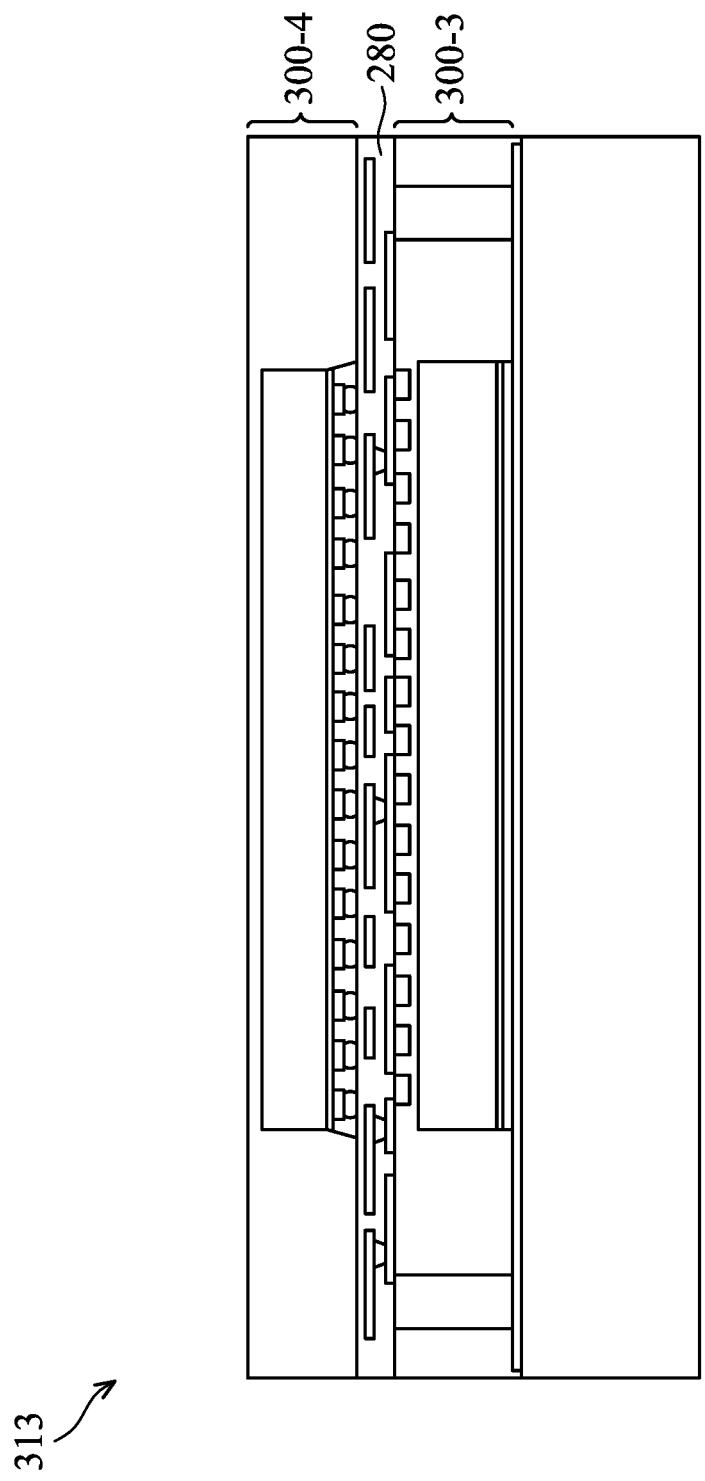

In FIG. 29, a semiconductor structure 300-4 is formed over the redistribution structure of FIG. 28 to form a semiconductor package 313. The semiconductor package 313 comprises the semiconductor structure 300-3, the redistribution structure 280, and the semiconductor structure 300-4. The semiconductor structure 300-4 is similar to the semiconductor structure 300-2 (except without conductive connectors 190) of FIG. 26 described above and the description is not repeated herein.

Figure 30:
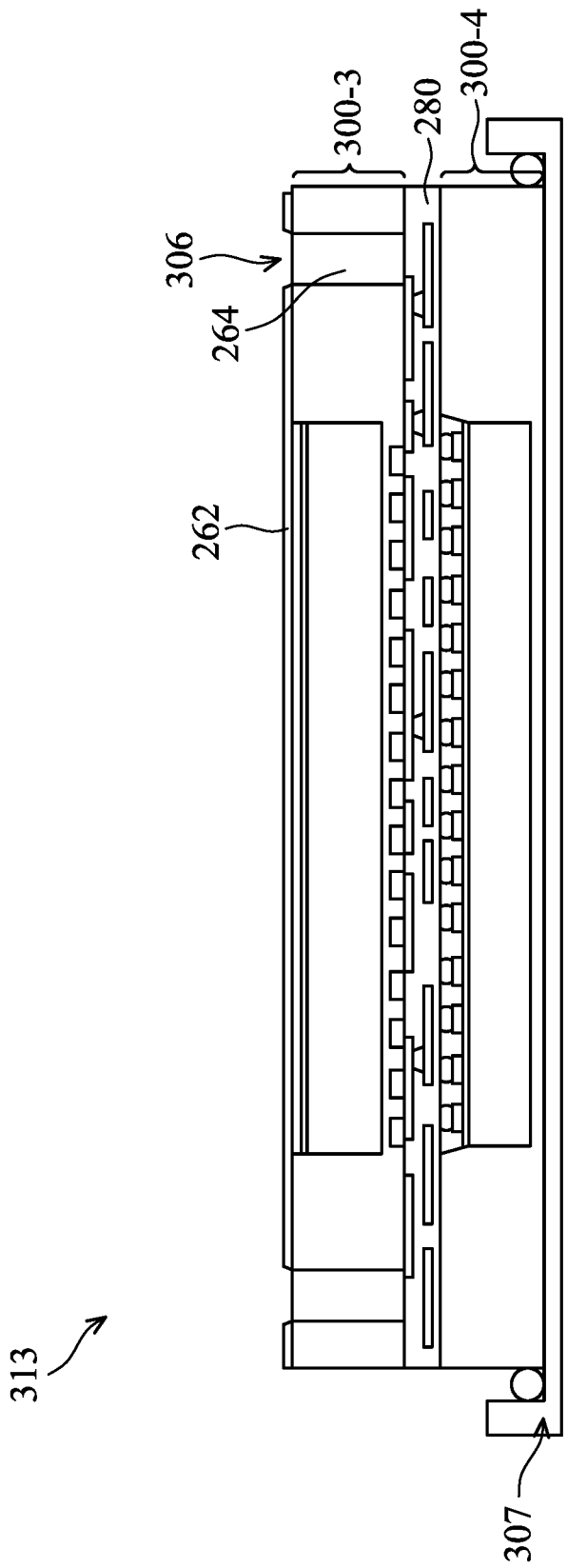

In FIG. 30, a carrier substrate de-bonding is performed to detach (de-bond) the carrier substrate 305 from semiconductor package 313. In accordance with some embodiments, the de-bonding includes projecting a light such as a laser light or an UV light on the release layer (if present) so that the release layer decomposes under the heat of the light and the carrier substrate 305 can be removed. The detached structure is then flipped over and placed on tape 307.

Further in FIG. 30, openings 306 are formed in the dielectric layer 262 of semiconductor package 313 to expose portions of the through vias 264. The openings 306 may be formed, for example, using laser drilling, etching, or the like.

Figure 31:
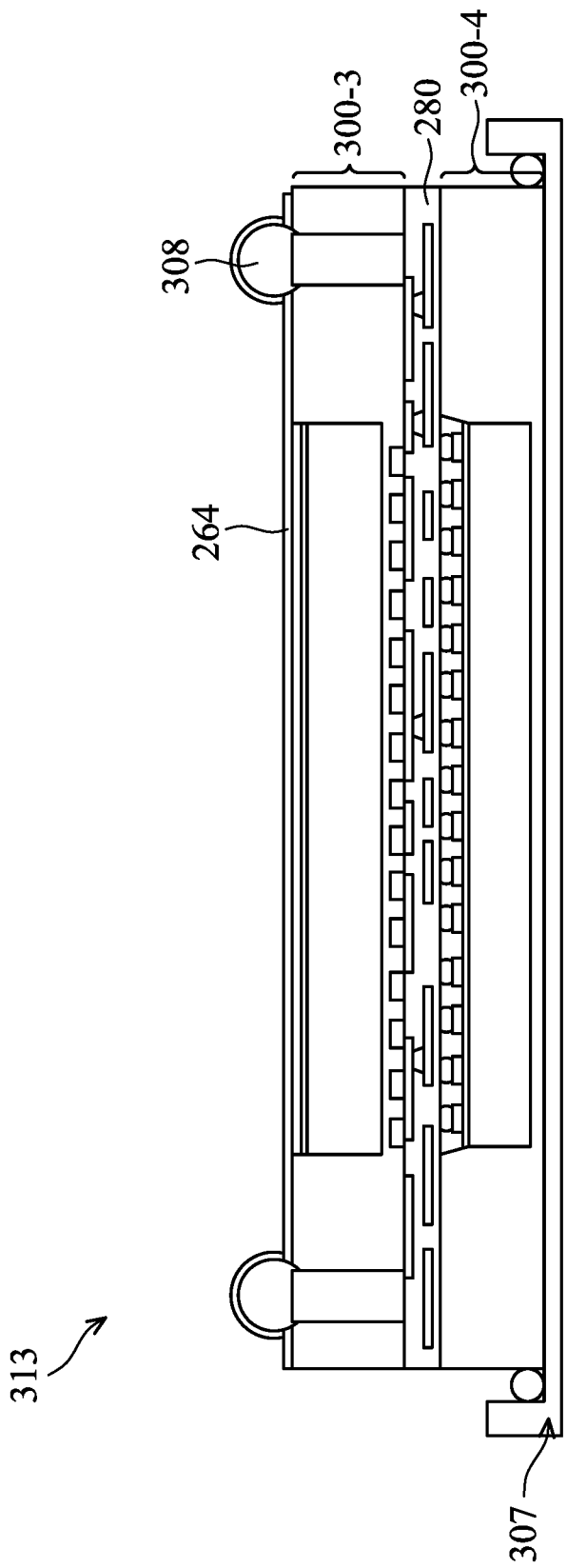

In FIG. 31, conductive connectors 308 are formed on the through vias 264 of the semiconductor package 313. The conductive connectors 308 will allow the semiconductor package 313 to be electrically and mechanically coupled to another semiconductor structure. In some embodiments, the conductive connectors 308 are formed by forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 308 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 32:
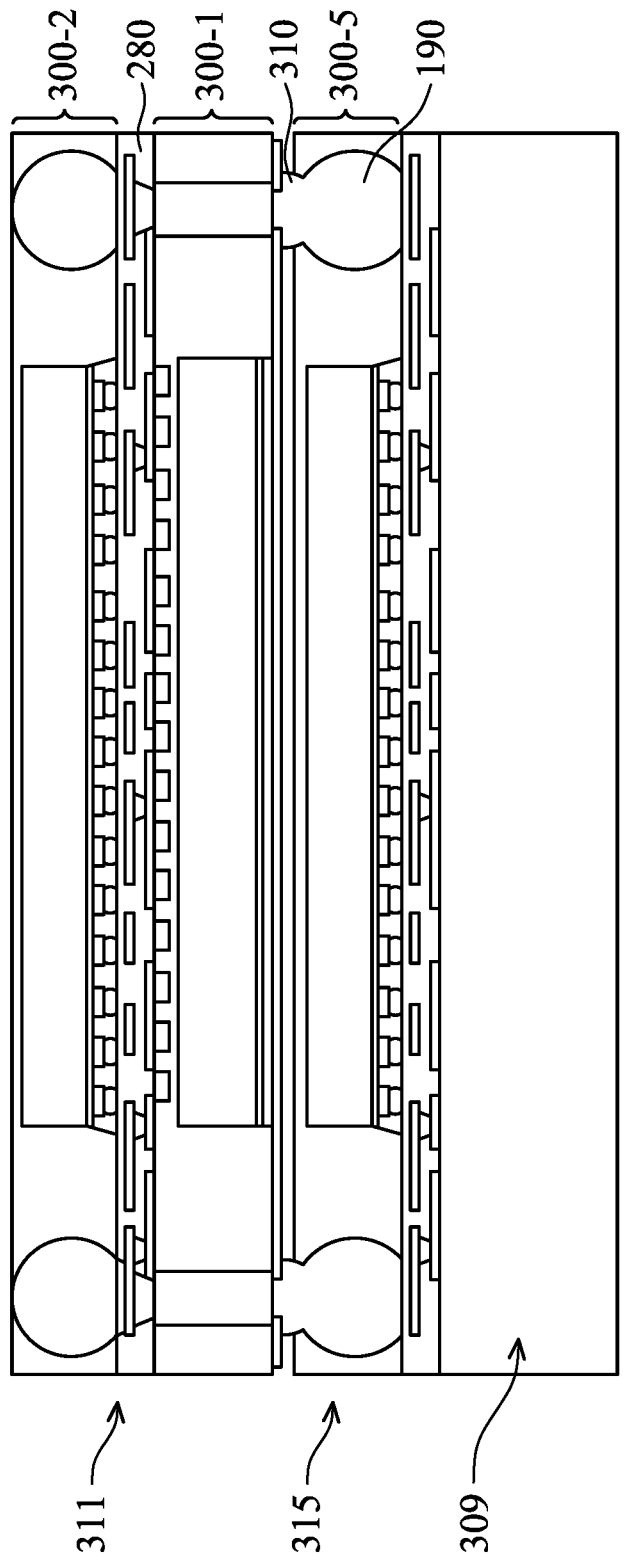

In FIG. 32, the semiconductor package 311 is placed over a semiconductor package 315 (which is on a carrier substrate 309) using, for example, a pick-and-place tool. The semiconductor package 315 is similar to the semiconductor package 215 described above and the description is not repeated herein.

After the semiconductor structures package 313 is placed over the semiconductor package 315, the structures are mechanically and electrically bonded to together by way of conductive connectors 310, the conductive connectors 190, and the through vias 264. The conductive connectors 310 may be similar to the conductive connectors 308 described above and the description is not repeated herein.

The bonding process of the conductive connectors 310, the conductive connectors 190, and the through vias 264 may be similar to the bonding process of the conductive connectors 222, 228, and 190 described above and the description is not repeated herein.

Figure 33:
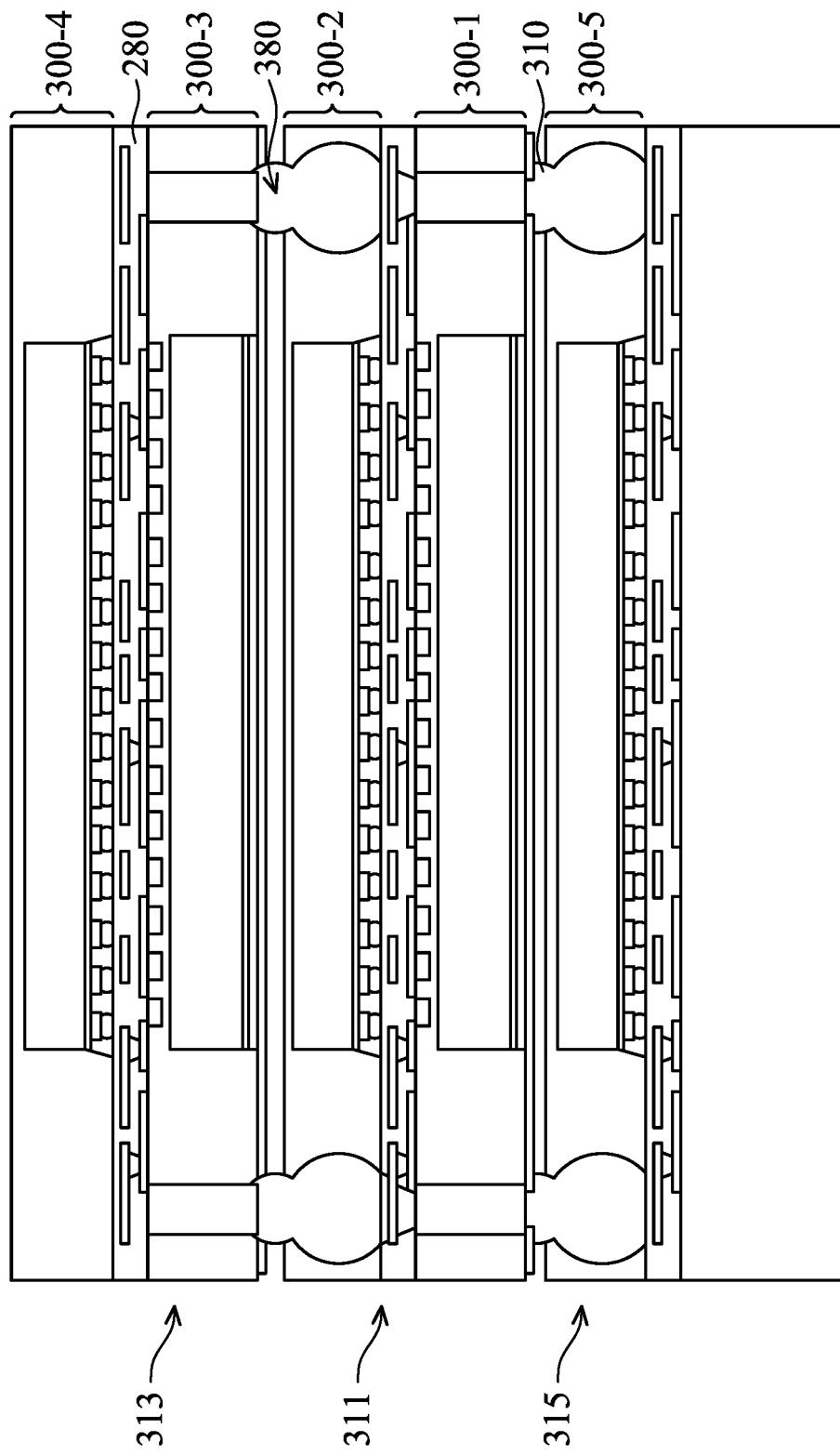

In FIG. 33, the semiconductor package 313 is placed over the structure of FIG. 32 using, for example, a pick-and-place tool.

After the semiconductor package 313 is placed over the semiconductor package 311, the structures are mechanically and electrically bonded to together by way of the conductive connectors 308, the conductive connectors 190, and the through vias 264.

The bonding process of the conductive connectors the conductive connectors 308, the conductive connectors 190, and the through vias 264 may be similar to the bonding process of the conductive connectors 222, 228, and 190 described above and the description is not repeated herein.

Figure 34:
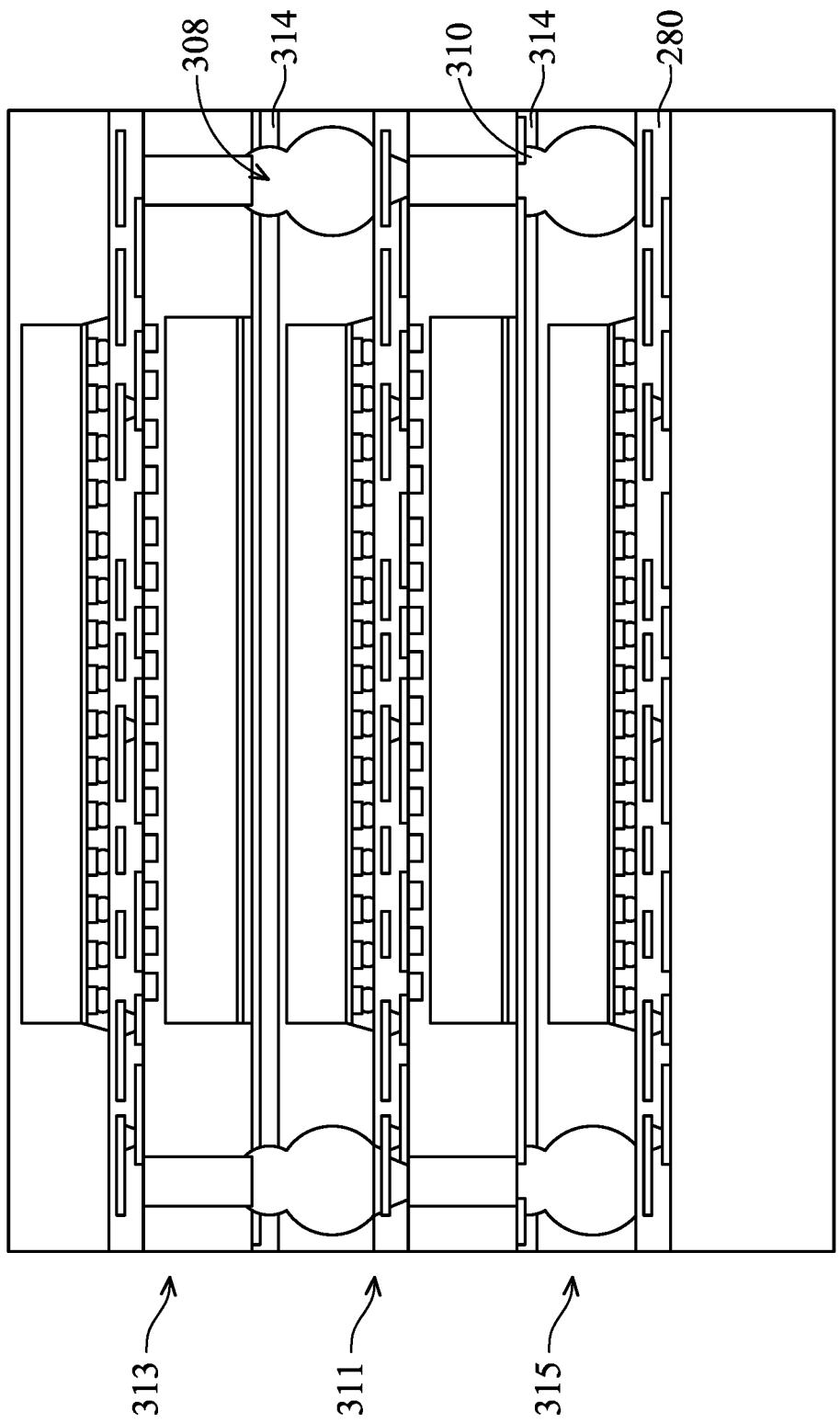

In FIG. 34, underfill 314 is formed surrounding the conductive connectors 308 and 310 and between the semiconductor packages 315, 311, and 313. The underfill 314 may reduce stress and protect the joints resulting from the reflowing of the conductive connectors 308 and 310. The underfill 314 may be similar to the underfill 192 described above the description is not repeated herein.

While the description above bonds the conductive connectors 308 and 310 separately, in some embodiments, the entire stack of semiconductor structures 300 may be bonded in a single bonding process.

Figure 35:
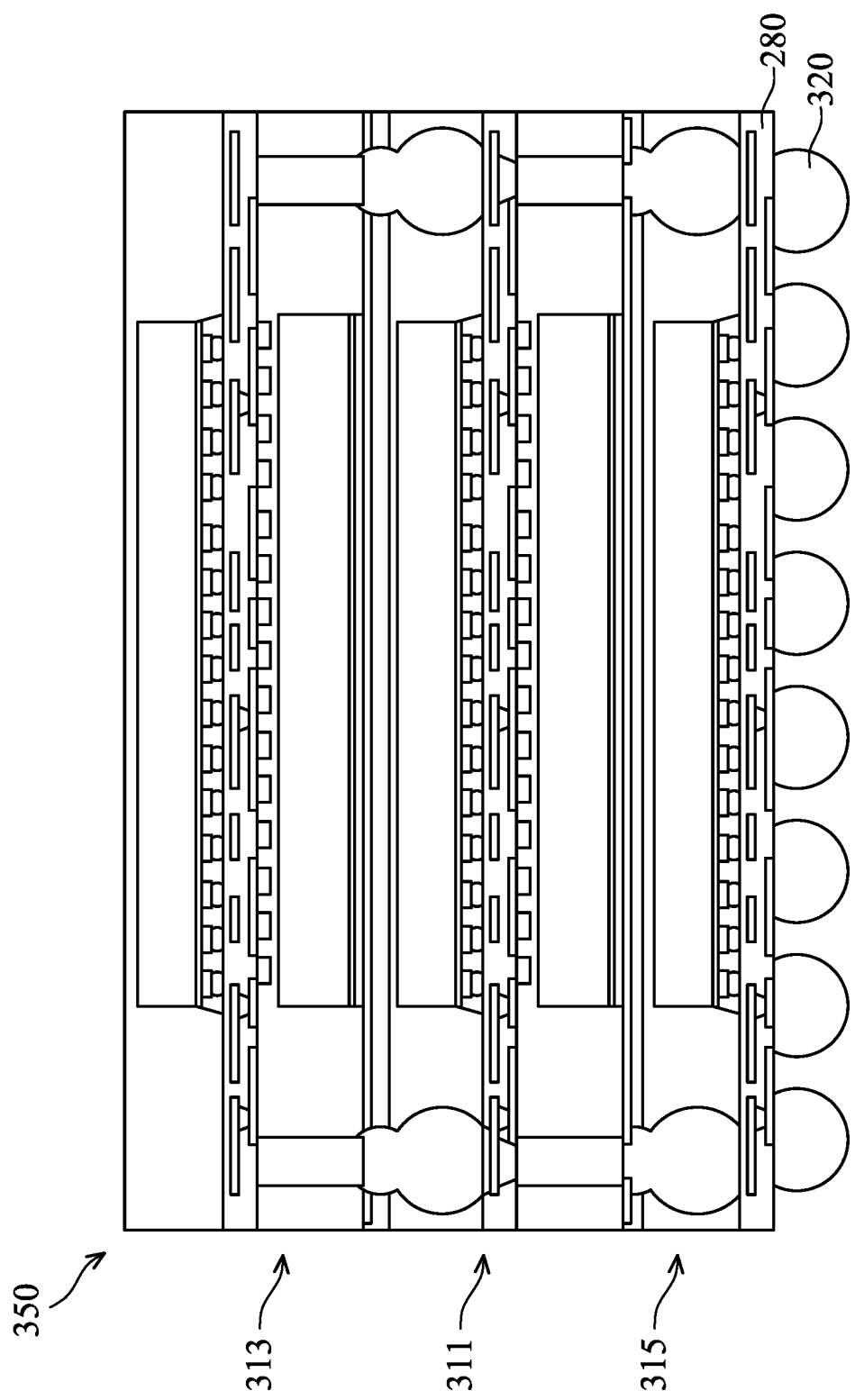

In FIG. 35, a carrier substrate de-bonding is performed to detach (de-bond) the carrier substrate 309 from the redistribution structure 280. In accordance with some embodiments, the de-bonding includes projecting a light such as a laser light or an UV light on the release layer (if present) so that the release layer decomposes under the heat of the light and the carrier substrate 309 can be removed.

Further in FIG. 35, conductive connectors 320 are formed on the redistribution structure 280 of semiconductor package 315 to form a semiconductor package 350. The semiconductor package 350 includes the semiconductor packages 311, 313, 315, and the conductive connectors 320. These conductive connectors 320 enable the semiconductor package 350 to be mechanically and electrically coupled to another package structure. The conducive connectors 320 may be similar to the conductive connectors 150, 190, and 242 described above and the description is note repeated herein.

Although the semiconductor package 350 includes five stacked semiconductor structures 300 (e.g., 300-1 through 300-5), the semiconductor package 350 may have more or less than five semiconductor structures 300 based on design requirements for the semiconductor package. In a specific embodiment, each of the semiconductor devices 100 can have an effective capacitance of about 0.1 to about 100 microFarads (µF), such that the semiconductor packages 350 having seven stacked semiconductor devices 100 can have an effective capacitance of about 0.7 to about 700 µF.

Although each semiconductor structure 300 is illustrated as having a single semiconductor device 100, it should be appreciated that more devices 100 may be in each of the semiconductor structures 300. For example, each of the semiconductor structures may include two to four semiconductor devices 100.

FIGS. 36 through 44 illustrate cross-sectional views of intermediate steps during a process for forming a package 700, in accordance with some embodiments. Details regarding this embodiment that are similar to those for the previously described embodiments will not be repeated herein.

Figure 36:
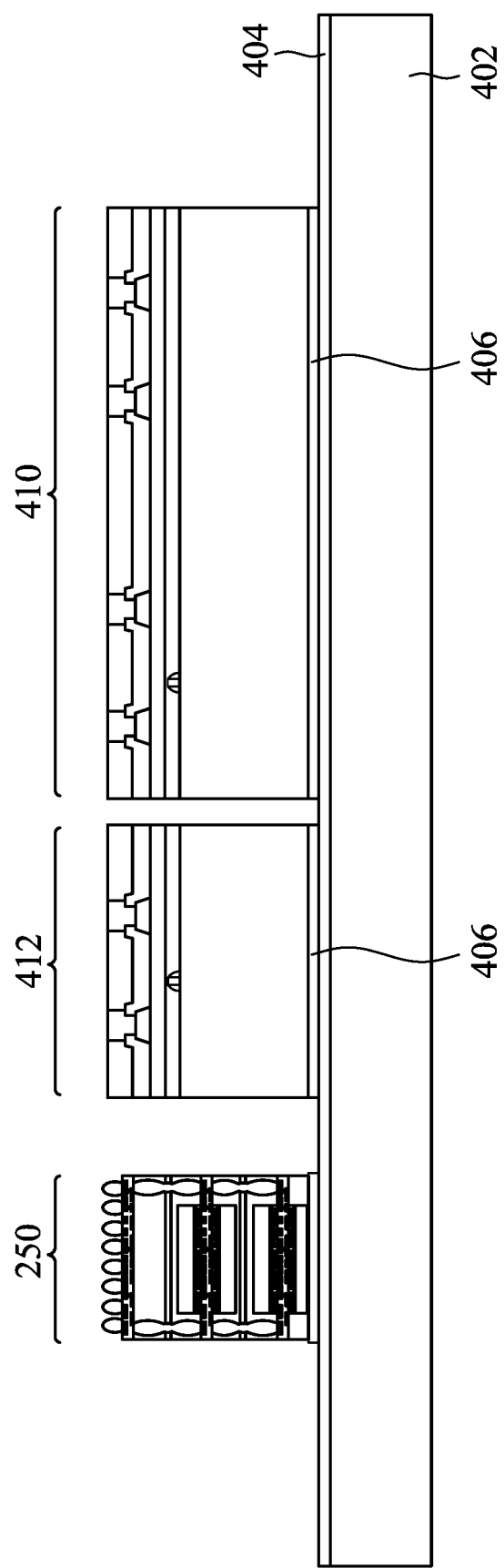
FIGS. 36-44 illustrate cross-sectional views of various intermediate stages of fabrication of a package in accordance with some embodiments.

FIGS. 36 through 43 illustrate cross-sectional views of intermediate steps during a process for forming a semiconductor package 400, in accordance with some embodiments. In FIG. 36, a carrier substrate 402 is provided, and a release layer 404 is formed on the carrier substrate 402. The carrier substrate 402 may be a glass carrier substrate, a ceramic carrier substrate, or the like. The carrier substrate 402 may be a wafer, such that multiple packages can be formed on the carrier substrate 402 simultaneously.

The release layer 404 may be formed of a polymer-based material, which may be removed along with the carrier substrate 402 from overlying structures that will be formed in subsequent steps. In some embodiments, the release layer 404 is an epoxy-based thermal-release material, which loses its adhesive property when heated, such as a light-to-heat-conversion (LTHC) release coating. In other embodiments, the release layer 404 may be an ultra-violet (UV) glue, which loses its adhesive property when exposed to UV light. The release layer 404 may be dispensed as a liquid and cured, may be a laminate film laminated onto the carrier substrate 402, or may be the like. A top surface of the release layer 404 may be leveled and may have a high degree of planarity.

In FIG. 36, modules 410 and 412 (sometimes referred to as dies 410 and 412) and semiconductor package 250 are adhered to the release layer 404 by an adhesive 406. Although two modules 410 and 412 are illustrated as being adhered, it should be appreciated that more or less module 410 and/or 412 may be adhered to the release layer 404. For example, three or four module 410 and/or 412 may be adhered to the release layer 404. In some embodiments, the module 410 and/or 412 are integrated circuit dies and may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS)

dies, signal processing dies (e.g., digital signal processing (DSP) die), front-end dies (e.g., analog front-end (AFE) dies), the like, or a combination thereof. In some embodiments, the module 410 and/or 412 may be passive devices, such as integrated passive devices (IPDs) or discrete passive devices. In some embodiments, the modules 410 and/or 412 may be power supply modules, memory modules, voltage regulator modules, (IPD) modules, the like, or a combination thereof. In an embodiment, the module 410 is a system-on-a-chip (SoC) and the module 412 is a high bandwidth memory module. Also, in some embodiments, the module 410 and/or 412 may be different sizes (e.g., different heights and/or surface areas), and in other embodiments, the module 410 and/or 412 may be the same size (e.g., same heights and/or surface areas). The module 410 and/or 412 are described in greater detail below with respect to FIG. 37.

In some embodiments, a back-side redistribution structure may be formed on the release layer 404 before the modules 410 and 412 and semiconductor package 250 are adhered such that the modules 410 and 412 and semiconductor package 250 are adhered to the back-side redistribution structure. In an embodiment, a back-side redistribution structure includes a one or more dielectric layers with one or more metallization patterns (sometimes referred to as redistribution layers or redistribution lines) within those dielectric layers. In some embodiments, a dielectric layer without metallization patterns is formed on the release layer 404 before the modules 410 and 412 and semiconductor package 250 are adhered to the dielectric layer.

Figure 37:
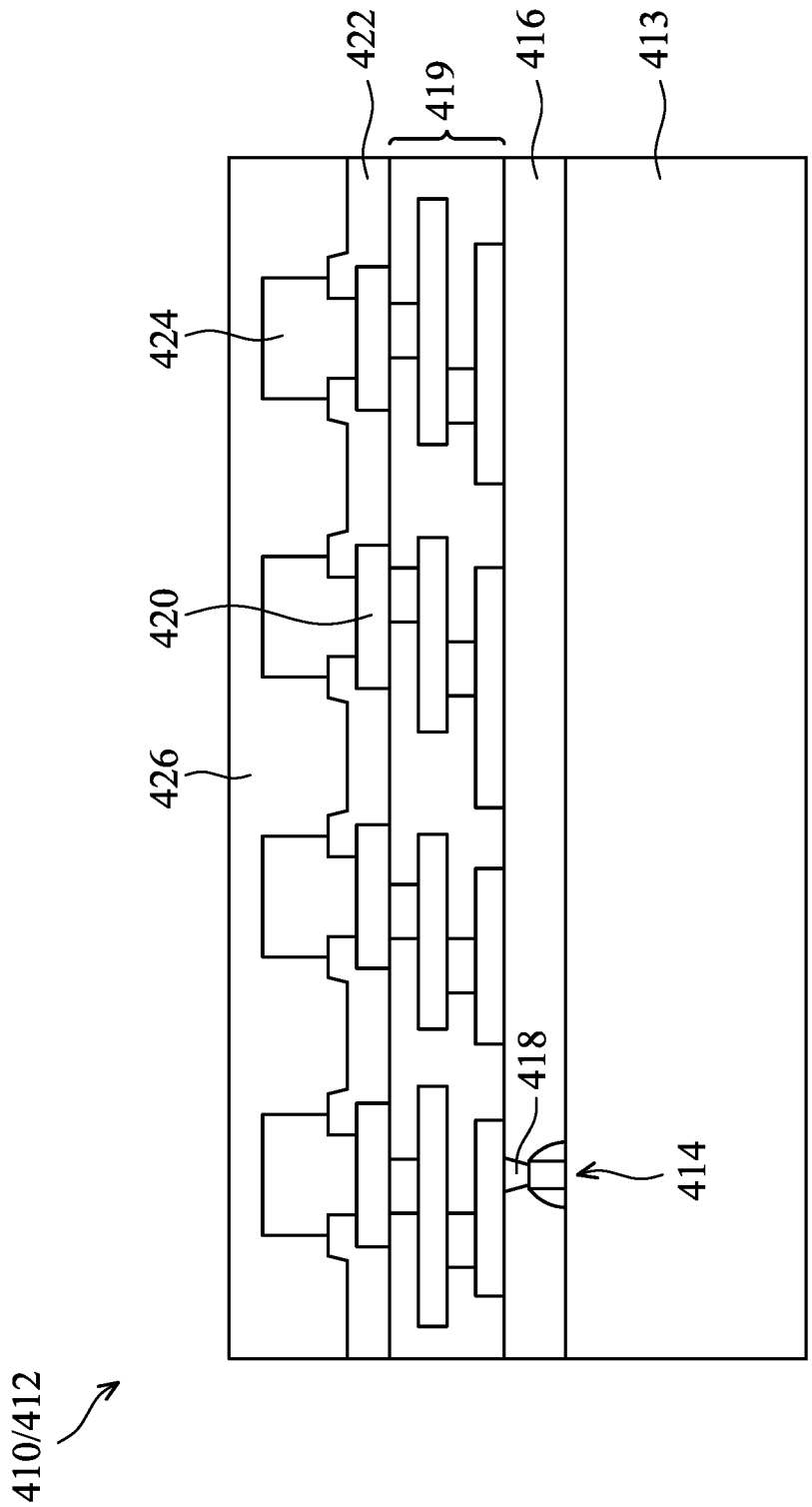

FIG. 37 illustrates one of the modules 410/412 in accordance with some embodiments. The module 410/412 will be packaged in subsequent processing to form an integrated circuit package. The modules 410/412 may be formed in a wafer, which may include different device regions that are singulated in subsequent steps to form a plurality of active device dies. The modules 410/412 may be processed according to applicable manufacturing processes to form integrated circuits. For example, the modules 410/412 includes a semiconductor substrate 413, such as silicon, doped or undoped, or an active layer of a semiconductor-on-insulator (SOI) substrate. The semiconductor substrate 413 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 413 has an active surface (e.g., the surface facing upwards in FIG. 37), sometimes called a front-side, and an inactive surface (e.g., the surface facing downwards in FIG. 37), sometimes called a back-side.

Devices 414 may be formed at the front side of the semiconductor substrate 413. The devices 414 may be active devices (e.g., transistors, diodes, or the like), capacitors, resistors, or the like. An inter-layer dielectric (ILD) 416 is formed over the front side of the semiconductor substrate 413. The ILD 416 surrounds and may cover the devices 414. The ILD 416 may include one or more dielectric layers formed of materials such as phosphosilicate glass (PSG), borosilicate glass (BSG), boron-doped phosphosilicate glass (BPSG), undoped silicate glass (USG), or the like.

Conductive plugs 418 extend through the ILD 416 to electrically and physically couple the devices 414. For example, when the devices 414 are transistors, the conductive plugs 418 may couple the gates and source/drain regions of the transistors. The conductive plugs 418 may be formed of tungsten, cobalt, nickel, copper, silver, gold, aluminum, the like, or combinations thereof. An interconnect structure 419 is included over the ILD 416 and the conductive plugs 418. The interconnect structure 419 interconnects the devices 414 to form an integrated circuit. The interconnect structure 419 may be formed by, for example, metallization patterns in dielectric layers on the ILD 416. The metallization patterns include metal lines and vias formed in one or more low-k dielectric layers. The metallization patterns of the interconnect structure 419 are electrically coupled to the devices 414 by the conductive plugs 418.

The module 410/412 further includes pads 420, such as aluminum pads, to which external connections are made. The pads 420 are on the active side of the module 410/412, such as in and/or on the interconnect structure 419. One or more passivation films 422 are on the module 410/412, such as on portions of the interconnect structure 419 and the pads 420. Openings extend through the passivation films 422 to the pads 420. Die connectors 424, such as conductive pillars (formed of a metal such as copper, for example), extend through the openings in the passivation films 422 and are physically and electrically coupled to respective ones of the pads 420. The die connectors 424 may be formed by, for example, plating, or the like. The die connectors 424 electrically couple the respective integrated circuits of the module 410/412.

Optionally, solder regions (e.g., solder balls or solder bumps) may be disposed on the pads 420. The solder balls may be used to perform chip probe (CP) testing on the module 410/412. The CP testing may be performed on the module 410/412 to ascertain whether the module 410/412 is a known good die (KGD). Thus, only modules 410/412, which are KGDs, undergo subsequent processing are packaged, and dies, which fail the CP testing, are not packaged. After testing, the solder regions may be removed in subsequent processing steps.

A dielectric layer 426 may be on the front side of the module 410/412, such as on the passivation films 422 and the die connectors 424. The dielectric layer 426 laterally encapsulates the die connectors 424, and the dielectric layer 426 is laterally coterminous with the module 410/412. Initially, the dielectric layer 426 may bury the die connectors 424, such that a topmost surface of the dielectric layer 426 is above topmost surfaces of the die connectors 424. In some embodiments where solder regions are disposed on the die connectors 424, the dielectric layer 426 may bury the solder regions as well. Alternatively, the solder regions may be removed prior to forming the dielectric layer 426.

The dielectric layer 426 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 426 may be formed, for example, by spin coating, lamination, chemical vapor deposition (CVD), or the like. In some embodiments, the die connectors 424 are exposed through the dielectric layer 426 during formation of the module 410/412. In some embodiments, the die connectors 424 remain buried and are exposed during a subsequent process for packaging the module 410/412. Exposing the die connectors 424 may remove any solder regions that may be present on the die connectors 424.

In some embodiments, the module 410/412 is a stacked device that includes multiple semiconductor substrates 413. For example, the module 410/412 may be a memory device such as a hybrid memory cube (HMC) module, a high bandwidth memory (HBM) module, or the like that includes multiple memory dies. In such embodiments, the module 410/412 includes multiple semiconductor substrates 413 interconnected by through-substrate vias (TSVs). Each of the semiconductor substrates 413 may have an interconnect structure 419.

The adhesive 406 is on back sides of the modules 410/412 and semiconductor package 250 and adheres the modules 410/412 and semiconductor package 250 to release layer 404. The adhesive 406 may be any suitable adhesive, epoxy, die attach film (DAF), or the like. The adhesive 406 may be applied to a back side of the modules 410/412 and semiconductor package 250, such as to a back side of the respective semiconductor wafer or may be applied over the surface of the carrier substrate 402. The modules 410/412 may be singulated, such as by sawing or dicing, and adhered to the release layer 404 by the adhesive 406 using, for example, a pick-and-place tool.

Figure 38:
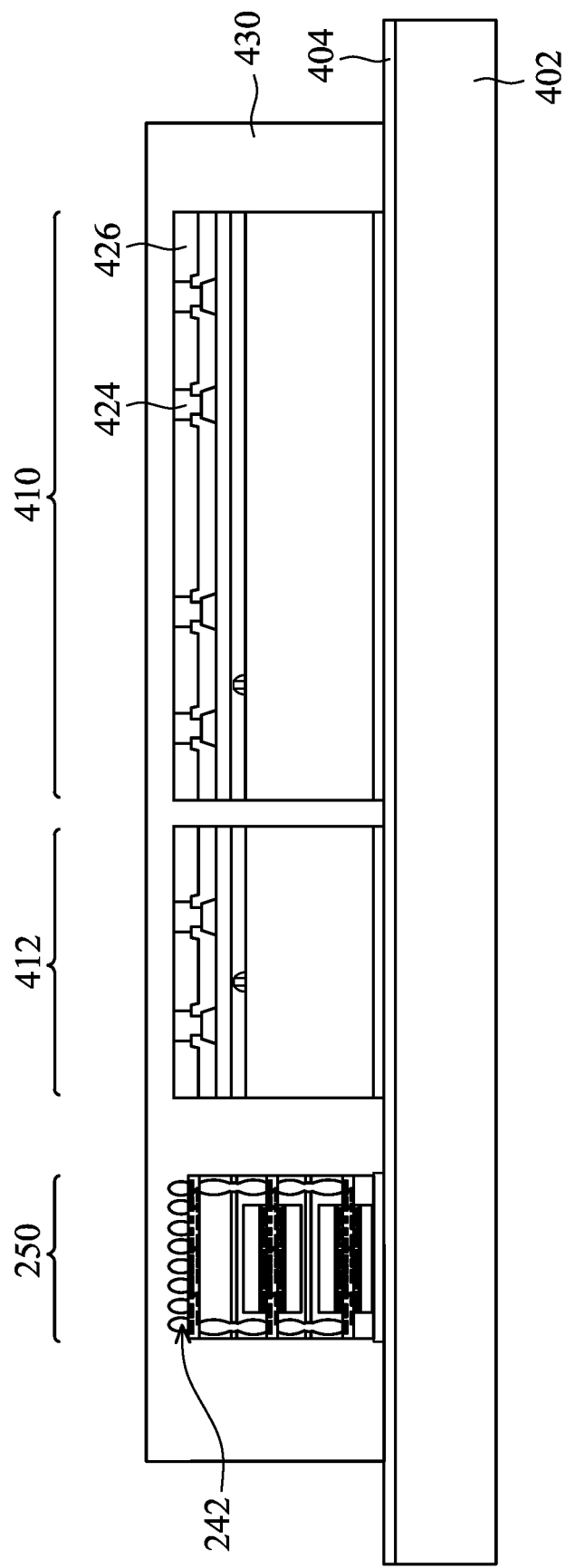

In FIG. 38, an encapsulant 430 is formed on and around the modules 410/412 and semiconductor package 250. After formation, the encapsulant 430 encapsulates the modules 410/412 and semiconductor package 250. The encapsulant 430 may be a molding compound, epoxy, or the like. The encapsulant 430 may be applied by compression molding, transfer molding, or the like, and may be formed over the carrier substrate 402 such that the modules 410/412 and semiconductor package 250 are buried or covered. The encapsulant 430 is further formed in gap regions between the modules 410/412 and semiconductor package 250. The encapsulant 430 may be applied in liquid or semi-liquid form and subsequently cured.

Figure 39:
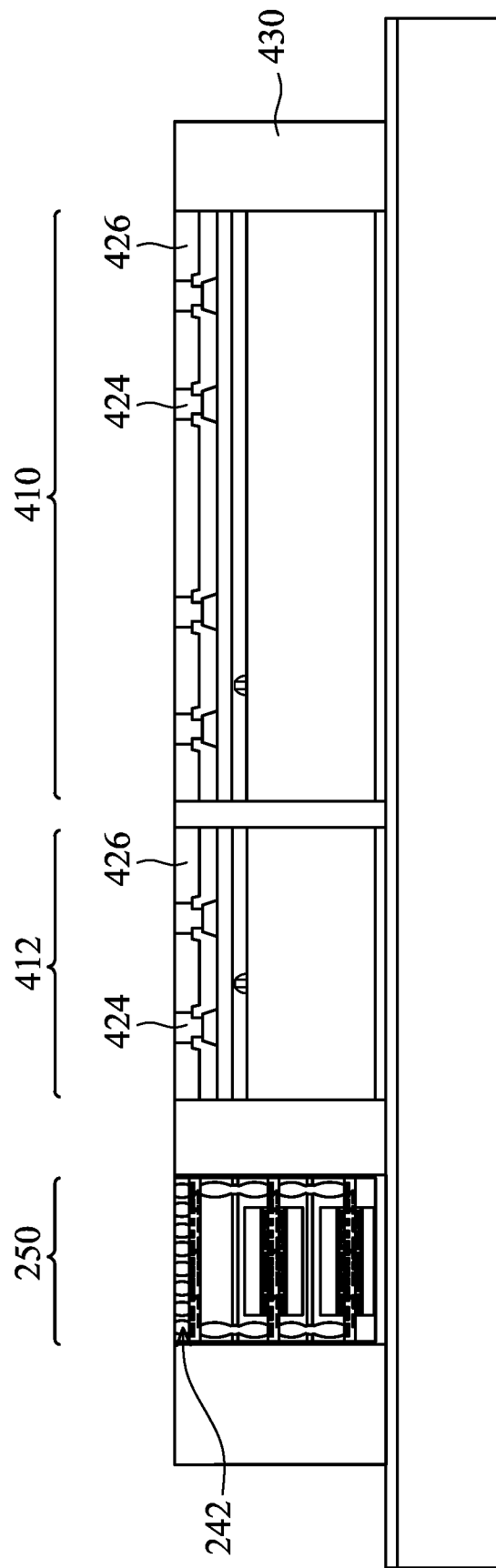

In FIG. 39, a planarization process is performed on the encapsulant 430 to expose the die connectors 424, conductive connectors 242, and dielectric layers 426. The planarization process may also remove material of the dielectric layers 426, conductive connectors 242, and/or the die connectors 424 until the conductive connectors 242 and die connectors 424 are exposed. Following the planarization process, top surfaces of the conductive connectors 242, the die connectors 424, the dielectric layers 426, and the encapsulant 430 may be level with one another (e.g., coplanar). The planarization process may be, for example, a chemical-mechanical polish (CMP) process, a grinding process, an etch-back process, or the like. In some embodiments, the planarization process may be omitted, for example, if the die connectors 424 and the conductive connectors 242 are already exposed.

Figure 40:
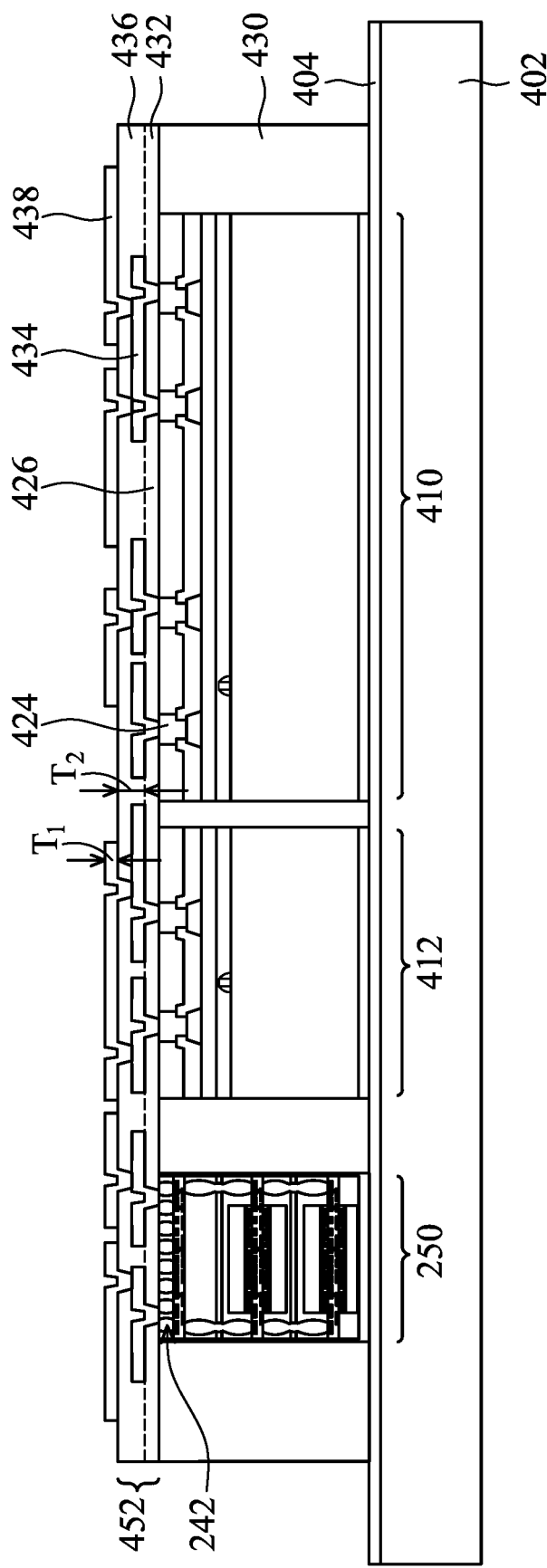
Figure 41:
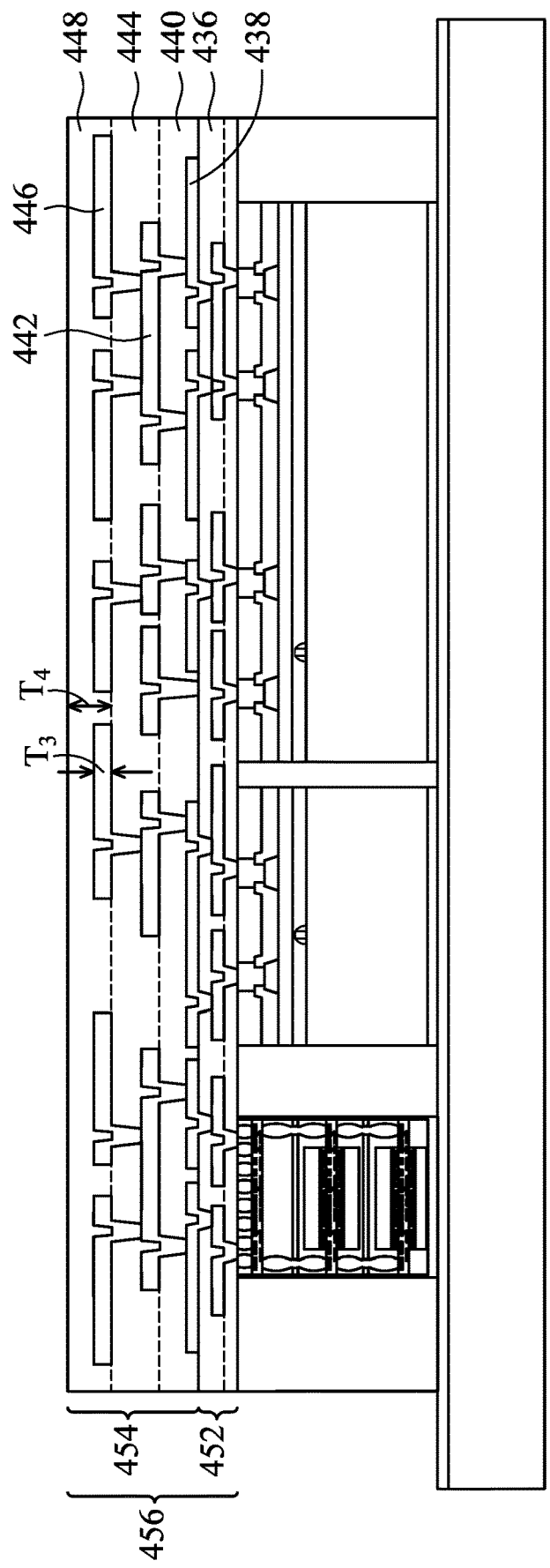
Figure 42:
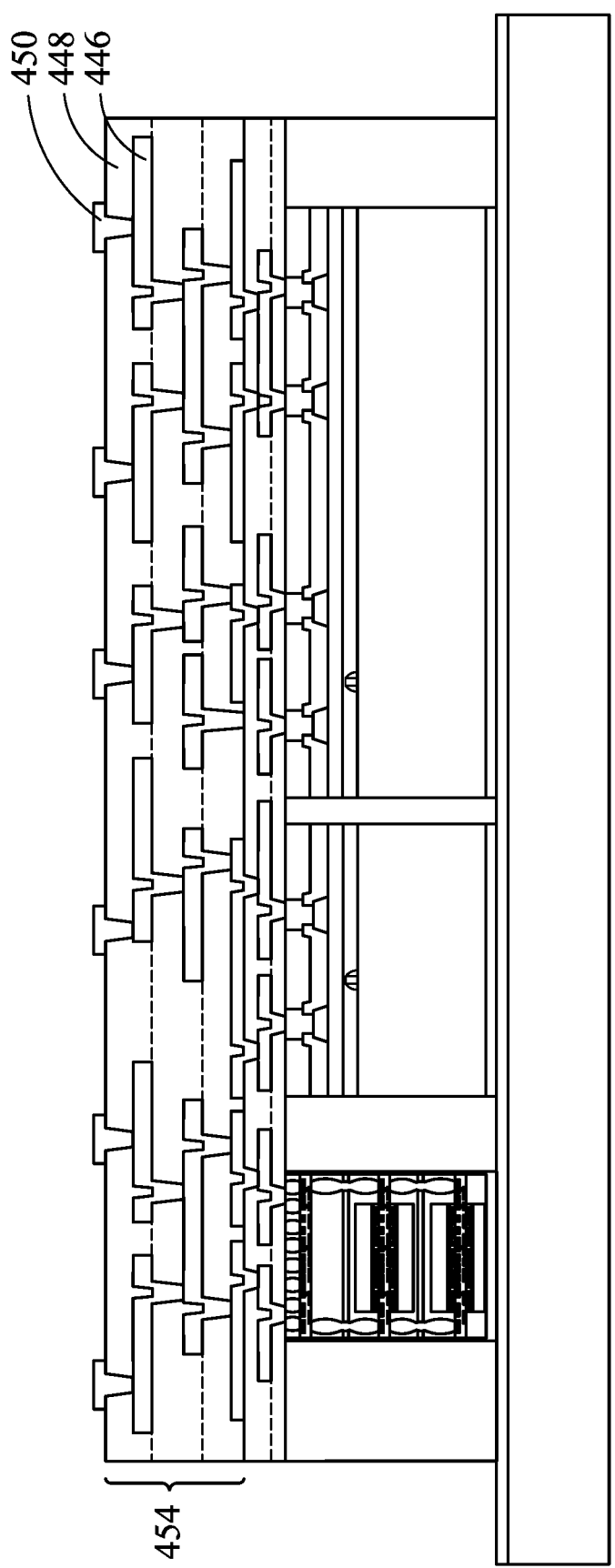

In FIGS. 40 through 42, a redistribution structure 456 (see FIG. 42) having a fine-featured portion 452 and a coarse-featured portion 454 is formed over the encapsulant 430 and the modules 410/412 and semiconductor package 250. The redistribution structure 456 includes metallization patterns, dielectric layers, and underbump metallurgies (UBMs). The metallization patterns may also be referred to as redistribution layers or redistribution lines. The redistribution structure 456 is shown as an example having four layers of metallization patterns. More or fewer dielectric layers and metallization patterns may be formed in the redistribution structure 456. If fewer dielectric layers and metallization patterns are to be formed, steps and process discussed below may be omitted. If more dielectric layers and metallization patterns are to be formed, steps and processes discussed below may be repeated. The fine-featured portion 452 and the coarse-featured portion 454 of the redistribution structure 456 include metallization patterns and dielectric layers of differing sizes.

FIG. 40 illustrates an example of forming the fine-featured portion 452 of the redistribution structure 456. In FIG. 40, the dielectric layer 432 is deposited on the encapsulant 430, the dielectric layers 426, the conductive connectors 242, and the die connectors 424. In some embodiments, the dielectric layer 432 is formed of a photo-sensitive material such as PBO, polyimide, BCB, or the like, which may be patterned using a lithography mask. The dielectric layer 432 may be formed by spin coating, lamination, CVD, the like, or a combination thereof.

The dielectric layer 432 is then patterned and metallization pattern 434 is formed. The patterning forms openings exposing portions of the conductive connectors 242 and the die connectors 424. The patterning may be by an acceptable process, such as by exposing the dielectric layer 432 to light when the dielectric layer 432 is a photo-sensitive material or by etching using, for example, an anisotropic etch. If the dielectric layer 432 is a photo-sensitive material, the dielectric layer 432 can be developed after the exposure.

The metallization pattern 434 is then formed. The metallization pattern 434 has line portions (also referred to as conductive lines or traces) on and extending along the major surface of the dielectric layer 432, and has via portions (also referred to as conductive vias) extending through the dielectric layer 432 to physically and electrically couple the die connectors 424 of the modules 410/412 and the conductive connectors 242 of the semiconductor package 250. As an example, the metallization pattern 434 may be formed by forming a seed layer over the dielectric layer 432 and in the openings extending through the dielectric layer 432. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 434. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the metallization pattern 434. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

The dielectric layer 436 is then deposited on the metallization pattern 434 and the dielectric layer 432. The dielectric layer 436 may be formed in a manner similar to the dielectric layer 432, and may be formed of a material similar to the material of the dielectric layer 432.

The dielectric layer 436 is then patterned and the metallization pattern 438 is formed. The patterning forms openings exposing portions of the metallization pattern 434. The patterning may be by an acceptable process, such as by exposing the dielectric layer 436 to light when the dielectric layer 436 is a photo-sensitive material or by etching using, for example, an anisotropic etch. If the dielectric layer 436 is a photo-sensitive material, the dielectric layer 436 can be developed after the exposure.

The metallization pattern 438 is then formed. The metallization pattern 438 has line portions on and extending along the major surface of the dielectric layer 436, and has via portions extending through the dielectric layer 436 to physically and electrically couple the metallization pattern 434. The metallization pattern 438 may be formed in a manner similar to the metallization pattern 434, and may be formed of a material similar to the material of the metallization pattern 434. Although the fine-featured portion 452 is illustrated as including two dielectric layers and two metallization patterns, any number of dielectric layers and metallization patterns may be formed in the fine-featured portion 452.

The fine-featured portion 452 of the redistribution structure 456 includes dielectric layers 432 and 436; and metallization patterns 434 and 438. In some embodiments, the dielectric layers 432 and 436 are formed from a same dielectric material, and are formed to a same thickness. Likewise, in some embodiments, the conductive features of the metallization patterns 434 and 438 are formed from a same conductive material, and are formed to a same thickness. In particular, the dielectric layers 432 and 436 have a thickness T2, such as in the range of about 1 µm to about 40 µm, and the conductive features of the metallization patterns 434 and 438 have a thickness T1, such as in the range of about 1 µm to about 40 µm.

FIG. 41 illustrates an example of forming the coarse-featured portion 454 of the redistribution structure 456. In FIG. 41, a dielectric layer 440 may be deposited on the metallization pattern 438 and the dielectric layer 436. The dielectric layer 440 may be formed in a manner similar to the dielectric layer 432, and may be formed of a material similar to the material of the dielectric layer 432.

The dielectric layer 440 may be patterned and a metallization pattern 442 is then formed. The metallization pattern 442 has line portions on and extending along the major surface of the dielectric layer 440, and has via portions extending through the dielectric layer 440 to physically and electrically couple the metallization pattern 438. The metallization pattern 442 may be formed in a manner similar to the metallization pattern 434, and may be formed of a material similar to the material of the metallization pattern 434.

A dielectric layer 444 is then deposited on the metallization pattern 442 and the dielectric layer 440. The dielectric layer 444 may be formed in a manner similar to the dielectric layer 432, and may be formed of a material similar to the material of the dielectric layer 432.

In FIG. 41, the dielectric layer 444 is patterned and a metallization pattern 446 is then formed. The dielectric layer 444 may be patterned in a manner similar to the dielectric layer 432. The metallization pattern 446 has line portions on and extending along the major surface of the dielectric layer 444, and has via portions extending through the dielectric layer 444 to physically and electrically couple the metallization pattern 442. The metallization pattern 446 may be formed in a manner similar to the metallization pattern 434, and may be formed of a material similar to the material of the metallization pattern 434.

A dielectric layer 448 is then deposited on the metallization pattern 446 and the dielectric layer 444. The dielectric layer 448 may be formed in a manner similar to the dielectric layer 432, and may be formed of a material similar to the material of the dielectric layer 432. Although the coarse-featured portion 454 is illustrated as including three dielectric layers and two metallization patterns, any number of dielectric layers and metallization patterns may be formed in the coarse-featured portion 454. In some embodiments, the fine-featured portion 452 and the coarse-featured portion 454 may each include 3 dielectric layers and 3 metallization patterns.

The coarse-featured portion 454 of the redistribution structure 456 includes dielectric layers 440, 444, and 448; and metallization patterns 442 and 446. In some embodiments, the dielectric layers 440, 444, and 448 are formed from a same dielectric material, and are formed to a same thickness. Likewise, in some embodiments, the conductive features of the metallization patterns 442 and 446 are formed from a same conductive material, and are formed to a same thickness. In particular, the dielectric layers 440, 444, and 448 have a thickness T4, such as in the range of about 1 µm to about 40 µm, and the conductive features of the metallization patterns 442 and 446 have a thickness T3, such as in the range of about 1 µm to about 40 µm. In various embodiments, the thickness T3 may be greater than the thickness T1 (see FIG. 40), and the thickness T4 may be greater than the thickness T2 (see FIG. 40).

The coarse-featured portion 454 may have lower resistance compared to the fine-featured portion 452 due to the thickness of the metallization patterns included in the coarse-featured portion 454 and the fine-featured portion 452. The coarse-featured portion 454 may be used to route power lines due to the lower resistance. The fine-featured portion 452 may be used to route signal lines, which do not require the lower resistance. Including both the coarse-featured portion 454 and the fine-featured portion 452 allows for power lines and signal lines to be routed, while minimizing the thickness of the redistribution structure 456.

In FIG. 42, pads 450 are formed on dielectric layer 448 and in the openings of the dielectric layer 448 to the metallization pattern 446. The pads 450 are used to couple to conductive connectors 458 and may be referred to as under bump metallurgies (UBMs) 450. The UBMs 450 are formed for external connection to the redistribution structure 456. The UBMs 450 have bump portions on and extending along the major surface of the dielectric layer 448, and have via portions extending through the dielectric layer 448 to physically and electrically couple the metallization pattern 446. As a result, the UBMs 450 are electrically coupled to the modules 410/412 and semiconductor package 250. In some embodiments, the UBMs 450 have a different size than the metallization pattern 434, 438, 442, and 446.

As an example, the UBMs 450 may be formed by first forming a seed layer over the dielectric layer 448 and in the openings extending through the dielectric layer 448. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 450. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. In some embodiments, the UBMs 450 may comprise alloys such as electroless nickel, electroless palladium, immersion gold (ENEPIG), electroless nickel, immersion gold (ENIG), or the like. The combination of the conductive material and underlying portions of the seed layer form the UBMs 450. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 43:
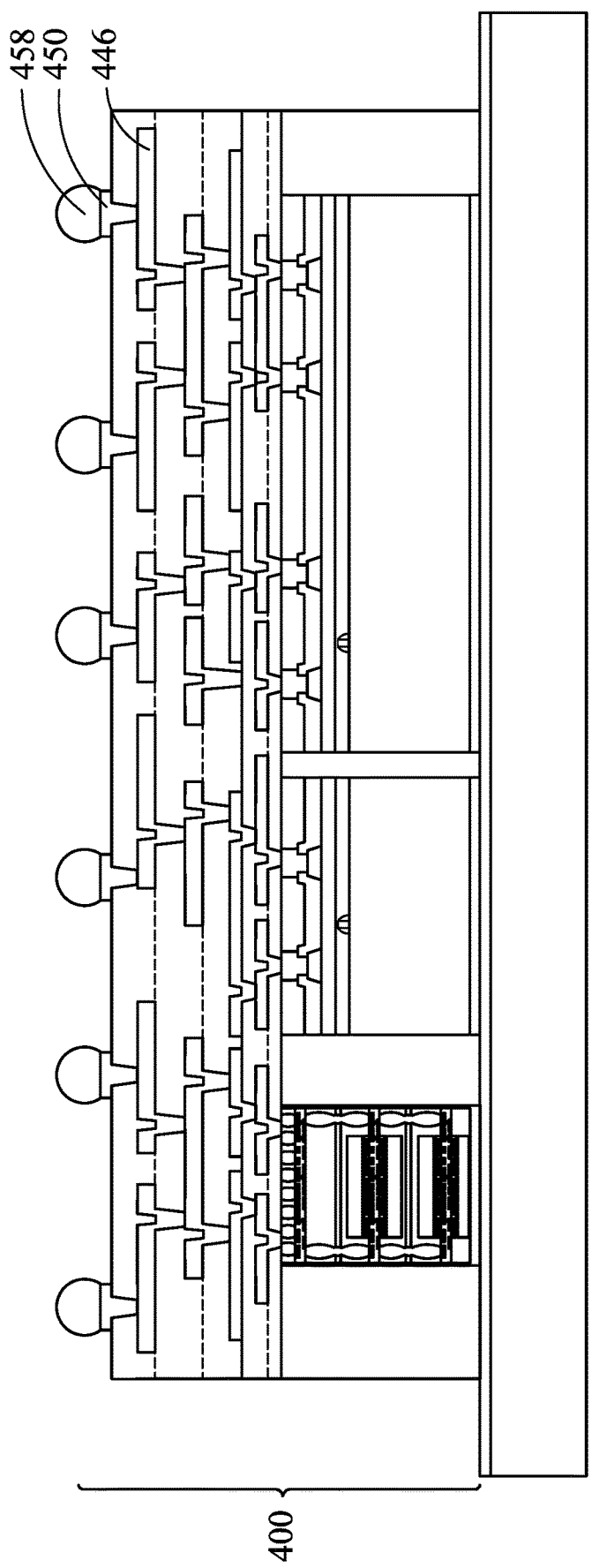

In FIG. 43, conductive connectors 458 are formed on the pads 450. The conductive connectors 458 allow for the semiconductor package 400 to be mechanically and electrically coupled to another package structure (see e.g., package substrate 500 in FIG. 29). The conductive connectors 458 may be similar to the conductive connectors 150 described above and the description is not repeated herein.

Figure 44:
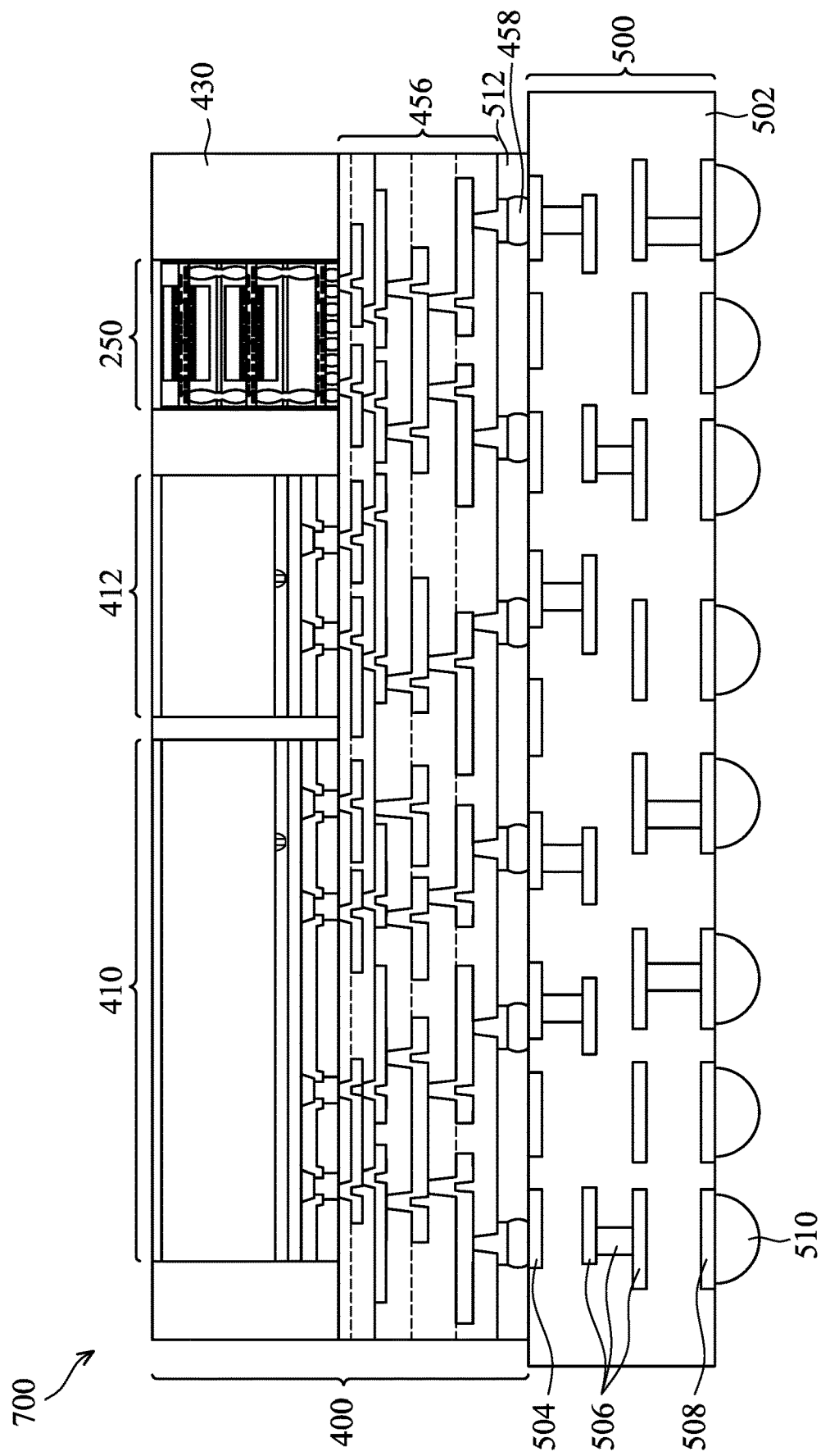

In FIG. 44, the semiconductor package 400 is then attached to a package substrate 500 using the conductive connectors 458 to form the package 700. The package substrate 500 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 500 may be a SOI substrate. Generally, an SOI substrate includes a layer of a semiconductor material such as epitaxial silicon, germanium, silicon germanium, SOI, SGOI, or combinations thereof. The package substrate 500 is, in another embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 500.

The package substrate 500 may include active and passive devices (not illustrated). Devices such as transistors, capacitors, resistors, combinations of these, and the like may be used to generate the structural and functional requirements of the design for the system. The devices may be formed using any suitable methods.

The package substrate 500 may also include metallization layers and vias 506 and bond pads 504 and 508 coupled to the metallization layers and vias 506. The metallization layers 506 may be formed over the active and passive devices and are designed to connect the various devices to form functional circuitry. The metallization layers 506 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 500 is substantially free of active and passive devices.

The conductive connectors 458 are reflowed to attach the UBMs 450 to the bond pads 504. The conductive connectors 458 connect the package substrate 500, including metallization layers 506 in the package substrate 500, to the semiconductor package 400, including metallization patterns of the redistribution structure 456. In some embodiments, surface mount passive devices (e.g., SMDs), not illustrated) may be attached to the package substrate 500, e.g., to the bond pads 504 and/or 508.

The conductive connectors 458 may have an epoxy flux (not illustrated) formed thereon before they are reflowed with at least some of the epoxy portion of the epoxy flux remaining after the semiconductor package 400 is attached to the package substrate 500. This remaining epoxy portion may act as an underfill to reduce stress and protect the joints resulting from the reflowing the conductive connectors 458. In some embodiments, an underfill 512 may be formed between the semiconductor package 400 and the package substrate 500, surrounding the conductive connectors 458. The underfill 512 may be formed by a capillary flow process after the semiconductor package 400 is attached or may be formed by a suitable deposition method before the semiconductor package 400 is attached.

Also, as shown in FIG. 44, the bond pads 508 of the package substrate 500 may have conductive connectors 510 formed on them. These conductive connectors 510 allow for the package 700 to be mechanically and electrically coupled to another package structure. The conductive connectors 510 may be similar to the conductive connectors 150 described above and the description is not repeated herein. Although package 700 is illustrated with semiconductor package 250, other embodiments of package 700 could include semiconductor package 350 or one or more of both semiconductor packages 250 and 350.

FIGS. 45 through 51 illustrate cross-sectional views of intermediate steps during a process for forming a package 900, in accordance with some embodiments. Details regarding this embodiment that are similar to those for the previously described embodiments will not be repeated herein.

Figure 45:
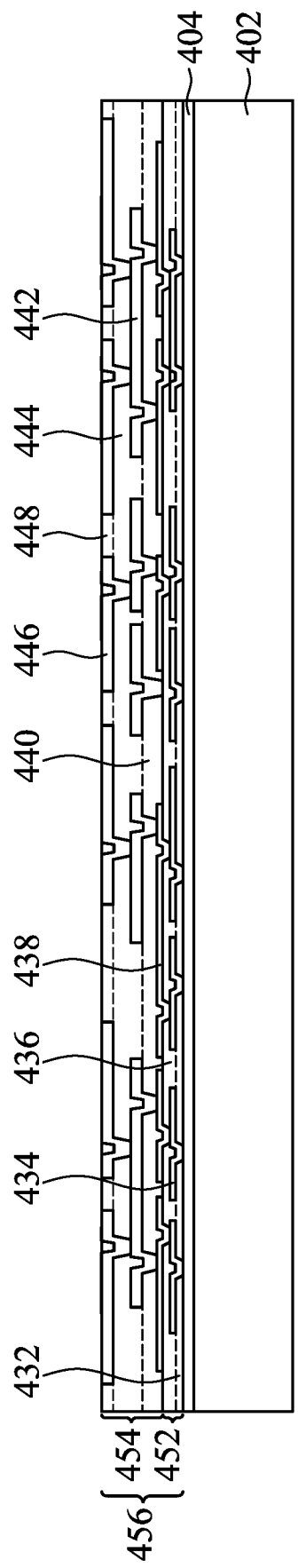
FIGS. 45-51 illustrate cross-sectional views of various intermediate stages of fabrication of a package in accordance with some embodiments.

FIGS. 45 through 50 illustrate cross-sectional views of intermediate steps during a process for forming a semiconductor package 800, in accordance with some embodiments. In FIG. 45, the redistribution structure 456 is formed over the release layer 404 on the carrier substrate 402. The redistribution structure 456, the release layer 404, and the carrier substrate were previously described and the descriptions are not repeated herein. In this embodiment, a top surface of the dielectric layer 448 is coplanar with a top surface of the metallization pattern 446. In some embodiments, this coplanarity is achieved with a planarization process, such as a CMP. In other embodiments, after the formation of the dielectric layer 448 is formed the surfaces are coplanar and the planarization process can be omitted.

Figure 46:
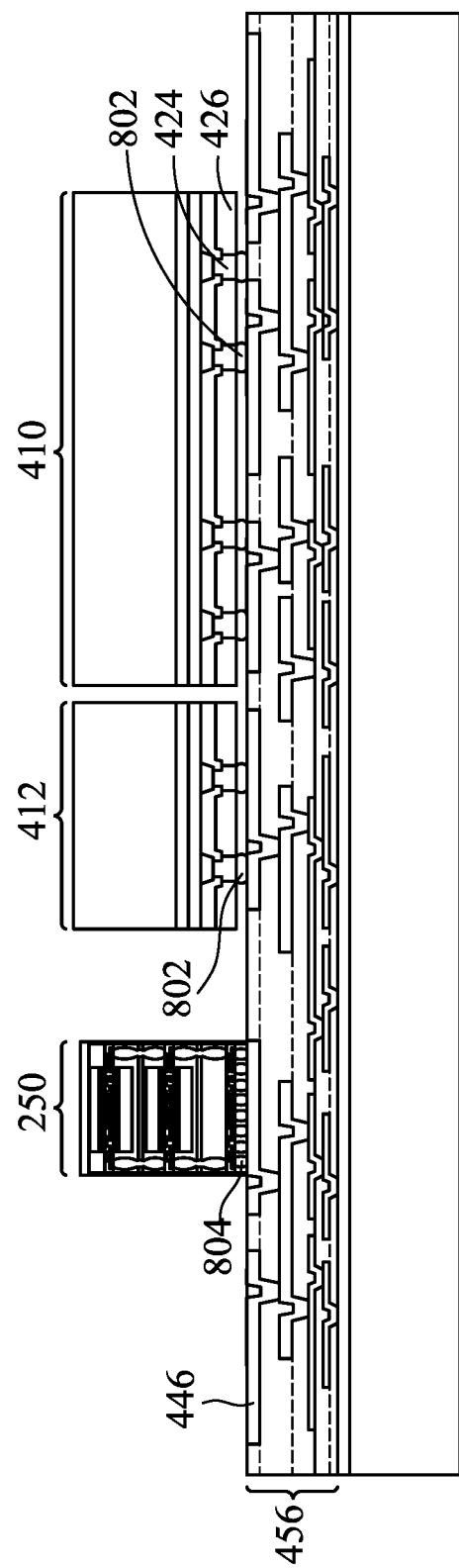

In FIG. 46, modules 410 and 412 and semiconductor package 250 are bonded to the redistribution structure 456 by conductive connectors 802 and 804, respectively. Although two modules 410 and 412 are illustrated as being bonded, it should be appreciated that more or less module 410 and/or 412 may be bonded to the redistribution structure 456. For example, three or four module 410 and/or 412 may be bonded to the redistribution structure 456. Although only a single semiconductor package 250 is illustrated as being bonded, it should be appreciated that more semiconductor packages 250 may be bonded to the redistribution structure 456. For example, two or three semiconductor packages 250 may be bonded to the redistribution structure 456.

The conductive connectors 802 and 804 may be similar to the conductive connectors 242 described above and the description is not repeated herein. The conductive connectors 802 mechanically and electrically couple the modules 410 and 412 to the redistribution structure 456. The conductive connectors 804 mechanically and electrically couple the semiconductor package 250 to the redistribution structure 456.

Figure 47:
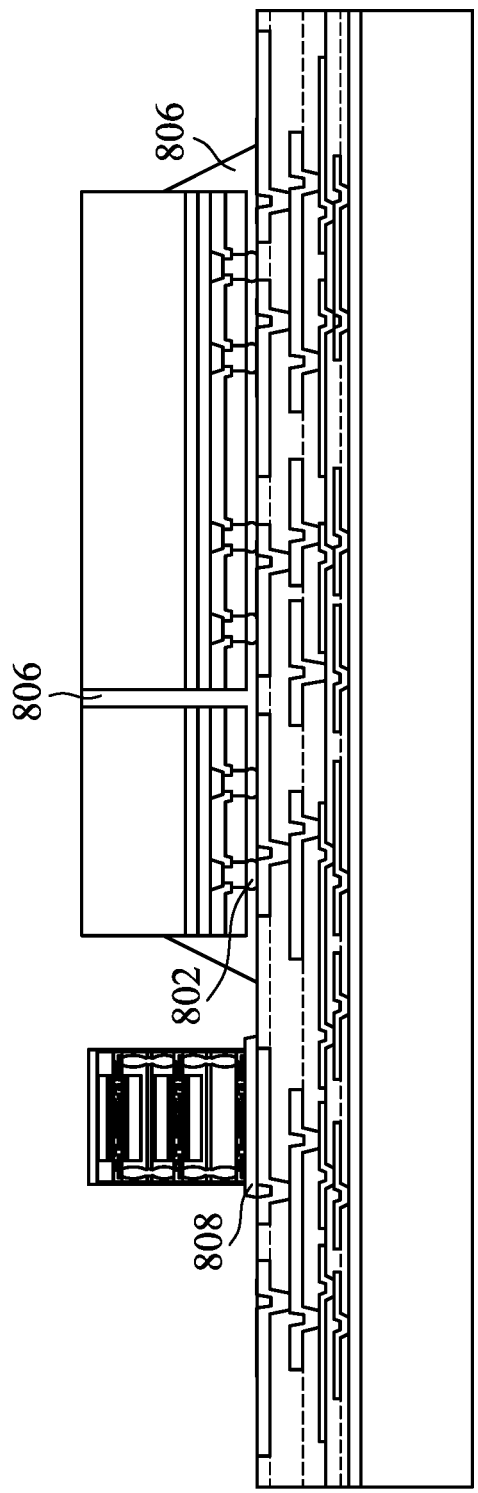

In FIG. 47, an underfill 806 is formed between the modules 410 and 412 and the redistribution structure 456 and surrounding the conductive connectors 802. Further in FIG. 47, an underfill 808 is formed between the semiconductor package 250 and the redistribution structure and surrounding the conductive connectors 804. The underfills 806 and 808 may be similar to the underfill 230 described above the description is not repeated herein. As illustrated, the underfill 806 may be formed between sidewalls of the modules 410 and 412 and may extend to backsides of the semiconductor substrates 413 of the modules 410 and 412.

Figure 48:
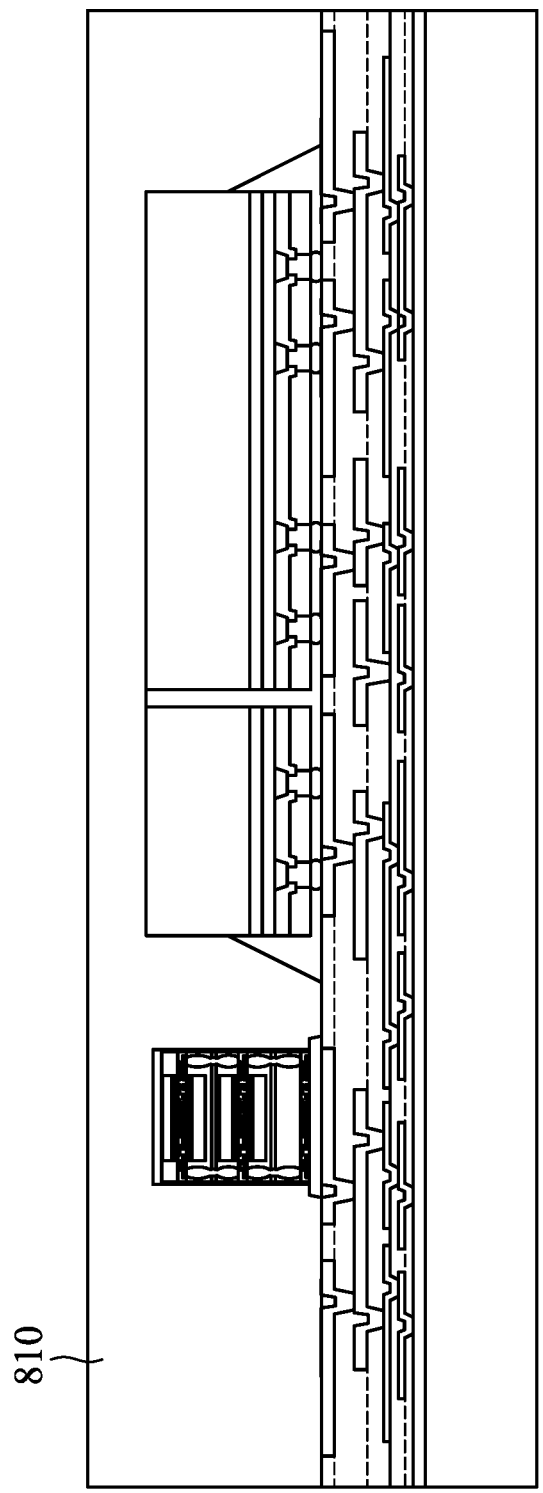

In FIG. 48, an encapsulant 810 is formed on and around the modules 410/412 and semiconductor package 250. The encapsulant 810 may be similar to the encapsulant 430 described above and the description is not repeated herein. The encapsulant 810 may be formed such that the modules 410/412 and semiconductor package 250 are buried or covered.

Figure 49:
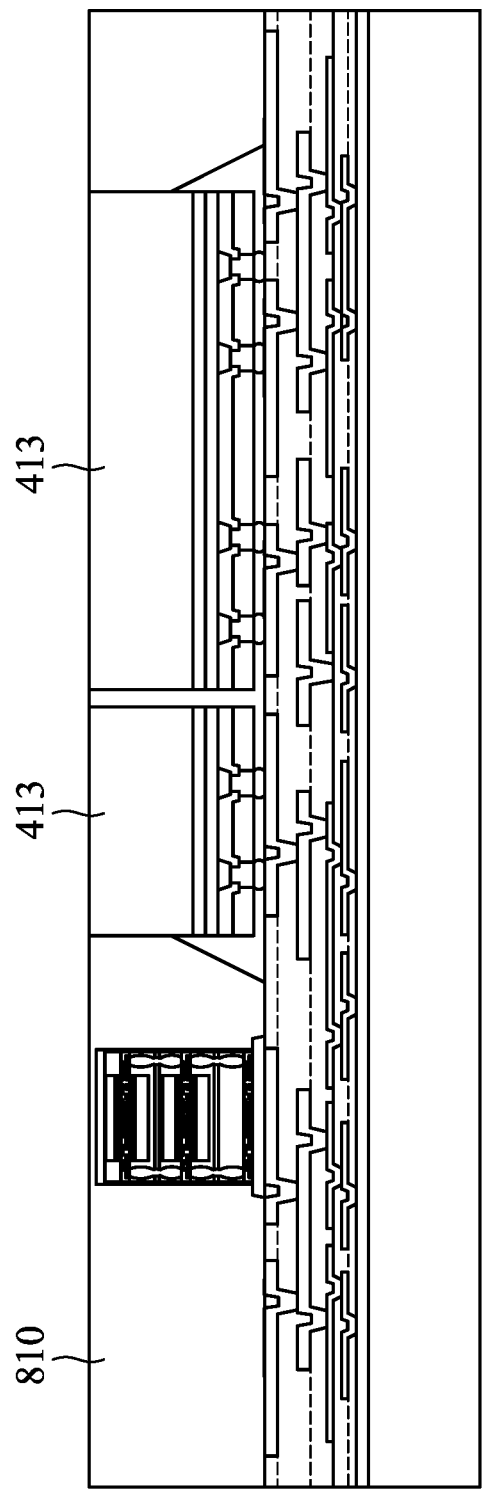

In FIG. 49, a planarization process is performed on the encapsulant 810 to expose the semiconductor substrates 413 of the modules 410/412. Following the planarization process, top surfaces of the semiconductor substrates 413 of the modules 410/412 and the encapsulant 810 may be level with one another (e.g., coplanar). The planarization process may be, for example, a chemical-mechanical polish (CMP) process, a grinding process, an etch-back process, or the like. In some embodiments, the planarization process may be omitted, for example, if the surfaces of the semiconductor substrates 413 of the modules 410/412 are already exposed.

Figure 50:
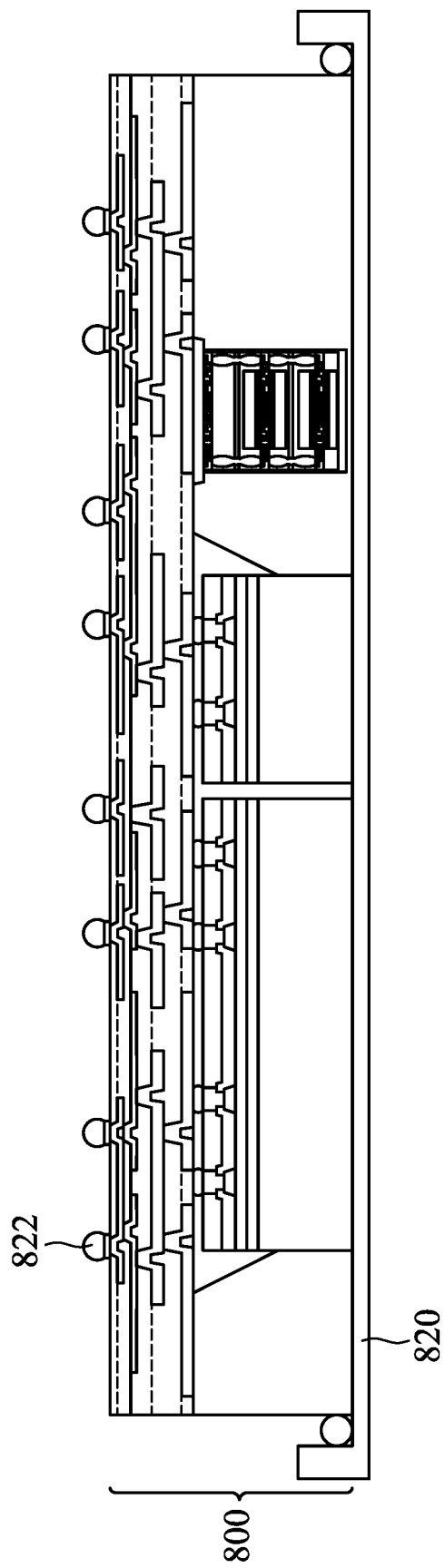

In FIG. 50, a carrier substrate de-bonding is performed to detach (de-bond) the carrier substrate 402 from the redistribution structure 456. In accordance with some embodiments, the de-bonding includes projecting a light such as a laser light or an UV light on the release layer 404 so that the release layer 404 decomposes under the heat of the light and the carrier substrate 402 can be removed. The detached structure is then flipped over and placed on a tape 820.

Further in FIG. 50, conductive connectors 822 are formed on the de-bonded redistribution structure 456. In particular, the conductive connectors 822 are formed on the metallization pattern 434 of the redistribution structure 456. The conductive connectors 822 may be similar to the conductive connectors 242 described above and the description is not repeated herein. The conductive connectors 822 allow for the semiconductor package 800 to be mechanically and electrically bonded to another package structure.

Figure 51:
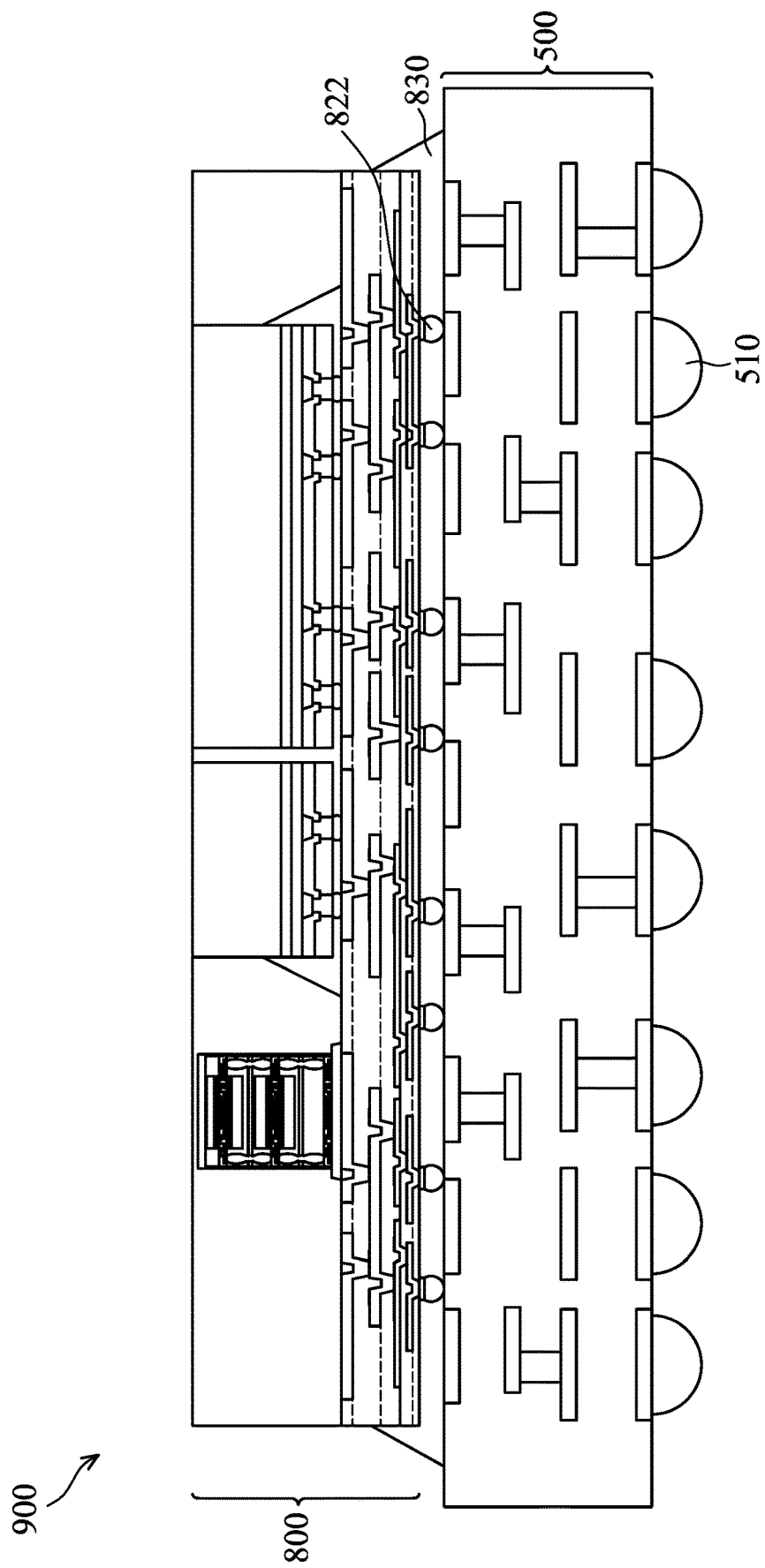

In FIG. 51, the semiconductor package 800 is then attached to a package substrate 500 using the conductive connectors 822 to form the package 900. The package substrate 500 was previously described and the description is not repeated herein.

In some embodiments, an underfill 830 may be formed between the semiconductor package 800 and the package substrate 500, surrounding the conductive connectors 822. The underfill 830 may be formed by a capillary flow process after the semiconductor package 800 is attached or may be formed by a suitable deposition method before the semiconductor package 400 is attached.

Although package 900 is illustrated with semiconductor package 250, other embodiments of package 900 could include semiconductor package 350 or one or more of both semiconductor packages 250 and 350.

Embodiments may achieve advantages. Embodiments include a semiconductor device which may be an integrated passive devices (IPD) comprising capacitors, such as deep trench capacitors (DTCs), metal-oxide-metal (MOM) capacitors, metal-insulator-metal (MIM) capacitors, the like, or a combination thereof. The semiconductor devices are vertically stacked and connected to effectively form a larger semiconductor device. The vertically stacked semiconductor devices may be electrically coupled together by solder connections and/or through via connections. By having vertically stacked IPDs, a high-efficiency capacitor—that may be used as a decoupling capacitor—can be formed. Also, the package structure including the one or more capacitors that are vertically stacked and coupled can provide a lower equivalent series resistance (ESR) of the capacitors. In some examples, these semiconductor devices may be incorporated into package structures (e.g., an integrated fan-out (InFO) package structure or a chip-on-wafer-on-substrate (CoWoS) package structure) to provide a capacitor with a large capacitance value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first package component comprising:
        attaching a first semiconductor device over a first carrier substrate, the first semiconductor device comprising a first plurality of passive elements;
        forming a first electrical connector over the first carrier substrate;
        encapsulating the first semiconductor device and the first electrical connector with a first encapsulant;
        forming a first redistribution structure over the first semiconductor device, the first electrical connector, and the first encapsulant, the first redistribution structure comprising a plurality of dielectric layers with metallization patterns therein;
        bonding a second semiconductor device to the first redistribution structure, the second semiconductor device comprising a second plurality of passive elements, the second semiconductor device and the first semiconductor device being bonded to opposite sides of the first redistribution structure;
        forming a second electrical connector over the first redistribution structure;
        encapsulating the second semiconductor device and the second electrical connector with a second encapsulant; and
    forming a second package component comprising:
        attaching a third semiconductor device to a second carrier substrate, the third semiconductor device comprising a third plurality of passive elements;
        forming a third electrical connector over the second carrier substrate; and
        encapsulating the third semiconductor device and the third electrical connector with a third encapsulant;
        forming a second redistribution structure over the third semiconductor device, the second electrical connector, and the third encapsulant, the second redistribution structure comprising a plurality of dielectric layers with metallization patterns therein;

bonding a fourth semiconductor device to the second redistribution structure, the fourth semiconductor device comprising a fourth plurality of passive elements, the fourth semiconductor device and the third semiconductor device being bonded to opposite sides of the second redistribution structure; and bonding the first package component to the second package component with a first set of conductive connectors, at least one of the first set of conductive connectors electrically contacting the first electrical connector and the second electrical connector.

2. The method of claim 1, wherein the first plurality of passive elements is a first plurality of deep trench capacitors, and wherein the second plurality of passive elements is a second plurality of deep trench capacitors.

3. The method of claim 1, the first plurality of passive elements and the second plurality of passive elements are electrically coupled together in parallel.

4. The method of claim 1 further comprising:
forming a first package comprising:
forming a first integrated circuit package comprising at least one integrated circuit die, the at least one integrated circuit die comprising a plurality of active devices; and
encapsulating the bonded first and second package components and the first integrated circuit package with a fourth encapsulant.

5. The method of claim 4, wherein forming the first package further comprises:
forming a third redistribution structure on the fourth encapsulant, the first integrated circuit package, and the bonded first and second package components, the third redistribution structure comprising a plurality of dielectric layers with metallization patterns therein, the metallization patterns of the third redistribution structure being electrically coupled to the first integrated circuit package and the bonded first and second package components.

6. The method of claim 1 further comprising:
forming a first underfill between the first and second package components, the first underfill surrounding the first set of conductive connectors.

7. The method of claim 1 further comprising:
forming a third package component comprising:
forming a fourth redistribution structure over a third carrier substrate, the fourth redistribution structure comprising a plurality of dielectric layers with metallization patterns therein; and
bonding a fifth semiconductor device to the fourth redistribution structure, the fifth semiconductor device comprising a fifth plurality of passive elements;
forming a fourth electrical connector over the fourth redistribution structure, the fourth electrical connector being electrically coupled to the fourth redistribution structure;
bonding the first package component to the third package component, the second package component being bonded to the first package component opposite the third package component;
removing the third carrier substrate; and
forming a second set of conductive connectors on the fourth redistribution structure, the second set of conductive connectors being on an opposite side of the fourth redistribution structure as the fifth semiconductor device.

8. The method of claim 7, wherein the second set of conductive connectors are larger than the first set of conductive connectors.

9. The method of claim 7, wherein the second and fourth electrical connectors each comprise solder bumps.

10. A method of forming a semiconductor package, the method comprising:
forming a first semiconductor structure, the forming comprising:
attaching a first semiconductor device to a first carrier substrate;
forming first conductive connectors over the first carrier substrate;
encapsulating the first semiconductor device and the first conductive connectors with a first encapsulant;
forming a first redistribution structure over the first semiconductor device, the first conductive connectors, and the first encapsulant;
forming a second semiconductor structure over the first redistribution structure;
forming a third semiconductor structure, the forming comprising:
attaching a second semiconductor device to a second carrier substrate;
forming second conductive connectors over the second carrier substrate;
encapsulating the second semiconductor device and the second conductive connectors with a second encapsulant;
forming a second redistribution structure over the second semiconductor device, the second conductive connectors, and the second encapsulant;
forming a fourth semiconductor structure over the second redistribution structure;
bonding the first semiconductor structure to the third semiconductor structure using third conductive connectors; and
bonding the second semiconductor structure to the fourth semiconductor structure using fourth conductive connectors.

11. The method of claim 10, further comprising:
forming an underfill between the first semiconductor structure and the third semiconductor structure, the underfill surrounding the third conductive connectors.

12. The method of claim 10, wherein the first semiconductor device and the second semiconductor device each comprise a plurality of deep trench capacitors.

13. The method of claim 10, further comprising:
forming fifth conductive connectors on the second redistribution structure, the fifth conductive connectors being on an opposite side of the second redistribution structure as the fourth semiconductor structure.

14. The method of claim 13, further comprising:
bonding the semiconductor package to a package substrate using the fifth conductive connectors.

15. The method of claim 10, wherein the first redistribution structure and the second redistribution structure each comprise a plurality of dielectric layers and a plurality of conductive features in the dielectric layers.

16. A method of forming a semiconductor package, the method comprising:
forming a redistribution structure over a carrier substrate, the redistribution structure comprising a plurality of dielectric layers and conductive features in the dielectric layers;

bonding a first semiconductor device and a second semiconductor device to the redistribution structure using first conductive connectors;

forming a first underfill between the first semiconductor device and the redistribution structure and between the second semiconductor device and the redistribution structure;

encapsulating the first semiconductor device and the second semiconductor device with an encapsulant;

removing the carrier substrate;

forming second conductive connectors on the redistribution structure, the second conductive connectors being on an opposite side of the redistribution structure as the first semiconductor device and the second semiconductor device; and bonding the semiconductor package to a package substrate using the second conductive connectors.

17. The method of claim 16, wherein the redistribution structure comprises:

a fine-featured portion comprising first dielectric layers and first conductive features; and a coarse-featured portion comprising second dielectric layers and second conductive features, wherein the second dielectric layers are thicker than the first dielectric layers, and the second conductive features are thicker than the first conductive features.

18. The method of claim 16, further comprising:

planarizing the encapsulant to expose back sides of the first semiconductor device and the second semiconductor device.

19. The method of claim 16, wherein the first semiconductor device comprises a plurality of deep trench capacitors.

20. The method of claim 16, further comprising:

forming a second underfill between the semiconductor package and the package substrate, the second underfill surrounding the second conductive connectors.

* * * * *